(12) United States Patent
Togashi et al.

(10) Patent No.: US 10,714,532 B2
(45) Date of Patent: Jul. 14, 2020

(54) IMAGING DEVICE HAVING FIRST, SECOND AND THIRD ELECTRODES WITH AN INSULATING MATERIAL AND A PHOTOELECTRIC CONVERSION LAYER AND DRIVING METHOD FOR IMAGING DEVICE HAVING THE SAME, AND ELECTRONIC APPARATUS

(71) Applicant: SONY CORPORATION, Tokyo (JP)

(72) Inventors: Hideaki Togashi, Kanagawa (JP); Fumihiko Koga, Kanagawa (JP); Tetsuji Yamaguchi, Kanagawa (JP); Shintarou Hirata, Tokyo (JP); Taiichiro Watanabe, Kanagawa (JP); Yoshihiro Ando, Kanagawa (JP); Toyotaka Kataoka, Kanagawa (JP); Satoshi Keino, Kanagawa (JP); Yukio Kaneda, Kanagawa (JP)

(73) Assignee: Sony Corporation, Tokyo (JP)

( * ) Notice: Subject to any disclaimer, the term of this patent is extended or adjusted under 35 U.S.C. 154(b) by 154 days.

(21) Appl. No.: 15/553,653

(22) PCT Filed: Feb. 28, 2017

(86) PCT No.: PCT/JP2017/007819
§ 371 (c)(1),
(2) Date: Aug. 25, 2017

(87) PCT Pub. No.: WO2017/150540
PCT Pub. Date: Sep. 8, 2017

(65) Prior Publication Data
US 2018/0175102 A1 Jun. 21, 2018

(30) Foreign Application Priority Data
Mar. 1, 2016 (JP) ................. 2016-038777

(51) Int. Cl.
*H01L 27/148* (2006.01)
*H01L 27/30* (2006.01)
(Continued)

(52) U.S. Cl.
CPC .... *H01L 27/14812* (2013.01); *H01L 27/1463* (2013.01); *H01L 27/1464* (2013.01);
(Continued)

(58) Field of Classification Search
CPC ...... H04N 5/378; H04N 9/045; Y02E 10/549; H01L 27/14812; H01L 27/14625;
(Continued)

(56) References Cited

U.S. PATENT DOCUMENTS 10,468,451 B2 * 11/2019 Togashi ............. H01L 27/1463
2001/0025911 A1 10/2001 Butler
(Continued)

FOREIGN PATENT DOCUMENTS

JP 2011-138927 7/2011
JP 2015-050331 3/2015
(Continued)

OTHER PUBLICATIONS

International Search Report prepared by the European Patent Office dated May 31, 2017, for International Application No. PCT/JP2017/007819.
(Continued)

*Primary Examiner* — Que Tan Le
*Assistant Examiner* — Jennifer D Bennett
(74) *Attorney, Agent, or Firm* — Sheridan Ross P.C.

(57) ABSTRACT

An imaging device is provided. The imaging device may include a substrate having a first photoelectric conversion unit and a second photoelectric conversion unit at a light-incident side of the substrate. The second photoelectric conversion unit may include a photoelectric conversion
(Continued)

layer, a first electrode, a second electrode above the photoelectric conversion layer, a third electrode, and an insulating material between the third electrode and the photoelectric conversion layer, wherein a portion of the insulating material is between the first electrode and the third electrode.

25 Claims, 59 Drawing Sheets

(51) Int. Cl.
  *H01L 27/146* (2006.01)
  *H01L 51/42* (2006.01)
  *H01L 51/44* (2006.01)

(52) U.S. Cl.
  CPC .. *H01L 27/14605* (2013.01); *H01L 27/14607* (2013.01); *H01L 27/14612* (2013.01); *H01L 27/14621* (2013.01); *H01L 27/14625* (2013.01); *H01L 27/14627* (2013.01); *H01L 27/14634* (2013.01); *H01L 27/14636* (2013.01); *H01L 27/14647* (2013.01); *H01L 27/307* (2013.01); *H01L 51/4273* (2013.01); *H01L 51/442* (2013.01)

(58) Field of Classification Search
  CPC ........... H01L 27/14605; H01L 27/1463; H01L 27/14636; H01L 27/14612; H01L 27/14607; H01L 27/14634; H01L 27/14627; H01L 27/14621; H01L 27/1464; H01L 51/4273; H01L 27/307; H01L 51/442; H01L 27/14609; H01L 27/14647
  See application file for complete search history.

(56) References Cited

U.S. PATENT DOCUMENTS

| | | | |
|---|---|---|---|
| 2006/0201546 A1* | 9/2006 | Yokoyama | H01L 27/14621 136/263 |
| 2011/0180714 A1* | 7/2011 | Okada | G01T 1/243 250/354.1 |
| 2011/0216212 A1* | 9/2011 | Watanabe | H04N 5/2353 348/222.1 |
| 2013/0033628 A1* | 2/2013 | Yamaguchi | H01L 27/14632 348/294 |
| 2013/0093911 A1* | 4/2013 | Sul | H01L 27/307 348/222.1 |
| 2013/0093932 A1* | 4/2013 | Choo | H01L 51/424 348/294 |
| 2014/0209876 A1* | 7/2014 | Yamaguchi | H01L 27/307 257/40 |
| 2015/0029425 A1 | 1/2015 | Tseng | |
| 2015/0156437 A1 | 6/2015 | Sul et al. | |
| 2015/0188065 A1 | 7/2015 | Takimoto | |
| 2015/0221702 A1* | 8/2015 | Jung | H01L 27/307 257/40 |
| 2017/0257587 A1* | 9/2017 | Hatano | G02B 7/34 |
| 2018/0076252 A1* | 3/2018 | Togashi | H01L 51/4273 |

FOREIGN PATENT DOCUMENTS

| | | |
|---|---|---|
| WO | WO 2015/029425 A1 | 3/2015 |
| WO | WO 2016/009693 | 1/2016 |

OTHER PUBLICATIONS

Official Action (with English translation) for Chinese Patent Application No. 201910573271.9, dated Mar. 5, 2020, 17 pages.
Official Action (no English translation) for Japanese Patent Application No. 2016-193919, dated May 19, 2020, 6 pages.

\* cited by examiner

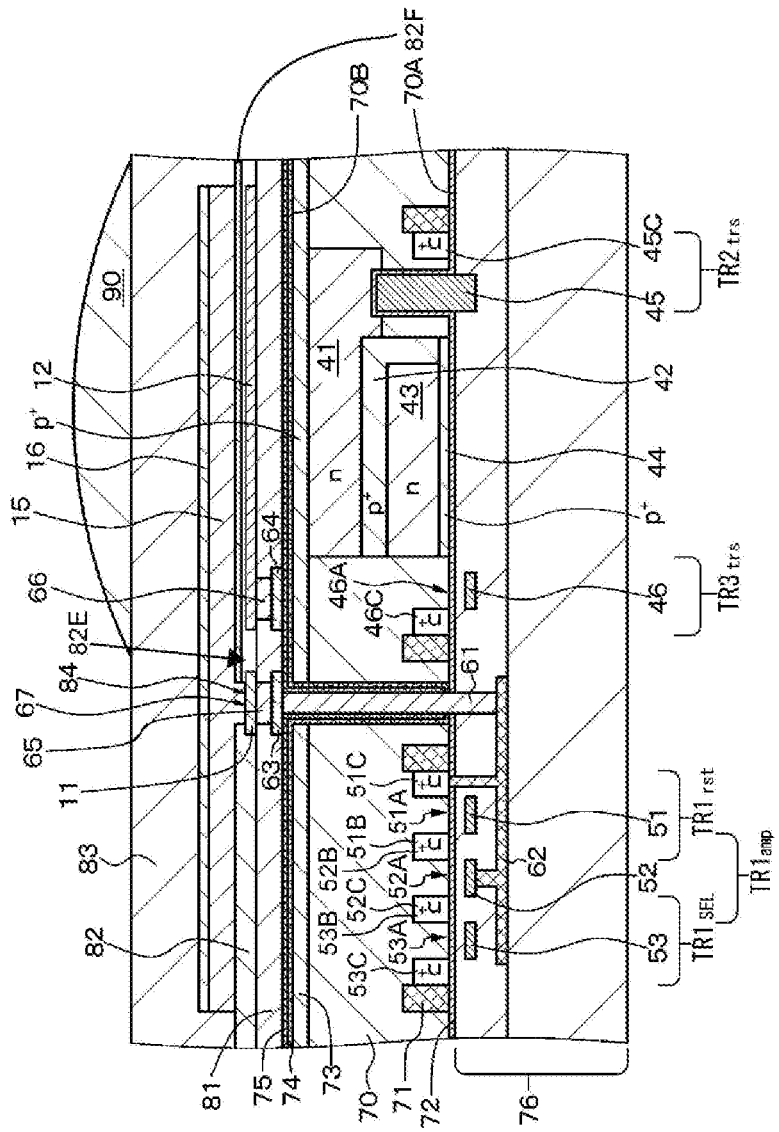

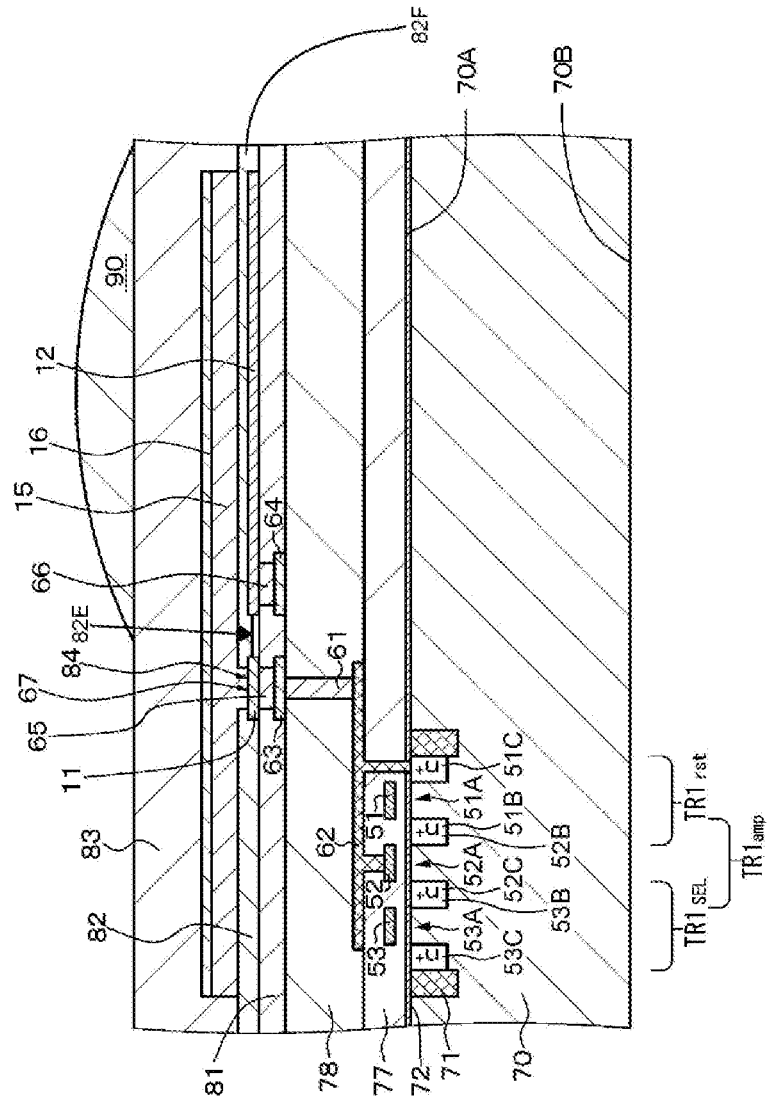

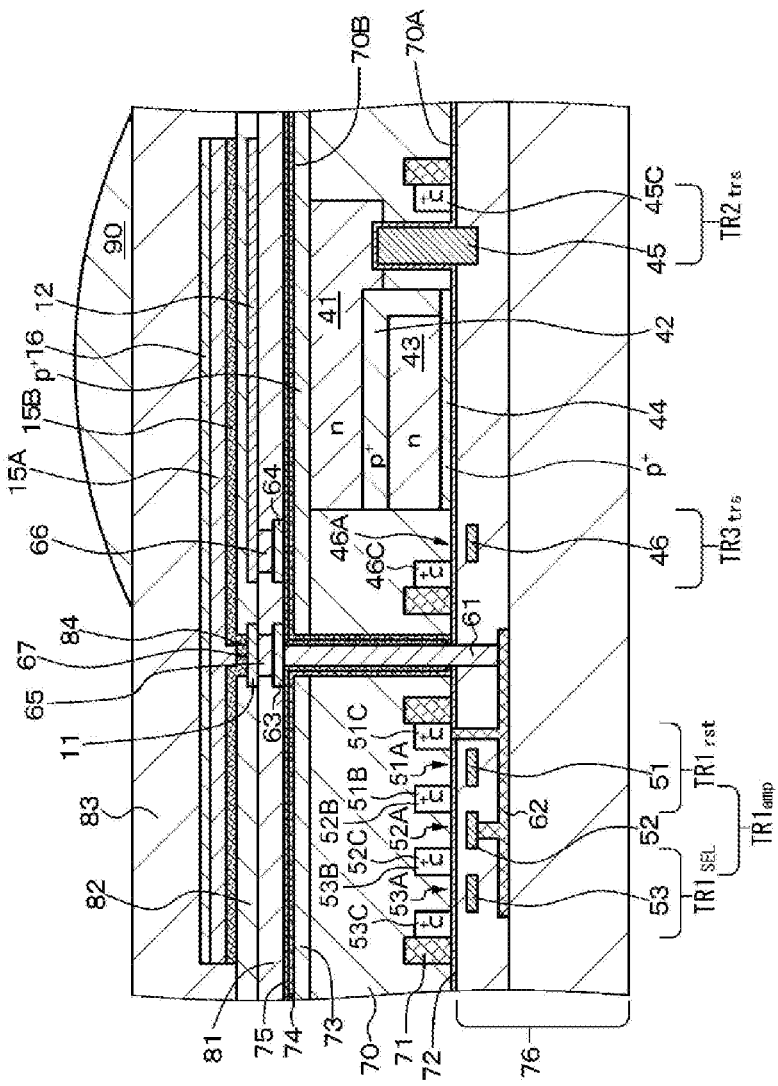

US 10,714,532 B2

IMAGING DEVICE HAVING FIRST, SECOND AND THIRD ELECTRODES WITH AN INSULATING MATERIAL AND A PHOTOELECTRIC CONVERSION LAYER AND DRIVING METHOD FOR IMAGING DEVICE HAVING THE SAME, AND ELECTRONIC APPARATUS

CROSS REFERENCE TO RELATED APPLICATIONS

This application is a national stage application under 35 U.S.C. 371 and claims the benefit of PCT Application No. PCT/JP2017/007819 having an international filing date of 28 Feb. 2017, which designated the United States, which PCT application claimed the benefit of Japanese Patent Application No. 2016-038777 filed 1 Mar. 2016, and Japanese Patent Application No. 2016-193919 filed 30 Sep. 2016, the disclosures of which are incorporated herein by reference in their entirety.

TECHNICAL FIELD

The present disclosure relates to an imaging element, a stacked-type imaging element, a solid-state imaging device, and a driving method for a solid-state imaging device.

BACKGROUND ART

Imaging elements using organic semiconductor materials for photoelectric conversion layers can photoelectrically convert specific colors (wavelength bands). Furthermore, due to the characteristic, in the case of using the imaging elements as imaging elements in solid-state imaging devices, it is possible to achieve a structure (stacked-type imaging element) of sub pixels where each subpixel is configured as a combination of an on-chip color filter (OCCF) and an imaging element, and the subpixels are arranged two-dimensionally (for example, refer to JP 2011-138927 A). In addition, since a demosaic process is not necessary, there is an advantage in that false color does not occur. Note that, in the description hereinafter, in some cases, an imaging element which is provided on or above a semiconductor substrate and includes a photoelectric conversion unit is, for the convenience of description, referred to as a "first-type imaging element;" a photoelectric conversion unit constituting the first-type imaging element is, for the convenience of description, referred to as a "first-type photoelectric conversion unit;" an imaging element provided in a semiconductor substrate is, for the convenience of description, referred to as a "second-type imaging element;" and a photoelectric conversion unit constituting the second-type imaging element is, for the convenience of description, referred to as a "second-type photoelectric conversion unit."

A structure example of a stacked-type imaging element (stacked-type solid-state imaging device) in the related art is illustrated in FIG. 49. In the example illustrated in FIG. 49, a third photoelectric conversion unit 331 and a second photoelectric conversion unit 321 are second-type photoelectric conversion units constituting a third imaging element 330 and a second imaging element 320, respectively, as second-type imaging elements that are formed in a semiconductor substrate 370 to be stacked. In addition, a first photoelectric conversion unit 311 is a first-type photoelectric conversion unit arranged above the semiconductor substrate 370 (specifically, above the second imaging element 320). The first photoelectric conversion unit 311 is configured to include a first electrode 311, a photoelectric conversion layer 315 made of an organic material, and a second electrode 316 and constitutes a first imaging element 310 as a first-type imaging element. Due to a difference in the absorption coefficient, the second photoelectric conversion unit 321 and the third photoelectric conversion unit 331 photoelectrically convert, for example, blue light and red light, respectively. In addition, the first photoelectric conversion unit 311 photoelectrically converts, for example, green light.

Charges generated through photoelectric conversion in the second photoelectric conversion unit 321 and the third photoelectric conversion unit 331 are temporarily stored in the second photoelectric conversion unit 321 and the third photoelectric conversion unit 331 and, after that, are transferred to the second floating diffusion layer (Floating Diffusion) $FD_2$ and the third floating diffusion layer $FD_3$ by a vertical-type transistor (gate portion 322 is illustrated) and a transfer transistor (gate portion 332 is illustrated), respectively. The charges are further output to an external reading circuit (not shown). The transistors and the floating diffusion layers $FD_2$ and $FD_3$ are also formed in the semiconductor substrate 370.

Charges generated through photoelectric conversion in the first photoelectric conversion unit 311 are stored through a contact hole portion 361 and a wire line layer 362 to a first floating diffusion layer $FD_1$ formed in the semiconductor substrate 370. The first photoelectric conversion unit 311 is also connected through the contact hole portion 361 and the wire line layer 362 to a gate portion 318 of an amplification transistor which converts a charge amount to a voltage. Furthermore, the first floating diffusion layer $FD_1$ constitutes a portion of a reset transistor (gate portion 317 is illustrated). Note that reference numeral 371 denotes an element isolation region; reference numeral 372 denotes an oxide film formed on a surface of the semiconductor substrate 370; reference numerals 376 and 381 denote interlayer insulating layers; reference numeral 383 denotes a protective layer; and reference numeral 390 denotes an on-chip microlens.

CITATION LIST

Patent Literature

[PTL 1]
JP 2011-138927 A

SUMMARY OF INVENTION

Technical Problem

However, the charges generated through photoelectric conversion in the second photoelectric conversion unit 321 and the third photoelectric conversion unit 331 are temporarily stored in the second photoelectric conversion unit 321 and the third photoelectric conversion unit 331 and, after that, are transferred to the second floating diffusion layer $FD_2$ and the third floating diffusion layer $FD_3$, respectively. Therefore, it is possible to completely deplete the second photoelectric conversion unit 321 and the third photoelectric conversion unit 331. However, the charges generated through photoelectric conversion in the first photoelectric conversion unit 311 are directly stored in the first floating diffusion layer $FD_1$. Therefore, it is difficult to completely deplete the first photoelectric conversion unit 311. As a result, kTC noise is increased, random noise is deteriorated, and thus, image quality in the imaging is deteriorated.

The present disclosure provides an imaging element where a photoelectric conversion unit is arranged on or above a semiconductor substrate and which has a configuration and a structure capable of suppressing deterioration in imaging quality, a stacked-type imaging element configured with the imaging element, a solid-state imaging device including the imaging element or the stacked-type imaging element, and a driving method for a solid-state imaging device.

Solution of Invention

According to a first embodiment of the present disclosure, an imaging device is provided. The imaging device may include a substrate including a first photoelectric conversion unit, and a second photoelectric conversion unit at a light-incident side of the substrate. The second photoelectric conversion unit may include a photoelectric conversion layer, a first electrode, a second electrode above the photoelectric conversion layer, a third electrode, and an insulating material between the third electrode and the photoelectric conversion layer, wherein a portion of the insulating material is between the first electrode and the third electrode.

According to a second embodiment of the present disclosure, an electronic apparatus is provided, the electronic apparatus including an imaging device which includes a substrate including a first photoelectric conversion unit, and a second photoelectric conversion unit at a light-incident side of the substrate. The second photoelectric conversion unit may include a photoelectric conversion layer, a first electrode, a second electrode above the photoelectric conversion layer, a third electrode, and an insulating material between the third electrode and the photoelectric conversion layer, wherein a portion of the insulating material is between the first electrode and the third electrode, and a lens configured to direct light onto a surface of the imaging device.

According to a third embodiment of the present disclosure, a method of driving an imaging device is provided. The method may include applying a first potential to a charge storage electrode during a charging period, applying a second potential to a first electrode during a charging period, wherein the first potential is greater than the second potential, applying a third potential to the charge storage electrode during a charge transfer period; and
applying a fourth potential to the first electrode during the charge transfer period, wherein the fourth potential is greater than the third potential. In some embodiments,
the imaging device includes a substrate including a first photoelectric conversion unit, and a second photoelectric conversion unit at a light-incident side of the substrate. The second photoelectric conversion unit may include a photoelectric conversion layer, the first electrode, a second electrode above the photoelectric conversion layer,
the charge storage electrode, and an insulating material between the charge storage electrode and the photoelectric conversion layer, wherein a portion of the insulating material is between the first electrode and the charge storage electrode.

Advantage Effects of Invention

In an imaging element according to an embodiment of the present disclosure, an imaging element according to an embodiment of the present disclosure constituting a stacked-type imaging element according to an embodiment of the present disclosure, or an imaging element according to an embodiment of the present disclosure constituting a solid-state imaging device according to a first or second embodiment of the present disclosure (in some cases, hereinafter, these imaging elements are collectively referred to as an "imaging element or the like according to an embodiment of the present disclosure"), since a charge storage electrode, which is arranged to be separated from a first electrode and is arranged to face a photoelectric conversion layer with an insulating layer interposed therebetween, is included, charges can be stored in the photoelectric conversion layer when the photoelectric conversion unit is illuminated with light and the light is photoelectrically converted in the photoelectric conversion unit. Therefore, at the time of a starting exposure, by completely depleting a charge storage unit, it is possible to erase the charges. As a result, it is possible to suppress the occurrence of the phenomenon of an increase in kTC noise, deterioration in random noise, and deterioration in image quality in the imaging. In a driving method for a solid-state imaging device according to an embodiment of the present disclosure, each imaging element has a structure where light incident from a second electrode side is not incident on the first electrode, and thus, in all the imaging elements, at one time, charges are stored in the photoelectric conversion layer, and the charges of the first electrode are ejected to the outside so that it is possible to reliably perform resetting the first electrodes in all the imaging elements simultaneously. Subsequently, in all the imaging elements, at one time, the charges stored in the photoelectric conversion layer are transferred to the first electrode, and after the completion of transfer, the charges transferred to the first electrodes in the respective imaging elements are sequentially read out. Therefore, a so-called global shutter function can be easily implemented. Note that the effects disclosed in the specification are exemplary ones but not limitative ones, and there may also be additional effects.

BRIEF DESCRIPTION OF DRAWINGS

FIG. 1D is a schematic partial cross-sectional view of an imaging element and a stacked-type imaging element of Example 1.

FIG. 15C is a schematic partial cross-sectional view of another modified example of the imaging element of Example 3.

FIG. 46A is a schematic partial cross-sectional view of another modified example of the imaging element and the stacked-type imaging element of Example 1.

DESCRIPTION OF EMBODIMENTS

Figure 1A:
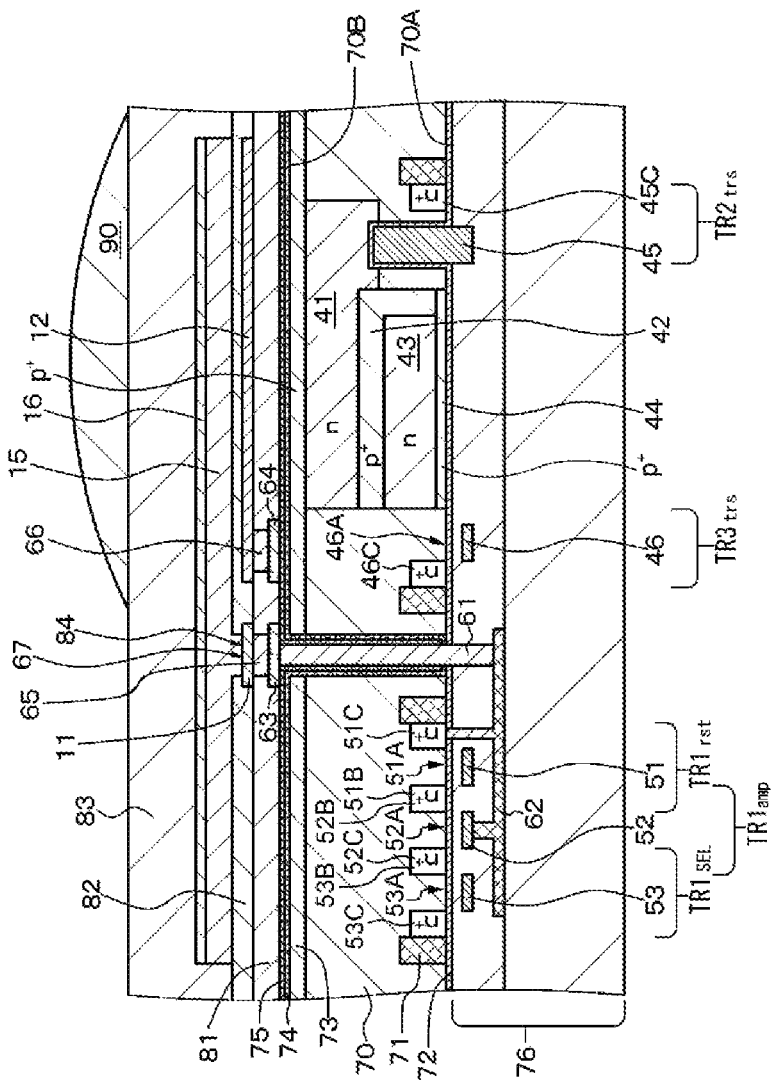
FIG. 1A is a schematic partial cross-sectional view of an imaging element and a stacked-type imaging element of Example 1.

Hereinafter, the present disclosure will be described on the basis of Examples with reference to the drawings. However, the present disclosure is not limited to the Examples, and various numeric values and materials in the Examples are exemplary ones. Note that the description is made in the order as follows.

1. Overall Description of Imaging Element according to an Embodiment of the Present Disclosure, Stacked-Type Imaging Element according to an Embodiment of the Present Disclosure, Solid-State Imaging Device according to First or Second Embodiment of the Present Disclosure, and Driving Method for Solid-State Imaging Device according to an Embodiment of the Present Disclosure 2. Example 1 (Imaging Element according to an Embodiment of the Present Disclosure, Stacked-Type Imaging Element according to an Embodiment of the Present Disclosure, and Solid-State Imaging Device according to Second Embodiment of the Present Disclosure)

3. Example 2 (Modification of Example 1)

4. Example 3 (Modification of Examples 1 and 2)

5. Example 4 (Modification of Examples 1 to 3, Imaging Element Having Transfer Control Electrode)

6. Example 5 (Modification of Examples 1 to 4, Imaging Element Having Charge Ejection Electrode)

7. Example 6 (Modification of Examples 1 to 5, Imaging Element Having Charge Storage Electrode Segments)

8. Others

<Overall Description of Imaging Element According to an Embodiment of the Present Disclosure, Stacked-Type Imaging Element According to an Embodiment of the Present Disclosure, Solid-State Imaging Device According to First or Second Embodiment of the Present Disclosure, and Driving Method for Solid-State Imaging Device According to an Embodiment of the Present Disclosure>

In an imaging element or the like according to an embodiment of the present disclosure, the imaging element may further include a semiconductor substrate, and a photoelectric conversion unit may be arranged above the semiconductor substrate. Note that a first electrode, a charge storage electrode, and a second electrode are connected to a driving circuit described later.

The second electrode located in a light incidence side may be commonly provided to a plurality of imaging elements. Namely, the second electrode may be configured as a so-called solid electrode. The photoelectric conversion layer may be commonly provided to a plurality of the imaging elements. Namely, one layer of the photoelectric conversion layer may be formed for a plurality of the imaging elements or may be formed for every imaging element.

Furthermore, in the imaging element or the like according to an embodiment of the present disclosure including various exemplary forms and configurations described above, the first electrode may be formed to extend in an opening portion provided to the insulating layer to be connected to the photoelectric conversion layer. Alternatively, the photoelectric conversion layer may be formed to extend in the opening portion provided to the insulating layer to be connected to the first electrode. In this case, the imaging element or the like may be configured to have a form where an edge of a top surface of the first electrode is covered with the insulating layer, the first electrode is exposed to a bottom surface of the opening portion, and when a surface of the insulating layer being in contact with the top surface of the first electrode is defined by a first surface and a surface of the insulating layer being in contact with a portion of the photoelectric conversion layer facing the charge storage electrode is defined by a second surface, a side surface of the opening portion has a slope expanding from the first surface toward the second surface. Furthermore, the imaging element or the like may be configured to have a form where the side surface of the opening portion having the slope expanding from the first surface toward the second surface is located in a charge storage electrode side. In addition, the above-described form includes a form where another layer is formed between the photoelectric conversion layer and the first electrode (for example, a form where a material layer suitable for charge storage is formed between the photoelectric conversion layer and the first electrode).

Furthermore, in the imaging element or the like according to an embodiment of the present disclosure including various exemplary forms and configurations described above, the imaging element or the like may have a configuration where the imaging element further includes a control unit which is provided to the semiconductor substrate and has a driving circuit, the first electrode and the charge storage electrode are connected to the driving circuit, in a charge storage period, from the driving circuit, a potential $V_{11}$ is applied to the first electrode, and a potential $V_{12}$ is applied to the charge storage electrode, so that charges are stored in the photoelectric conversion layer, and in a charge transfer period, from the driving circuit, a potential $V_{21}$ is applied to the first electrode, and a potential $V_{22}$ is applied to the charge storage electrode, so that the charges stored in the photoelectric conversion layer are read out to the control unit through the first electrode. Herein, in the case where the potential of the first electrode is higher than the potential of the second electrode, $V_{12} \geq V_{11}$ and $V_{22} < V_{21}$, and in the case where the potential of the first electrode is lower than the potential of the second electrode, $V_{12} \leq V_{11}$ and $V_{22} > V_{21}$.

Furthermore, in the imaging element or the like according to an embodiment of the present disclosure including various exemplary forms and configurations described above, the imaging element or the like may be configured to have a form where a transfer control electrode (charge transfer electrode), which is arranged between the first electrode and the charge storage electrode can be separated from the first electrode and the charge storage electrode and is arranged to face the photoelectric conversion layer through the insulating layer, is further included. Note that the imaging element or the like according to an embodiment of the present disclosure having such a form is, for the convenience of description, referred to as an "imaging element or the like according to an embodiment of the present disclosure having a transfer control electrode."

In addition, in the imaging element or the like according to an embodiment of the present disclosure having a transfer control electrode, the imaging element or the like may have a configuration where a control unit, which is provided to a semiconductor substrate and includes a driving circuit, is included, the first electrode, the charge storage electrode, and the transfer control electrode are connected to the driving circuit, in a charge storage period. From the driving circuit, a potential $V_{11}$ is applied to the first electrode, a potential $V_{12}$ is applied to the charge storage electrode, and a potential $V_{13}$ is applied to the transfer control electrode, so that charges are stored in the photoelectric conversion layer. And, in a charge transfer period, from the driving circuit a potential $V_{21}$ is applied to the first electrode, a potential $V_{22}$ is applied to the charge storage electrode, and a potential $V_{23}$ is applied to the transfer control electrode, so that the charges stored in the photoelectric conversion layer are read out to the control unit through the first electrode. Herein, in the case where a potential of the first electrode is higher than a potential of the second electrode, $V_{12} > V_{13}$ and $V_{22} \leq V_{23} \leq V_{21}$, and in the case where the potential of the first electrode is lower than the potential of the second electrode, $V_{12} < V_{13}$ and $V_{22} \geq V_{23} \geq V_{21}$.

Furthermore, in the imaging element or the like according to an embodiment of the present disclosure including various exemplary forms and configurations described above, the imaging element or the like may be configured to have a form where a charge ejection electrode, which is connected to the photoelectric conversion layer and is arranged to be separated from the first electrode and the charge storage electrode, is further included. Note that the imaging element or the like according to an embodiment of the present disclosure having such a form is, for the convenience of description, referred to as an "imaging element or the like according to an embodiment of the present disclosure having a charge ejection electrode." Furthermore, in the imaging element or the like according to an embodiment of the present disclosure having a charge ejection electrode, the imaging element or the like may be configured to have a form where the charge ejection electrode is arranged to surround the first electrode and the charge storage electrode (namely, in a frame shape). The charge ejection electrode may be shared (commonly used) by a plurality of the imaging elements. Furthermore, in this case, the imaging element may be configured in a form where the photoelectric conversion layer extends in a second opening portion provided to the insulating layer to be connected to the charge ejection electrode, an edge of a top surface of the charge ejection electrode is covered with the insulating layer, the charge ejection electrode is exposed to a bottom surface of the second opening portion, and when a surface of the insulating layer being in contact with the top surface of the charge ejection electrode is defined by a third surface and a surface of the insulating layer being in contact with a portion of the photoelectric conversion layer facing the charge storage electrode is defined by a second surface, and a side surface of the second opening portion has a slope expending from the third surface toward the second surface.

Furthermore, in the imaging element or the like according to an embodiment of the present disclosure having a charge ejection electrode, the imaging element or the like may have a configuration where a control unit, which is provided to a semiconductor substrate and includes a driving circuit, is further included, the first electrode, the charge storage electrode, and the charge ejection electrode are connected to the driving circuit, in a charge storage period, from the driving circuit, a potential $V_{11}$ is applied to the first electrode, a potential $V_{12}$ is applied to the charge storage electrode, and a potential $V_{14}$ is applied to the charge ejection electrode, so that charges are stored in the photoelectric conversion layer. And, in a charge transfer period, from the driving circuit a potential $V_{21}$ is applied to the first electrode, a potential $V_{22}$ is applied to the charge storage electrode, and a potential $V_{24}$ is applied to the charge ejection electrode, so that the charges stored in the photoelectric conversion layer are read out to the control unit through the first electrode. Herein, in the case where a potential of the first electrode is higher than a potential of the second electrode, $V_{14} > V_{11}$ and $V_{24} < V_{21}$, and in the case where the potential of the first electrode is lower than the potential of the second electrode, $V_{14} < V_{11}$ and $V_{24} > V_{21}$.

Furthermore, in the imaging element or the like according to an embodiment of the present disclosure including various exemplary forms and configurations described above, the imaging element or the like may be configured in a form where the charge storage electrode is configured with a plurality of charge storage electrode segments. Note that the imaging element or the like according to an embodiment of the present disclosure having such a form is, for the convenience of description, referred to as an "imaging element or the like according to an embodiment of the present disclosure having a plurality of charge storage electrode segments." The number of charge storage electrode segments may be two or more. Furthermore, in the imaging element or the like according to an embodiment of the present disclosure having a plurality of charge storage electrode segments, the imaging element or the like may be configured to have a form such that in the case where a potential of the first electrode is higher than a potential of the second electrode, in a charge transfer period, a potential applied to the charge storage electrode segment located at the position closest to the first electrode is higher than a potential applied to the charge storage electrode segment located at the position farthest from the first electrode. And, in the case where the potential of the first electrode is lower than the potential of the second electrode, in the charge transfer period, the potential applied to the charge storage electrode segment located at the position closest to the first electrode is lower than the potential applied to the charge storage electrode segment located at the position farthest from the first electrode.

In the imaging element or the like according to an embodiment of the present disclosure including various exemplary forms and configurations described above, the imaging element or the like may have a configuration where at least a floating diffusion layer and an amplification transistor constituting a control unit are provided to a semiconductor substrate, and the first electrode is connected to the floating diffusion layer and a gate portion of the amplification transistor, in this case, a reset transistor and a selection transistor constituting the control unit are further provided to the semiconductor substrate, the floating diffusion layer is connected to one source/drain region of the reset transistor, and one source/drain region of the amplification transistor is connected to one source/drain region of the selection transistor, and the other source/drain region of the selection transistor is connected to a signal line.

Furthermore, in the imaging element or the like according to an embodiment of the present disclosure including various exemplary forms and configurations described above, the imaging element or the like may be configured to have a form where the charge storage electrode is larger than the first electrode. When the area of the charge storage electrode is denoted by $S_1'$ and the area of the first electrode is denoted by $S_1$, although it is not limited thereto, it is preferable that the following relationship is satisfied.

$$4 \leq S_1'/S_1$$

Furthermore, in the imaging element or the like according to an embodiment of the present disclosure including various exemplary forms and configurations described above, the imaging element or the like may be configured to have a form where light is incident from a second electrode side, and a light-shielding layer is formed in a light incidence side of the second electrode. Alternatively, the imaging element or the like may be configured to have a form where light is incident from a second electrode side, light is not incident on the first electrode (in some cases, the first electrode and the transfer control electrode). In this case, the imaging element or the like may have a configuration where a light-shielding layer is formed above the first electrode (in some cases, the first electrode and the transfer control electrode) as a light incidence side of the second electrode. The imaging element or the like may have a configuration where an on-chip microlens is provided above the charge storage electrode and the second electrode, and light incident on the on-chip microlens is collected in the charge storage electrode. The light-shielding layer may be arranged above the light-incident side surface of the second electrode or may be arranged on the light-incident side surface of the second electrode. In some cases, the light-shielding layer may be formed in the second electrode. As a material constituting the light-shielding layer, there may be exemplified chromium (Cr), copper (Cu), aluminum (Al), tungsten (W), and a resin which does not transmit light (for example, polyimide resin).

As an imaging element according to an embodiment of the present disclosure, specifically, there may be exemplified an imaging element (for the convenience of description, referred to as a "first-type blue imaging element") being sensitive to blue and including a photoelectric conversion layer (for the convenience of description, referred to as a "first-type blue photoelectric conversion layer") absorbing blue light (light having a wavelength range of 425 nm to 495 nm), an imaging element (for the convenience of description, referred to as a "first-type green imaging element") being sensitive to green and including a photoelectric conversion layer (for the convenience of description, referred to as a "first-type green photoelectric conversion layer") absorbing green light (light having a wavelength range of 495 nm to 570 nm), and an imaging element (for the convenience of description, referred to as a "first-type red imaging element") being sensitive to red and including a photoelectric conversion layer (for the convenience of description, referred to as a "first-type red photoelectric conversion layer") absorbing red light (light having a wavelength range of 620 nm to 750 nm). In addition, as imaging elements having no charge storage electrode in the related art, an imaging element being sensitive to blue is, for the convenience of description, referred to as a "second-type blue imaging element;" an imaging element being sensitive to green is, for the convenience of description, referred to as a "second-type green imaging element;" an imaging element being sensitive to red is, for the convenience of description, referred to as a "second-type red imaging element;" a photoelectric conversion layer constituting the second-type blue imaging element is, for the convenience of description, referred to as a "second-type blue photoelectric conversion layer;" a photoelectric conversion layer constituting the second-type green imaging element is, for the convenience of description, referred to as a "second-type green photoelectric conversion layer;" and a photoelectric conversion layer constituting the second-type red imaging element is, for the convenience of description, referred to as a "second-type red photoelectric conversion layer."

The stacked-type imaging element according to an embodiment of the present disclosure includes at least one imaging element (photoelectric conversion element) according to an embodiment of the present disclosure. That is, the stacked-type imaging element may include, but is not limited to, the following non-limiting configurations and structures.

(A) A configuration and structure where the first-type blue photoelectric conversion unit, the first-type green photoelectric conversion unit, and the first-type red photoelectric conversion unit are stacked in the vertical direction, and the respective control units for the first-type blue imaging element, the first-type green imaging element, and the first-type red imaging element are provided in the semiconductor substrate.

(B) A configuration and structure where the first-type blue photoelectric conversion unit and the first-type green photoelectric conversion unit are stacked in the vertical direction, the second-type red photoelectric conversion unit is arranged below the two first-type photoelectric conversion units, and the respective control units for the first-type blue imaging element, the first-type green imaging element, and the second-type red imaging element are provided in the semiconductor substrate.

(C) A configuration and structure where the second-type blue photoelectric conversion unit and the second-type red photoelectric conversion unit are arranged below the first-type green photoelectric conversion unit, and the respective control units for the first-type green imaging element, the second-type blue imaging element, and the second-type red imaging element are provided in the semiconductor substrate (D) A configuration and structure where the second-type green photoelectric conversion unit and the second-type red photoelectric conversion unit are arranged below the first-type blue photoelectric conversion unit, and the respective control units for the first-type blue imaging element, the second-type green imaging element, and the second-type red imaging element are provided in the semiconductor substrate. Note that it is preferable that the arrangement order of the photoelectric conversion units of the imaging element in the vertical direction is an order of the blue photoelectric conversion unit, the green photoelectric conversion unit, and the red photoelectric conversion unit from the light-incident direction or an order of the green photoelectric conversion unit, the blue photoelectric conversion unit, and the red photoelectric conversion unit from the light-incident direction. This is because light having a shorter wavelength is absorbed in the incident surface side more efficiently. Since red light has the longest wavelength among three colors of light, it is preferable that the red photoelectric conversion unit is located in the lowest layer as viewed from the light-incident surface. One pixel is configured in the stacked structure of the imaging element. A first-type infrared-ray photoelectric conversion unit may also be included. Herein, it is preferable that a photoelectric conversion layer of the first-type infrared-ray photoelectric conversion unit is configured with, for example, an organic material, and the photoelectric conversion layer is located in the lowest layer of the stacked structure of the first-type imaging element and is arranged above the second-type imaging element. In addition, a second-type infrared-ray photoelectric conversion unit may also be included below the first-type photoelectric conversion unit.

In the first-type imaging element, for example, the first electrode is formed on an interlayer insulating layer provided on the semiconductor substrate. The imaging element formed in the semiconductor substrate may be configured to be of a back-illuminated type or of a front-illuminated type.

In the case where the photoelectric conversion layer is made of an organic material, the photoelectric conversion layer may be formed in any one of the following non-limiting forms:

(1) The photoelectric conversion layer is configured with a p-type organic semiconductor;

(2) The photoelectric conversion layer is configured with an n-type organic semiconductor;

(3) The photoelectric conversion layer is configured with a stacked structure of a p-type organic semiconductor layer/ an n-type organic semiconductor layer; (for example, the photoelectric conversion layer is configured with a stacked structure of a p-type organic semiconductor layer/a mixed layer (bulk hetero structure) of a p-type organic semiconductor and an n-type organic semiconductor/an n-type organic semiconductor layer. The photoelectric conversion layer is configured with a stacked structure of a p-type organic semiconductor layer/a mixed layer (bulk hetero structure) of a p-type organic semiconductor and an n-type organic semiconductor. The photoelectric conversion layer is configured with a stacked structure of an n-type organic semiconductor layer/a mixed layer (bulk hetero structure) of a p-type organic semiconductor and an n-type organic semiconductor.)

(4) The photoelectric conversion layer is configured with a mixed layer (bulk hetero structure) of a p-type organic semiconductor and an n-type organic semiconductor.

Herein, the stack order may be configured to be arbitrarily changed.

As a p-type organic semiconductor, one or more of the following non-limiting materials may be used: naphthalene derivatives, anthracene derivatives, phenanthrene derivatives, pyrene derivatives, perylene derivatives, tetracene derivatives, pentacene derivatives, quinacridone derivatives, thiophene derivatives, thieno thiophene derivatives, benzothiophene derivatives, benzo-thieno benzothiophene derivatives, triallyl amine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes having heterocyclic compounds as ligands, polythiophene derivatives, poly benzothiadiazole derivatives, polyfluorene derivatives, and the like. As an n-type organic semiconductor, one or more of the following non-limiting materials may be used: fullerene and fullerene derivatives <for example, fullerenes (higher-order fullerenes) such as C60, C70, and C74, endohedral fullerenes, or the like, or fullerene derivatives (for example, fullerene fluorides, PCBM fullerene compounds, fullerene multimers, or the like)>, organic semiconductors having HOMO and LUMO larger (deeper) than that of p-type organic semiconductors, and transparent inorganic metal oxides. An n-type organic semiconductor may include, but is not limited to, one or more of organic molecules or organometallic complexes having, as a portion of the molecular skeleton, heterocyclic compounds containing nitrogen atoms, oxygen atoms, or sulfur atoms, for example, pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylenevinylene derivatives, poly benzothiadiazole derivatives, polyfluorene derivatives, or the like, and subphthalocyanine derivatives. A group or the like contained in the fullerene derivatives may include, but is not limited to one or more of halogen atoms; straight-chained, branched, or cyclic alkyl groups or phenyl groups; groups having a straight-chained or condensed-cyclic aromatic compound; groups having a halide; partial fluoroalkyl groups; perfluoroalkyl groups; silylalkyl groups; silylalkoxy groups; arylsilyl groups; arylsulfanyl groups; alkylsulfanyl groups; arylsulfonyl groups; alkylsulfonyl groups; arylsulfide groups; alkylsulfide groups; amino groups; alkylamino groups; arylamino groups; hydroxy groups; alkoxy groups; acylamino groups; acyloxy groups; carbonyl groups; carboxy groups; carboxymethyl kiso amide groups; carboalkoxy groups; acyl groups; sulfonyl groups; cyano groups; nitro groups; groups having a chalcogenide; phosphine groups; phosphonate groups; and derivatives thereof. A thickness of the photoelectric conversion layer (in some cases, referred to as an "organic photoelectric conversion layer") configured with an organic material, although it is not limited thereto, may include the following non-limiting range of $1\times10^{-8}$ m to $5\times10^{-7}$ m, preferably a range of $2.5\times10^{-8}$ m to $3\times10^{-7}$ m, more preferably a range of $2.5\times10^{-8}$ m to $2\times10^{-7}$ m, and much more preferably a range of $1 \times 10^{-7}$ m to $1.8 \times 10^{-7}$ m. Note that, in many cases, organic semiconductors are classified into a p type and an n type. Herein, the p type denotes that holes may be easy to transport, and the n type denotes that electrons may be easy to transport. The types are not restrictively interpreted.

A material constituting an organic photoelectric conversion layer for photoelectrically converting light having a green wavelength, may include but is not limited to one or more of: rhodamine-based dyes, merashianin-based dyes, quinacridone derivatives, subphthalocyanine dyes (sub-phthalocyanine derivative), and the like. A material constituting an organic photoelectric conversion layer for photoelectrically converting light having a blue wavelength, may include, but is not limited to one or more of: coumarin acid dyes, tris-8-hydroxyquinoline aluminum (Alq3), merashianin-based dyes, and the like. A material of an organic photoelectric conversion layer for photoelectrically converting light having a red wavelength, may include, but is not limited to one or more of phthalocyanine dyes, subphthalocyanine dyes (subphthalocyanine derivatives), and the like.

An inorganic material of the photoelectric conversion layer, may include, but is not limited to, one or more of compound semiconductors of crystalline silicon, amorphous silicon, microcrystalline silicon, crystalline selenium, amorphous selenium, a chalcopyrite-based compound such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, or AgInSe$_2$, a group III-V compound such as GaAs, InP, AlGaAs, InGaP, AlGaInP, or InGaAsP, CdSe, CdS, In$_2$Se$_3$, In$_2$S$_3$, Bi$_2$Se$_3$, Bi$_2$S$_3$, ZnSe, ZnS, PbSe, and PbS. Quantum dots made of these materials may be used for the photoelectric conversion layer.

Alternatively, the photoelectric conversion layer may be configured to have a stacked layer structure of a lower semiconductor layer and an upper photoelectric conversion layer. In this manner, by providing the lower semiconductor layer, it is possible to prevent recoupling in the charge storage period, so that it is possible to increase transfer efficiency of the charges stored in the photoelectric conversion layer to the first electrode, and it is possible to suppress the occurrence of dark current. The materials constituting the upper layer photoelectric conversion layer may be appropriately selected among various types of materials constituting the photoelectric conversion layer described above. On the other hand, it is preferable that, as the materials constituting the lower semiconductor layer, a material having a large band gap energy value (for example, a band gap energy value of 3.0 eV or more) and having a mobility higher than those of the materials constituting the photoelectric conversion layer is used. Specifically, non-limiting examples of the material may include one or more of oxide semiconductor materials such as IGZO; transition metal die chalcogenides, silicon carbides; diamond; graphene; carbon nanotubes; and organic semiconductor materials of condensed polycyclic hydrocarbon compounds, condensed heterocyclic compounds, or the like. As materials constituting the lower semiconductor layer, in the case where the to-be-stored charges are holes, example materials include, but are not limited to, materials having an ionization potential lower than the ionization potential of the materials constituting the photoelectric conversion layer, and in the case where the to-be-stored charges are electrons, example materials include, but are not limited to materials having an electron affinity larger than the electron affinity of the materials constituting the photoelectric conversion layer. It is preferable that impurity concentration in the materials constituting the lower semiconductor layer is $1 \times 10^{18}$ cm$^{-3}$ or less. The lower semiconductor layer may have a single layer configuration or may be a multi-layer configuration. In addition, as illustrated in FIG. 46E. the materials constituting the lower semiconductor layer 15B' located above the charge storage electrode and the materials constituting the lower semiconductor layer 15B" located above the first electrode may be configured to be different from each other.

According to the solid-state imaging device in the first or second embodiments of the present disclosure, a single-plate color solid-state imaging device may be configured.

In the solid-state imaging device according to the second embodiment of the present disclosure having a stacked-type imaging element, unlike a solid-state imaging device having imaging elements in a Bayer array (namely, not performing spectral separation of blue light, green light, and red light by using color filters), one pixel is configured by stacking imaging elements being sensitive to light having plural types of wavelength in the light-incident direction in the same pixel, it is possible to improve sensitivity and pixel density per unit volume. In addition, since an organic material has a high absorption coefficient, the organic photoelectric conversion layer can be configured to have a smaller thickness than a Si-based photoelectric conversion layer of the related art, and light leakage from adjacent pixels or limitation of a light-incident angle is alleviated. Furthermore, in Si-based imaging elements of the related art, an interpolation process among three color pixels is performed, so that false color occurs in order to generate a color signal. However, in the solid-state imaging device according to the second embodiment of the present disclosure having a stacked-type imaging element, the occurrence of false color is suppressed. Since the organic photoelectric conversion layer itself has a function as a color filter, color separation can be obtained without arrangement of color filters.

On the other hand, in the solid-state imaging device according to the first embodiment of the present disclosure where color filters are used, requirements for spectral separation characteristics for blue light, green light, and red light can be alleviated, and a high productivity can be obtained. An array of the imaging element in the solid-state imaging device according to the first embodiment of the present disclosure, includes, but is not limited to, one or more of a Bayer array, an interline arrangement, a G stripe RB checkered array, a G stripe RB completely checkered array, a checkered complementary color array, a stripe array, a diagonal stripe arrangement, a primary color difference array, a field color difference sequential array, a frame color difference sequential array, a MOS-type array, an improved MOS-type array, a frame interleaved array, and a field interleaved array. Herein, one pixel (or subpixel) is configured with one imaging element.

A pixel region where a plurality of the imaging elements according to an embodiment of the present disclosure or a plurality of the stacked-type imaging elements according to an embodiment of the present disclosure are arranged is configured with a plurality of pixels which are regularly arranged in a two-dimensional array shape. The pixel region is typically configured to include an effective pixel region of actually receiving light, amplifying signal charges generated through photoelectric conversion, and reading out the signal charges to a driving circuit and a black reference pixel region for outputting optical black as a reference of a black level. The black reference pixel region is typically arranged in the outer periphery of the effective pixel region.

In the imaging element or the like according to an embodiment of the present disclosure including various exemplary forms and configurations described above, light is illuminated, and photoelectric conversion occurs in the photoelectric conversion layer, so that holes and electrons are separated as carriers. Then, the electrode where the holes are extracted is defined as an anode, the electrode where the electrons are extracted is defined as a cathode. There may be a form where the first electrode constitutes the anode, and the second electrode constitutes the cathode. On the contrary, there may also be a form where the first electrode constitutes the cathode, and the second electrode constitutes the anode.

In the case of constituting the stacked-type imaging element, the first electrode, the charge storage electrode, the transfer control electrode, the charge ejection electrode, and the second electrode may be configured to be made of a transparent conductive material. Note that, in some cases, the first electrode, the charge storage electrode, the transfer control electrode, and the charge ejection electrode are collectively referred to as a "first electrode or the like." Alternatively, in the case where the imaging elements according to an embodiment of the present disclosure or the like are arranged in a plane, for example, like in a Bayer array, the second electrode may be configured to be made of a transparent conductive material, and the first electrode may be configured to be made of a metal material. In this case, specifically, the second electrode located at the light-incident side may be configured to be made of a transparent conductive material, and the first electrode and the like may be configured to be made of, for example, Al—Nd (alloy of aluminum and neodymium) or ASC (alloy of aluminum, samarium, and copper). Note that, in some cases, an electrode made of a transparent conductive material is referred to as a "transparent electrode." The band gap energy of the transparent conductive material is 2.5 eV or, more preferably, 3.1 eV or greater. As a transparent conductive material constituting the transparent electrode, there may be exemplified a conductive metal oxide; the conductive oxide may include, but is not limited to, one or more of an indium oxide, an indium tin oxide (ITO, Sn-doped $In_2O_3$, including a crystalline ITO and an amorphous ITO), an indium zinc oxide (IZO) formed by adding indium as a dopant to a zinc oxide, an Indium gallium oxide (IGO) formed by adding indium as a dopant to a gallium oxide, an indium gallium zinc oxide (IGZO, In—$GaZnO_4$) formed by adding indium and gallium as dopants to a zinc oxide, an indium tin zinc oxide (ITZO) formed by adding tin as a dopant to a zinc oxide, an IFO (F-doped $In_2O_3$), a tin oxide ($SnO_2$), an ATO (Sb-doped $SnO_2$), an FTO (F-doped $SnO_2$), a zinc oxide (including ZnO doped with another elements), an aluminum zinc oxide (AZO) formed by adding aluminum as a dopant to a zinc oxide, a gallium zinc oxide (GZO) formed by adding gallium as a dopant to a zinc oxide, a titanium oxide ($TiO_2$), a niobium titanium oxide (TNO) formed by adding niobium as a dopant to a titanium oxide, an antimony oxide, a spinel-type oxide, and an oxide having a $YbFe_2O_4$ structure. Alternatively, a transparent electrode using one or more of a gallium oxide, a titanium oxide, a niobium oxide, a nickel oxide, or the like as a mother layer may be exemplified. As a thickness of the transparent electrode, an example of a non-limiting range may be $2\times10^{-8}$ m to $2\times10^{-7}$ m, preferably, a range of $3\times10^{-8}$ m to $1\times10^{-7}$ m. In the case where transparency is necessary for the first electrode, from the point view of simplification of the manufacturing process, it is preferable that the charge ejection electrode is also made of a transparent conductive material.

In the case where transparency is not necessary, it is preferable that a conductive material constituting a positive electrode having a function as an electrode of ejecting holes is a conductive material having a high work function (for example, $\varphi=4.5$ eV to 5.5 eV)). Specifically, the conductive material may include, but is not limited to, one or more of gold (Au), silver (Ag), chromium (Cr), nickel (Ni), palladium (Pd), platinum (Pt), iron (Fe), iridium (Ir), germanium (Ge), osmium (Os), rhenium (Re), or tellurium (Te). On the other hand, it is preferable that a conductive material constituting a negative electrode having a function as an electrode of ejecting electrons is a conductive material having a low work function (for example, $\varphi=3.5$ eV to 4.5 eV). Specifically, the conductive material may include, but is not limited to one or more of an alkali metal (for example Li, Na, K, or the like) and a fluoride thereof or an oxide thereof, an alkaline earth metal (for example, Mg, Ca, or the like) and a fluoride thereof or an oxide thereof, aluminum (Al), zinc (Zn), tin (Sn), thallium (Tl), a sodium potassium alloy, an aluminum lithium alloy, a magnesium silver alloy, indium, a rare earth metal such as ytterbium, or alloys thereof. Materials constituting the anode or the cathode include, but are not limited to one or more metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo), alloys containing these metal atoms, conductive particles made of these metals, conductive particles of alloys containing these metals, or conductive materials such as polysilicon containing impurities, carbon-based materials, oxide semiconductors, carbon nano tubes, and graphene, and a stacked structure of layers containing these atoms may be used. Furthermore, materials constituting the anode or the cathode include but are not limited to one or more of an organic material (conductive polymer) such as poly(3,4-ethylenedioxythiophene)/polystyrene sulfonic acid (PEDOT/PSS). In addition, a cured material of a paste or ink obtained by mixing the conductive material with a binder (polymer) may be used as an electrode.

As a film formation method for the first electrode or the like or the second electrode (an anode or a cathode), a dry method or a wet method may be used. Examples of a dry method include, but are not limited to a physical vapor deposition (PVD) method and a chemical vapor deposition (CVD) method. Examples of a film forming method using the principle of the PVD method, include but are not limited to, a vacuum vapor deposition method using resistance heating or high-frequency heating, an EB (electron beam) vapor deposition method, various sputtering methods (a magnetron sputtering method, an RF-DC coupling type bias sputtering method, an ECR sputtering method, a facing target sputtering method, and a high-frequency sputtering method), an ion plating method, a laser ablation method, a molecular beam epitaxy method, and a laser transfer method. In addition, examples of a CVD method include, but are not limited to, a plasma CVD method, a thermal CVD method, a metalorganic (MO) CVD method, and a photo CVD method. On the other hand, examples of a wet method, include but are not limited to an electrolytic plating method or an electroless plating method, a spin coating method, an inkjet method, a spray coating method, a stamp method, a micro-contact printing method, a flexographic printing method, an offset printing method, a gravure printing method, a dip method, and the like. Examples of a patterning method, include but are not limited to chemical etching such as shadow mask, laser transfer, or photolithography and physical etching using ultraviolet light, laser, or the like. Planarization techniques for the first electrode or the like or the second electrode may include but are not limited to, a laser planarization method, a reflow method, a chemical mechanical polishing (CMP) method, and the like.

The insulating layer may include one or more of the following non-limiting materials: besides inorganic insulating materials exemplified as metal oxide high dielectric insulating materials such as a silicon oxide-based material; a silicon nitride ($SiN_y$); and an aluminum oxide ($Al_2O_3$), such as polymethyl methacrylate (PMMA); polyvinyl phenol (PVP); polyvinyl alcohol (PVA); polyimide; polycarbonate (PC); polyethylene terephthalate (PET); polystyrene; a silanol derivative (silane coupling agent such as N-2 (aminoethyl) 3-aminopropyltrimethoxysilane (AEAPTMS), 3-mercaptopropyl trimethoxysilane (MPTMS), or octadecyltrichlorosilane (OTS); novolak type phenolic resin; a fluorine-based resin; and organic insulating materials (organic polymers) exemplified as a straight-chain hydrocarbon having, in one end thereof, a functional group capable of being bound to a control electrode such as octadecanethiol or dodecyl isocyanate, and a combination thereof may be used. Note that, as a silicon oxide-based material, non-limiting examples include, but are not limited to, a silicon oxide ($SiO_x$), BPSG, PSG, BSG, AsSG, PbSG, a silicon oxynitride (SiON), a SOG (spin-on-glass), and a low-dielectric constant material (for example, polyaryl ether, cyclo perfluorocarbon polymer and benzocyclobutene, a cyclic fluorine resin, polytetrafluoroethylene, an aryl ether fluoride, a polyimide fluoride, an amorphous carbon, and an organic SOG). Materials constituting various interlayer insulating layers or insulating films may also be appropriately selected from the aforementioned materials.

The configuration and structure of the floating diffusion layer, the amplification transistor, the reset transistor, and the selection transistor constituting the control unit may be formed to be similar to the configuration and structure of the floating diffusion layer, the amplification transistor, the reset transistor, and the selection transistor in the related art. The driving circuit may also be formed with a well-known configuration and structure.

The first electrode is connected to the floating diffusion layer and the gate portion of the amplification transistor, and thus, it is desirable that contact hole portions are formed for the connection between the first electrode and the floating diffusion layer and between the first electrode and the gate portion of the amplification transistor. The material constituting the contact hole portion may include, but is not limited to one or more of the following: polysilicon doped with impurities, a high-melting-point metal or metal silicide such as tungsten, Ti, Pt, Pd, Cu, TiW, TiN, TiNW, $WSi_2$, and $MoSi_2$, and a stacked structure (for example, Ti/TiN/W) of layers made of these materials.

A first carrier blocking layer may be provided between the organic photoelectric conversion layer and the first electrode, and a second carrier blocking layer may be provided between the organic photoelectric conversion layer and the second electrode. In addition, a first charge injection layer may be provided between the first carrier blocking layer and the first electrode, and a second charge injection layer may be provided between the second carrier blocking layer and the second electrode. The material constituting the electrode injection layer may include but is not limited to one or more of the following: alkali metals such as lithium (Li), sodium (Na), and potassium (K), fluorides thereof, oxides thereof, alkaline earth metals such as magnesium (Mg) and calcium (Ca) fluorides thereof, and oxides thereof.

A method for forming various organic layers may include, but is not limited to one or more of the following: a dry film formation method and a wet film formation method. An example of a dry film formation method, includes but is not limited to one or more of the following: a resistance heating or high-frequency heating method, a vacuum vapor deposition method using electron beam heating, a flash vapor deposition method, a plasma vapor deposition method, an EB vapor deposition method, various sputtering methods (a 2-pole sputtering method, a DC sputtering method, a DC magnetron sputtering method, a high-frequency sputtering method, a magnetron sputtering method, an RF-DC coupling type bias sputtering method, an ECR sputtering method, a facing target sputtering method, a high-frequency sputtering method, and an ion beam sputtering), a direct current (DC) method, an RF method, a multi-cathode method, an activation reaction method, an electric field vapor deposition method, various ion plating methods such as a high-frequency ion plating method and a reactive ion plating method, a laser ablation method, a molecular beam epitaxy method, a laser transfer method, and a molecular beam epitaxy (MBE) method. In addition, an example of a CVD method includes but is not limited to, a plasma CVD method, a thermal CVD method, an MOCVD method, and a photo-CVD method. On the other hand, examples of a wet method include, but are not limited to, a spin coating method; an immersion method; a casting method; a micro-contact printing method; a drop-casting method; various printing methods such as a screen printing method, an inkjet printing method, an offset printing method, a gravure printing method, and a flexographic printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coating method, a slit orifice coater method, and a calendar coater method. Note that, in the coating methods, a solvent including, but not limited to, organic solvents having no polarity or low polarity such as toluene, chloroform, hexane, and ethanol may be used. An example of a patterning method includes, but is not limited to one or more of the following: chemical etching such as shadow mask, laser transfer, or photolithography and physical etching using ultraviolet light, laser, or the like. An example of a planarization technique for various types of organic layers includes, but is not limited to one or more of the following: a laser planarization method, a reflow method, and the like.

In the imaging element or the solid-state imaging device, as described above, if necessary, an on-chip microlens or a light-shielding layer may be provided, and a driving circuit or a wire line for driving the imaging element is provided. If necessary, a shutter for controlling incidence of light on the imaging element may be provided, and the solid-state imaging device may include an optical cut-off filter according to the purpose thereof.

For example, in the case where stacking a solid-state imaging device and a read-out integrated circuit (ROIC), a driving substrate where the read-out integrated circuit and a connection portion made of copper (Cu) are formed and the imaging element where a connection portion is formed are allowed to overlap with each other so that the connection portions are in contact with each other, and then, the stacking is performed by adhering the connection portions. Alternatively, the connection portions may be adhered to each other by using solder bump or the like.

Example 1

Example 1 relates to an imaging element according to an embodiment of the present disclosure, a stacked-type imaging element according to an embodiment of the present disclosure, and a solid-state imaging device according to a second embodiment of the present disclosure.

Figure 2:
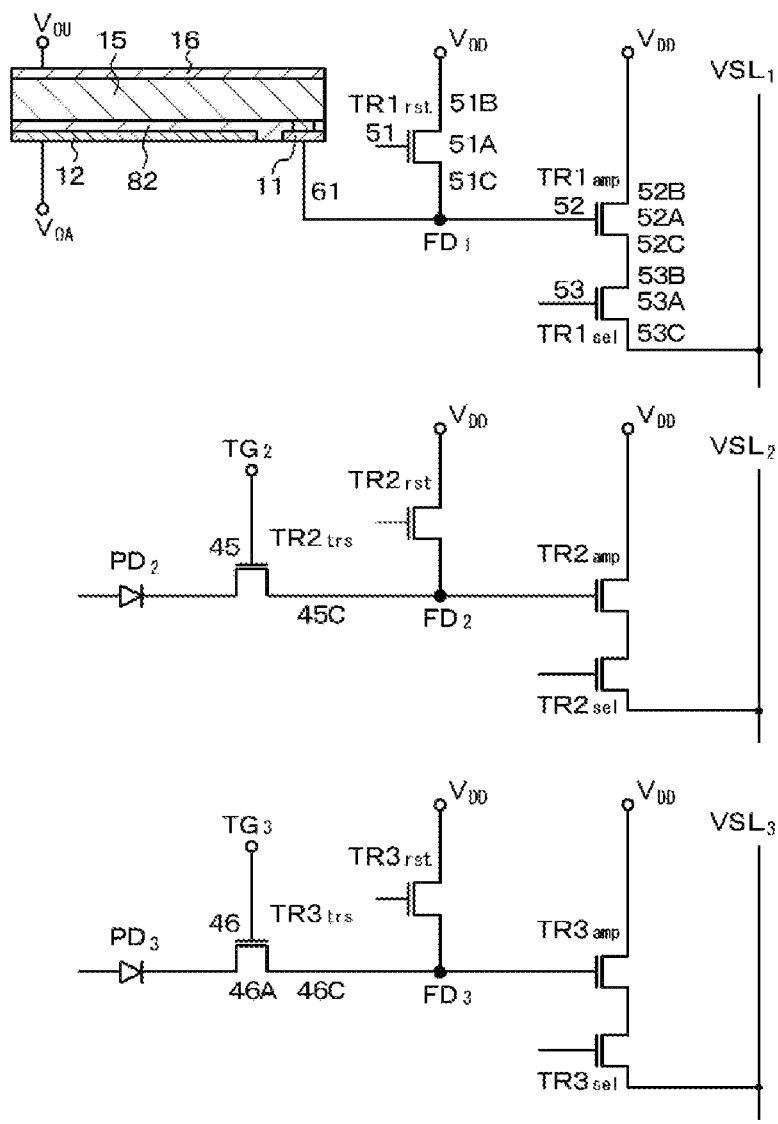
FIG. 2 is an equivalent circuit diagram of the imaging element and the stacked-type imaging element of Example 1.
Figure 3:
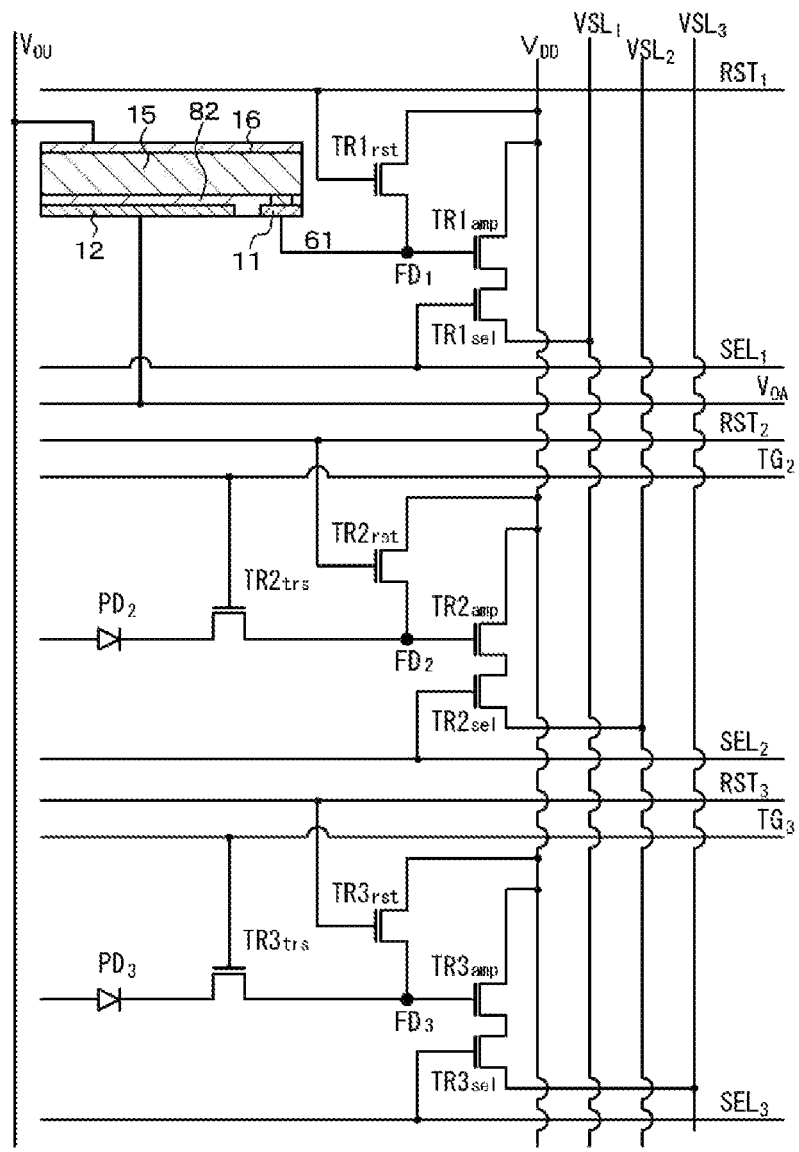
FIG. 3 is an equivalent circuit diagram of the imaging element and the stacked-type imaging element of Example 1.
Figure 4:
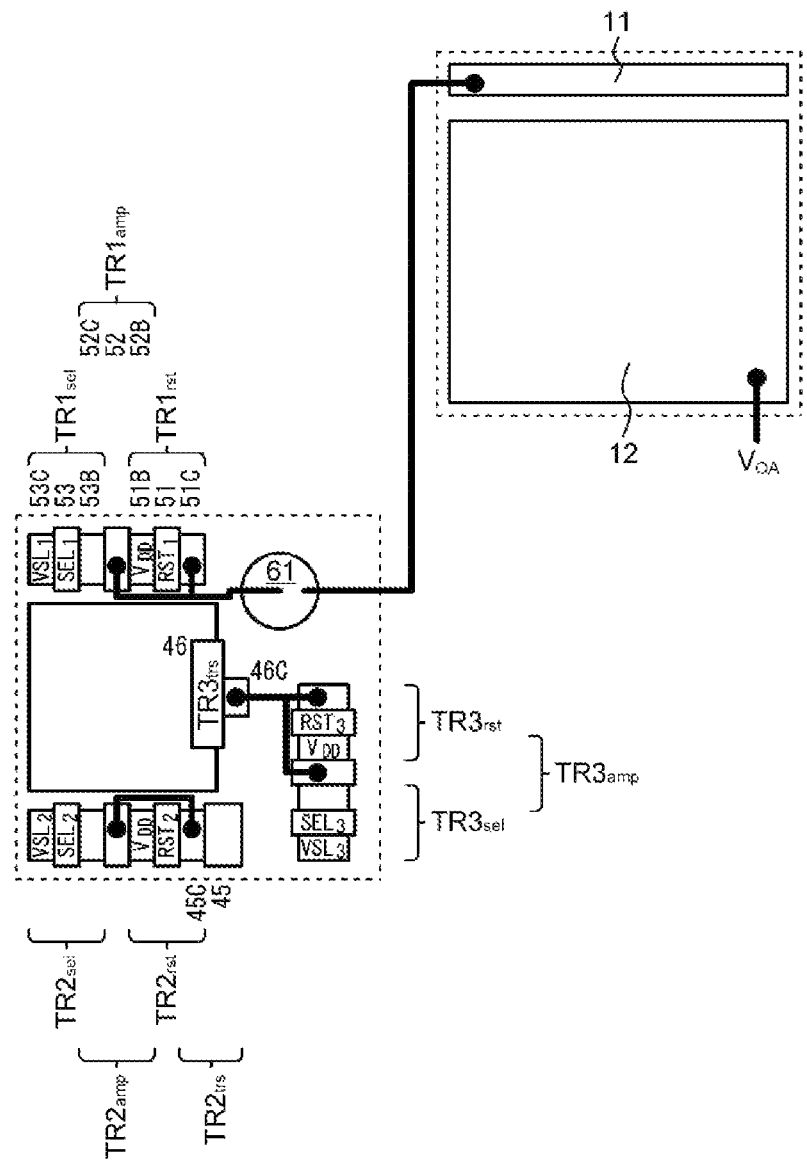
FIG. 4 is a schematic layout view of a first electrode and a charge storage electrode constituting the imaging element of Example 1 and transistors constituting a control unit.
Figure 5:
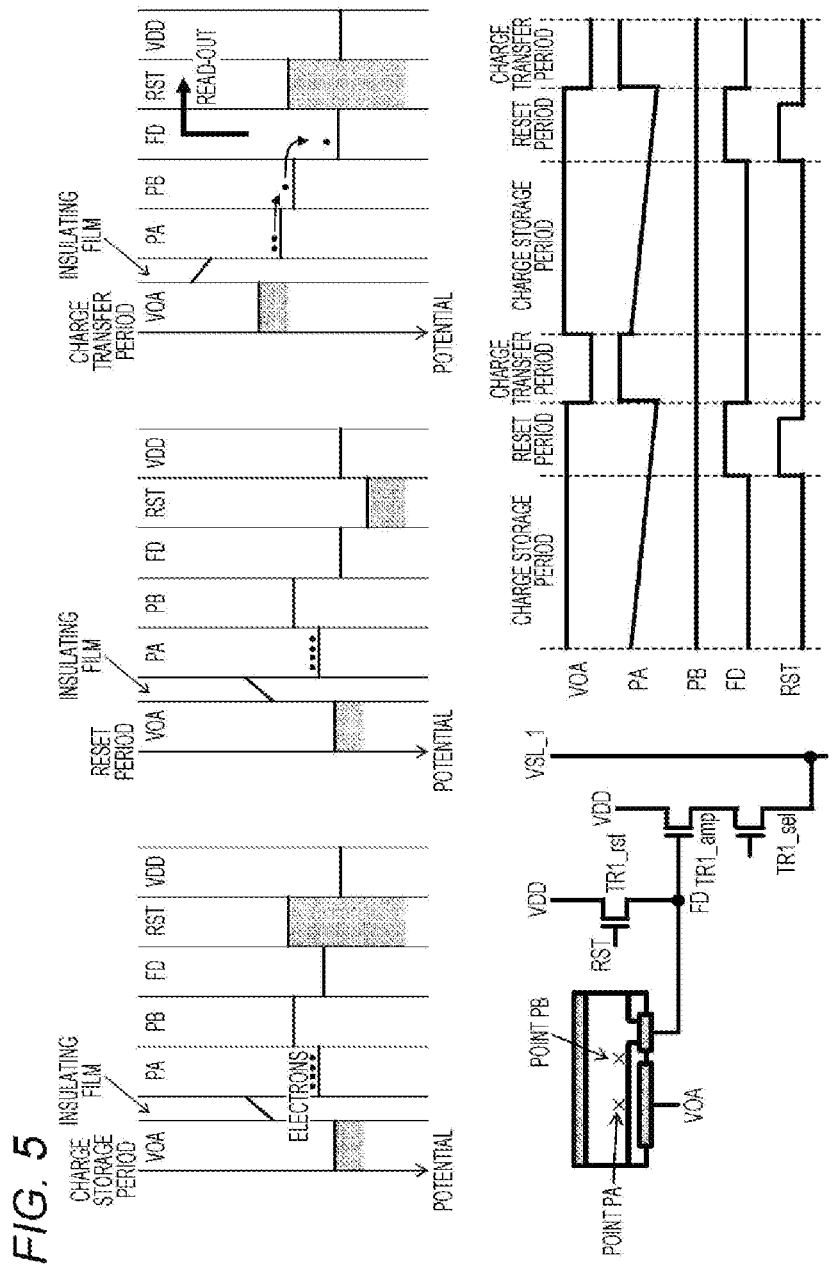
FIG. 5 is a diagram illustrating potential states of components in an operation period of the imaging element of Example 1.
Figure 6:
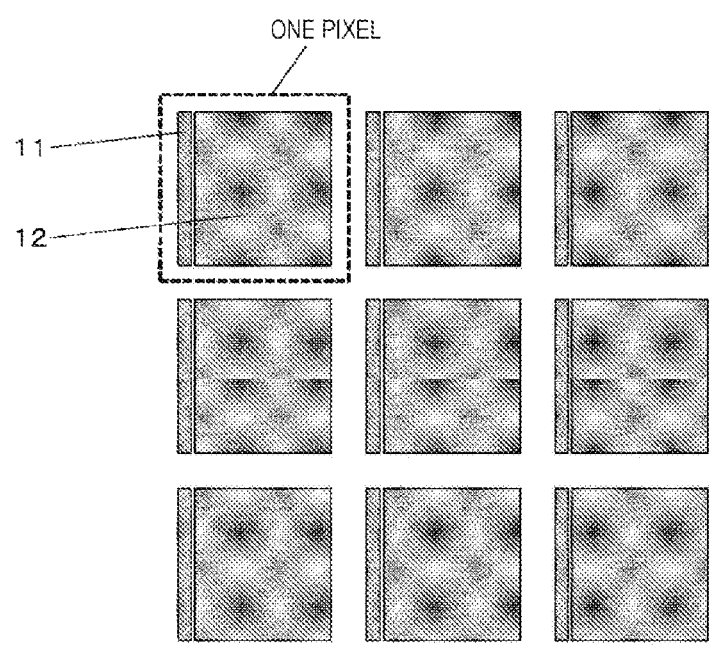
FIG. 6 is a schematic layout view of the first electrode and the charge storage electrode constituting the imaging element of Example 1.
Figure 7:
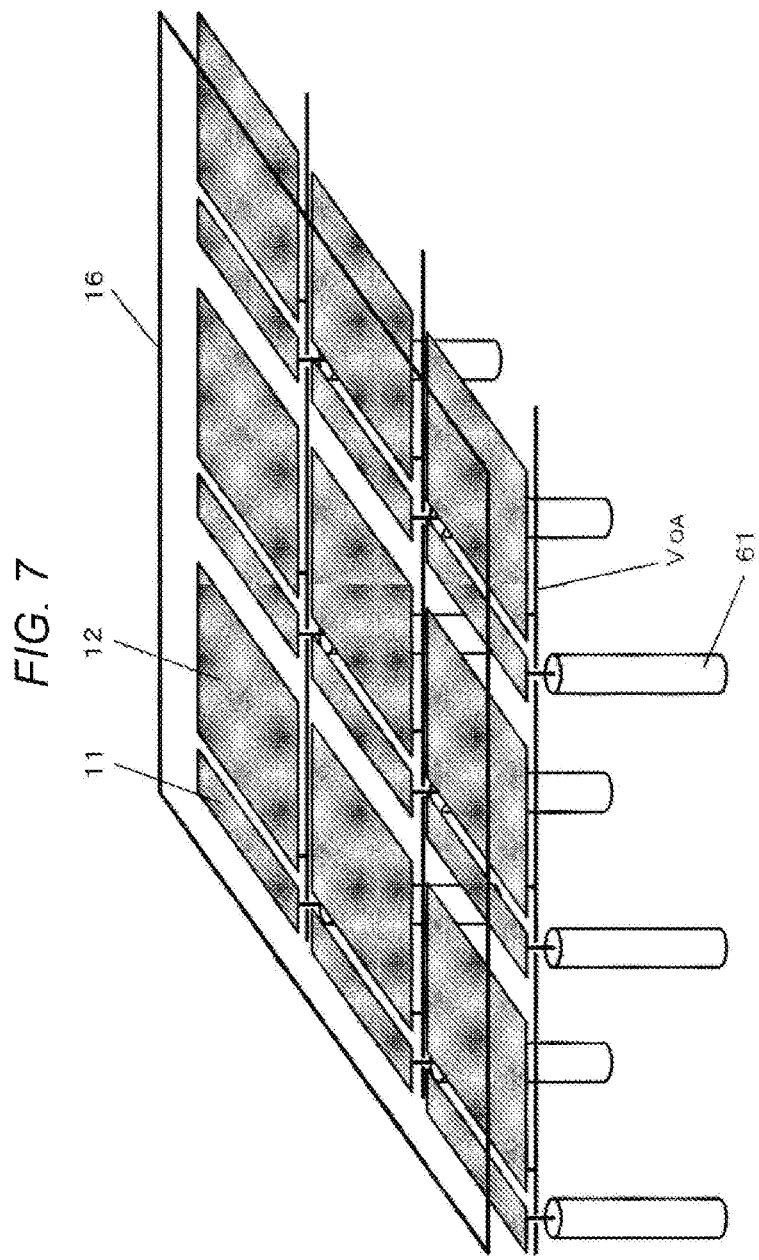
FIG. 7 is a schematic perspective view of the first electrode, the charge storage electrode, a second electrode, and a contact hole portion constituting the imaging element of Example 1.
Figure 8:
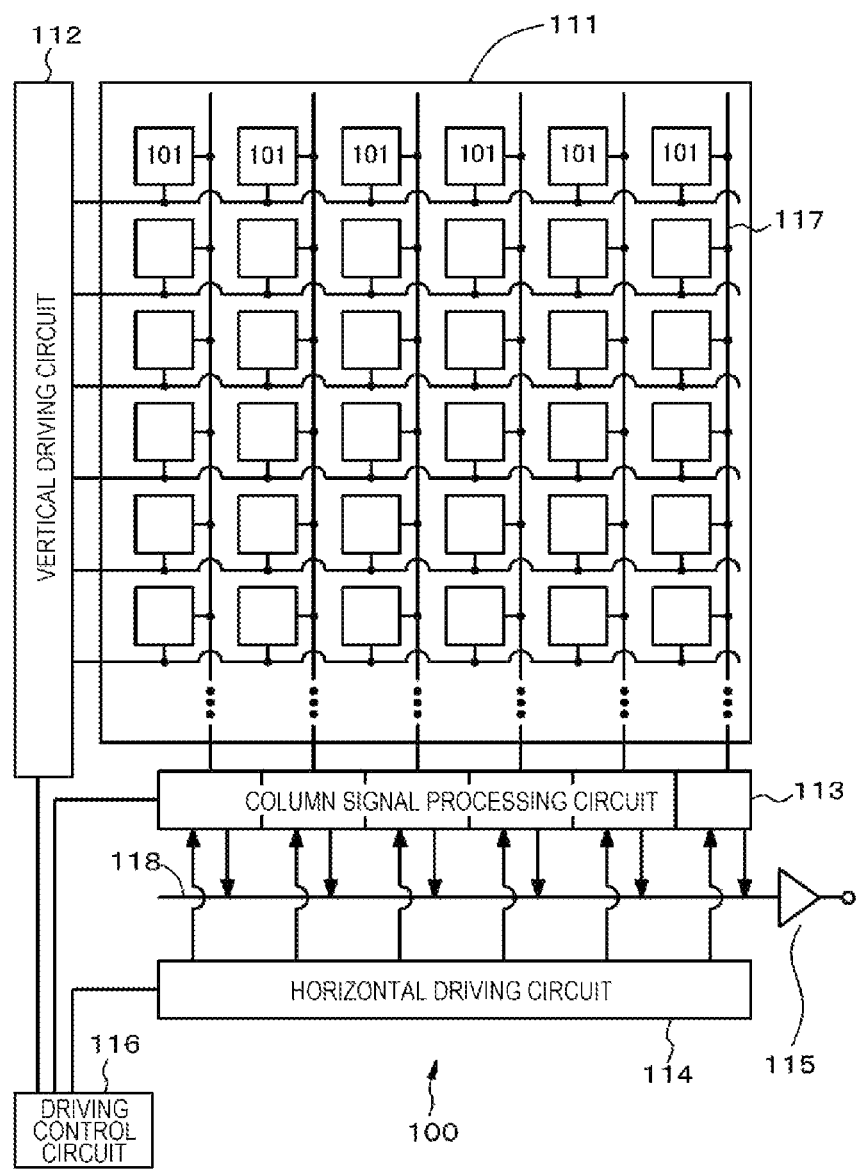
FIG. 8 is a conceptual diagram of a solid-state imaging device of Example 1.

A schematic partial cross-sectional view of a portion of the imaging element and the stacked-type imaging element of Example 1 is illustrated in FIG. 1A. Equivalent circuit diagrams of the imaging element and the stacked-type imaging element of Example 1 are illustrated in FIGS. 2 and 3. A schematic layout view of the first electrode and the charge storage electrode constituting the imaging element of Example 1 and transistors constituting a control unit is illustrated in FIG. 4. Potential states of components in an operation period of the imaging element of Example 1 are illustrated in FIG. 5. In addition, a schematic layout view of the first electrode and the charge storage electrode constituting the imaging element of Example 1 is illustrated in FIG. 6. A schematic perspective view of the first electrode, the charge storage electrode, a second electrode, and a contact hole portion constituting the imaging element of Example 1 is illustrated in FIG. 7. A conceptual diagram of the solid-state imaging device of Example 1 is illustrated in FIG. 8.

The imaging element (for example, the later-described green imaging element) of Example 1 is configured to include a photoelectric conversion unit formed by stacking a first electrode 11, a photoelectric conversion layer 15, and a second electrode 16. The photoelectric conversion unit is configured to include a charge storage electrode 12, which is arranged to be separated from the first electrode 11 and is arranged to face the photoelectric conversion layer 15 with an insulating layer 82 interposed therebetween.

Figure 1B:
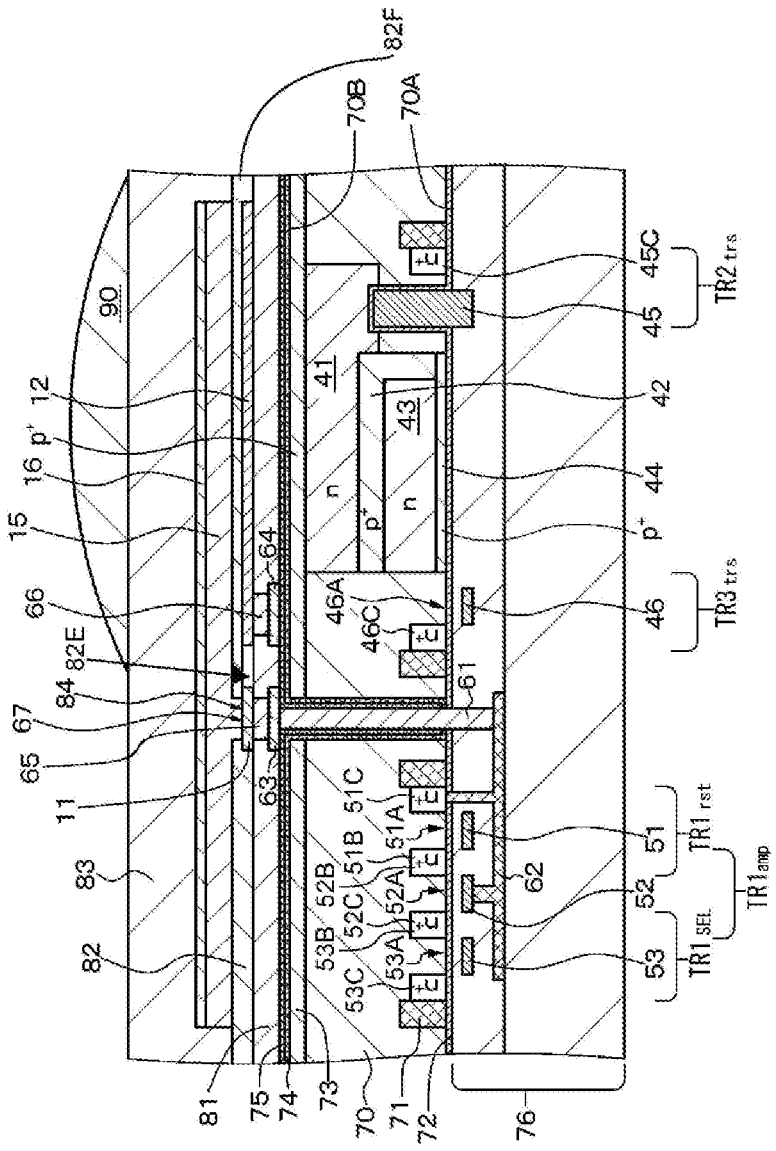
FIG. 1B is a schematic partial cross-sectional view of an imaging element and a stacked-type imaging element of Example 1.
Figure 1C:
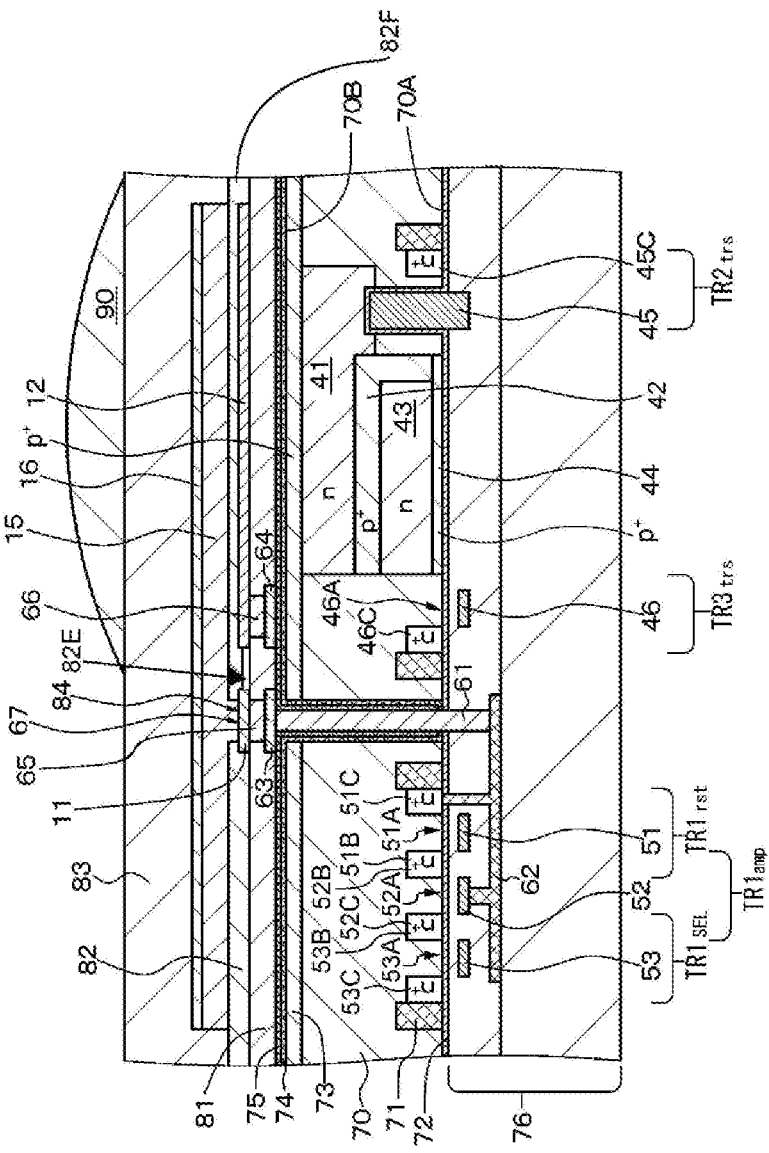
FIG. 1C is a schematic partial cross-sectional view of an imaging element and a stacked-type imaging element of Example 1.

As depicted in FIGS. 1B-D, the insulating layer 82 may include multiple layers 82E and 82F. For example, a first region of the insulating material 82 between the charge storage electrode 12 and the photoelectric conversion layer 15 may exist, and a second region of the insulating material 82 between the charge storage electrode 12 and the first electrode 11 may exist. In some embodiments, the second region of the insulating material includes a first insulating layer 82E including the insulating material and a second insulating layer 82F including the insulating material, and the first insulating material 82F is stacked on the second insulating material 82E. FIGS. 1B-D further depict various configurations with respect to the insulating layer 82 (e.g., the configurations of layers 82E and 82F change).

In addition, the stacked-type imaging element of Example 1 includes at least one imaging element of Example 1. In Example 1, the stacked-type imaging element includes one imaging element of Example 1.

Furthermore, the solid-state imaging device of Example 1 includes a plurality of the stacked-type imaging elements of Example 1.

Furthermore, a semiconductor substrate (more specifically, a silicon semiconductor layer) 70 is further included, and the photoelectric conversion unit arranged above the semiconductor substrate 70. In addition, a control unit, which is provided in the semiconductor substrate 70 and has a driving circuit to which the first electrode 11 is connected, is further included. Herein, the light-incident side of the semiconductor substrate 70 is set to "above the semiconductor substrate," and the opposite side of the semiconductor substrate 70 is set to "below the semiconductor substrate." A wire line layer 62 configured with a plurality of wire lines is provided below the semiconductor substrate 70. The semiconductor substrate 70 is provided with at least a floating diffusion layer $FD_1$ and an amplification transistor $TR1_{amp}$ constituting the control unit, and the first electrode 11 is connected to the floating diffusion layer $FD_1$ and the gate portion of the amplification transistor $TR1_{amp}$. The semiconductor substrate 70 is further provided with a reset transistor $TR1_{rst}$ and a selection transistor $TR1_{sel}$ constituting the control unit. The floating diffusion layer $FD_1$ is connected to the one source/drain region of the reset transistor $TR1_{rst}$, the one source/drain region of the amplification transistor $TR1_{amp}$ is connected to the one source/drain region of the selection transistor $TR1_{sel}$, and the other source/drain region of the selection transistor $TR1_{sel}$ is connected to a signal line $VSL_1$. The amplification transistor $TR1_{amp}$, the reset transistor $TR1_{rst}$, and the selection transistor $TR1_{sel}$ constitute a driving circuit.

Specifically, the imaging element and the stacked-type imaging element of Example 1 are a back-illuminated type imaging element and a back-illuminated type stacked-type imaging element and includes a stacked structure of three imaging elements of a first-type green imaging element of Example 1 (hereinafter, referred to as a "first imaging element") being sensitive to green and including a first-type green photoelectric conversion layer absorbing green light, a second-type blue imaging element of the related art (hereinafter, referred to as a "second imaging element") being sensitive to blue and including a second-type blue photoelectric conversion layer absorbing blue light, and a second-type red imaging element of the related art (hereinafter, referred to as a "third imaging element") being sensitive to red and including a second-type red photoelectric conversion layer absorbing red light. The red imaging element (third imaging element) and the blue imaging element (second imaging element) are provided in the semiconductor substrate 70, and the second imaging element is located to be closer to the light-incident side than the third imaging element. In addition, the green imaging element (first imaging element) is provided above the blue imaging element (second imaging element). One pixel is configured in a stacked structure of the first imaging element, the second imaging element, and the third imaging element. No color filter is provided.

In the first imaging element, the first electrode 11 and the charge storage electrode 12 are formed on an interlayer insulating layer 81 to be separated from each other. The interlayer insulating layer 81 and the charge storage electrode 12 are covered with the insulating layer 82. The photoelectric conversion layer 15 is formed on the insulating layer 82, and the second electrode 16 is formed on the photoelectric conversion layer 15. In the entire surface, including the second electrode 16, a protective layer 83 is formed, and an on-chip microlens 90 is provided on the protective layer 83. The first electrode 11, the charge storage electrode 12, and the second electrode 16 are configured with transparent electrodes made of, for example, ITO. The photoelectric conversion layer 15 is configured with a layer containing a well-known organic photoelectric conversion material (for example, an organic material such as, but not limited to, a rhodamine-based dye, a merashianin-based dye, and quinacridone) being sensitive to green. In addition, the photoelectric conversion layer 15 may further have a configuration including a material layer suitable for charge storage. Namely, the material layer suitable for charge storage may be formed between the photoelectric conversion layer 15 and the first electrode 11 (for example, in the connection portion 67). The interlayer insulating layer 81, the insulating layer 82, and the protective layer 83 are configured with well-known insulating materials (for example, $SiO_2$ or SiN). The photoelectric conversion layer 15 and the first electrode 11 are connected to each other by the connection portion 67 provided to the insulating layer 82. The photoelectric conversion layer 15 extends in the connection portion 67. Namely, the photoelectric conversion layer 15 extends in an opening portion 84 provided to the insulating layer 82 to be connected to the first electrode 11.

The charge storage electrode 12 is connected to the driving circuit. Specifically, the charge storage electrode 12 is connected to a vertical driving circuit 112 constituting the driving unit through a connection hole 66, a pad portion 64, and a wire line $V_{OA}$ provided in the interlayer insulating layer 81.

The charge storage electrode 12 is larger than the first electrode 11. When the area of the charge storage electrode 12 is denoted by $S_1'$ and the area of the first electrode 11 is denoted by $S_1$, although it is not limited thereto, it is preferable that the following relationship is satisfied, $$4 \le S_1'/S_1$$

and, in Example 1, although it is not limited thereto, for example, the following relationship is set.

$$S_1'/S_1 = 8$$

An element isolation region 71 is formed in a first surface (front surface) 70A side of the semiconductor substrate 70, and an oxide film 72 is formed on the first surface 70A of the semiconductor substrate 70. Furthermore, the first surface side of the semiconductor substrate 70 is provided with the reset transistor $TR1_{rst}$, the amplification transistor $TR1_{amp}$, and the selection transistor $TR1_{sel}$ constituting the control unit for the first imaging element and is further provided with the first floating diffusion layer $FD_1$.

The reset transistor $TR1_{rst}$ is configured with a gate portion 51, a channel forming region 51A, and source/drain regions 51B and 51C. The gate portion 51 of the reset transistor $TR1_{rst}$ is connected to a reset line $RST_1$, the one source/drain region 51C of the reset transistor $TR1_{rst}$ also serves as a first floating diffusion layer $FD_1$, and the other source/drain region 51B thereof is connected to a power source $V_{DD}$.

The first electrode 11 is connected to the one source/drain region 51C (first floating diffusion layer $FD_1$) of the reset transistor $TR1_{rst}$ through a connection hole 65 and a pad portion 63 provided in the interlayer insulating layer 81, a contact hole portion 61 provided to the semiconductor substrate 70 and the interlayer insulating layer 76, and the wire line layer 62 formed in the interlayer insulating layer 76.

The amplification transistor $TR1_{amp}$ is configured with a gate portion 52, a channel forming region 52A, and source/drain regions 52B and 52C. The gate portion 52 is connected to the first electrode 11 and the one source/drain region 51C (first floating diffusion layer $FD_1$) of the reset transistor $TR1_{rst}$ through the wire line layer 62. In addition, the one source/drain region 52C shares the regions with the other source/drain region 51B constituting the reset transistor $TR1_{rst}$ and is connected to the power source $V_{DD}$.

The selection transistor $TR1_{sel}$ is configured with a gate portion 53, a channel forming region 53A, and source/drain regions 53B and 53C. The gate portion 53 is connected to the select line $SEL_1$. In addition, the one source/drain region 53B shares the region with the other source/drain region 52C constituting the amplification transistor $TR1_{amp}$, and the other source/drain region 53C is connected to the signal line (data output line) $VSL_1$ (117).

The second imaging element includes an n-type semiconductor region 41 provided to the semiconductor substrate 70 as a photoelectric conversion layer. A gate portion 45 of the transfer transistor $TR2_{trs}$ configured with a vertical-type transistor extends to the n-type semiconductor region 41 and is connected to a transfer gate line $TG_2$. In addition, a second floating diffusion layer $FD_2$ is provided to a region 45C of the semiconductor substrate 70 in the vicinity of the gate portion 45 of the transfer transistor $TR2_{trs}$. The charges stored in the n-type semiconductor region 41 are read out to the second floating diffusion layer $FD_2$ through a transfer channel formed along the gate portion 45.

In the second imaging element, in the first surface side of the semiconductor substrate 70, a reset transistor $TR2_{rst}$, an amplification transistor $TR2_{amp}$, and a selection transistor $TR2_{sel}$ constituting the control unit for the second imaging element are further provided.

The reset transistor $TR2_{rst}$ is configured with a gate portion, a channel forming region, and source/drain regions. The gate portion of the reset transistor $TR2_{rst}$ is connected to the reset line $RST_2$, the one source/drain region of the reset transistor $TR2_{rst}$ is connected to the power source $V_{DD}$, and the other source/drain region thereof serves as a second floating diffusion layer $FD_2$.

The amplification transistor $TR2_{amp}$ is configured with a gate portion, a channel forming region, and source/drain regions. The gate portion is connected to the other source/drain region (second floating diffusion layer $FD_2$) of the reset transistor $TR2_{rst}$. In addition, the one source/drain region thereof shares the region with the other source/drain region constituting the reset transistor $TR2_{rst}$ and is connected to the power source $V_{DD}$.

The selection transistor $TR2_{sel}$ is configured with a gate portion, a channel forming region, and source/drain regions. The gate portion is connected to the select line $SEL_2$. In addition, the one source/drain region thereof shares the region with the other source/drain region constituting the amplification transistor $TR2_{amp}$, and the other source/drain region is connected to the signal line (data output line) $VSL_2$.

The third imaging element includes an n-type semiconductor region 43 provided to the semiconductor substrate 70 as a photoelectric conversion layer. The gate portion 46 of the transfer transistor $TR3_{trs}$ is connected to the transfer gate line $TG_3$. In addition, a third floating diffusion layer $FD_3$ is provided to the region 46C of the semiconductor substrate 70 in the vicinity of the gate portion 46 of the transfer transistor $TR3_{trs}$. The charges stored in the n-type semiconductor region 43 are read out to the third floating diffusion layer $FD_3$ through a transfer channel 46A formed along the gate portion 46.

In the third imaging element, in the first surface side of the semiconductor substrate 70, a reset transistor $TR3_{rst}$, an amplification transistor $TR3_{amp}$, and a selection transistor $TR3_{sel}$ constituting the control unit for the third imaging element are further provided.

The reset transistor $TR3_{rst}$ is configured with a gate portion, a channel forming region, and source/drain regions. The gate portion of the reset transistor $TR3_{rst}$ is connected to the reset line $RST_3$, the one source/drain region of the reset transistor $TR3_{rst}$ is connected to the power source VDD, and the other source/drain region thereof serves as a third floating diffusion layer $FD_3$.

The amplification transistor $TR3_{amp}$ is configured with a gate portion, a channel forming region, and source/drain regions. The gate portion is connected to the other source/drain region (third floating diffusion layer $FD_3$) of the reset transistor $TR3_{rst}$. In addition, the one source/drain region thereof shares the region with the other source/drain region constituting the reset transistor TR3$_{rst}$ and is connected to the power source V$_{DD}$.

The selection transistor TR3$_{sel}$ is configured with a gate portion, a channel forming region, and source/drain regions. The gate portion is connected to the select line SEL$_3$. In addition, the one source/drain region shares the region with the other source/drain region constituting the amplification transistor TR3$_{amp}$, and the other source/drain region thereof is connected to the signal line (data output line) VSL$_3$.

The reset lines RST$_1$, RST$_2$, and RST$_3$, the select lines SEL$_1$, SEL$_2$, and SEL$_3$, and the transfer gate lines TG$_2$ and TG$_3$ are connected to the vertical driving circuit 112 constituting the driving circuit, and the signal lines (data output lines) VSL$_1$, VSL$_2$, and VSL$_3$ are connected to a column signal processing circuit 113 constituting the driving circuit.

A p+ layer 44 is provided between the n-type semiconductor region 43 and the surface 70A of the semiconductor substrate 70, so that the occurrence of dark current is suppressed. A p+ layer 42 is formed between the n-type semiconductor region 41 and the n-type semiconductor region 43, and a portion of the side surface of the n-type semiconductor region 43 is surrounded by the p+ layer 42. A p+ layer 73 is formed in the back surface 70B side of the semiconductor substrate 70, and An HfO$_2$ film 74 and an insulating film 75 are formed in a portion inside the semiconductor substrate 70 where the contact hole portion 61 is to be formed from the p+ layer 73. In the interlayer insulating layer 76, although wire lines are formed over multiple layers, the illustration is omitted.

The HfO2 film 74 is a film having negative fixed charges, and by preparing such a film, the occurrence of dark current can be suppressed. Note that, instead of the HfO$_2$ film, there may be used an aluminum oxide (Al$_2$O$_3$) film, a zirconium oxide (ZrO$_2$) film, a tantalum oxide (Ta$_2$O$_5$) film, a titanium oxide (TiO$_2$) film, a lanthanum oxide (La$_2$O$_3$) film, a praseodymium oxide (Pr$_2$O$_3$) film, a cerium oxide (CeO$_2$) film, a neodymium oxide (Nd$_2$O$_3$) film, a promethium oxide (Pm$_2$O$_3$) film, a samarium oxide (Sm$_2$O$_3$) film, an europium oxide (Eu$_2$O$_3$) film, a gadolinium oxide ((Gd$_2$O$_3$) film, a terbium oxide (Tb$_2$O$_3$) film, a dysprosium oxide (Dy$_2$O$_3$) film, a holmium oxide (Ho$_2$O$_3$) film, a thulium oxide (Tm$_2$O$_3$) film, a ytterbium oxide (Yb$_2$O$_3$) film, a lutetium oxide (Lu$_2$O$_3$) film, a yttrium oxide (Y$_2$O$_3$) film, a hafnium nitride film, an aluminum nitride film, a hafnium oxynitride film, or an aluminum oxynitride film. As a film formation method for these films, there may be exemplified a CVD method, a PVD method, and an ALD method.

Hereinafter, operations of the imaging element (first imaging element) of Example 1 will be described with reference to FIG. 5. Herein, the potential of the first electrode 11 is set to be higher than the potential of the second electrode. Namely, for example, when the first electrode 11 is set to a positive potential and the second electrode is set to a negative potential, electrons are read out to the floating diffusion layer through photoelectric conversion in the photoelectric conversion layer 15. A similar operation is performed in other examples. Note that, in a form where, when the first electrode 11 is set to a negative potential and the second electrode is set to a positive potential, holes are read out to the floating diffusion layer through the photoelectric conversion in the photoelectric conversion layer 15, the levels of the potentials hereinafter mentioned may be set to be opposite.

Figure 20:
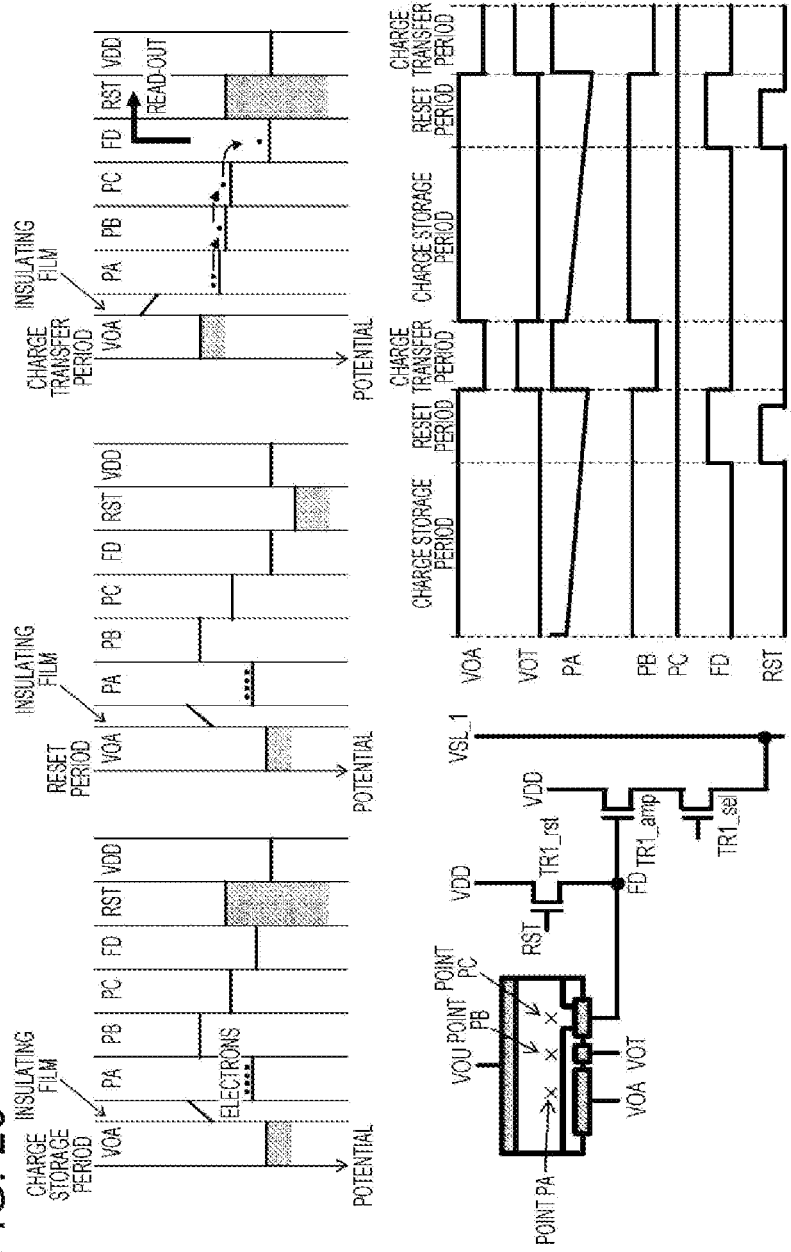
FIG. 20 is a diagram illustrating potential states of components in an operation period of the imaging element of Example 4.
Figure 21:
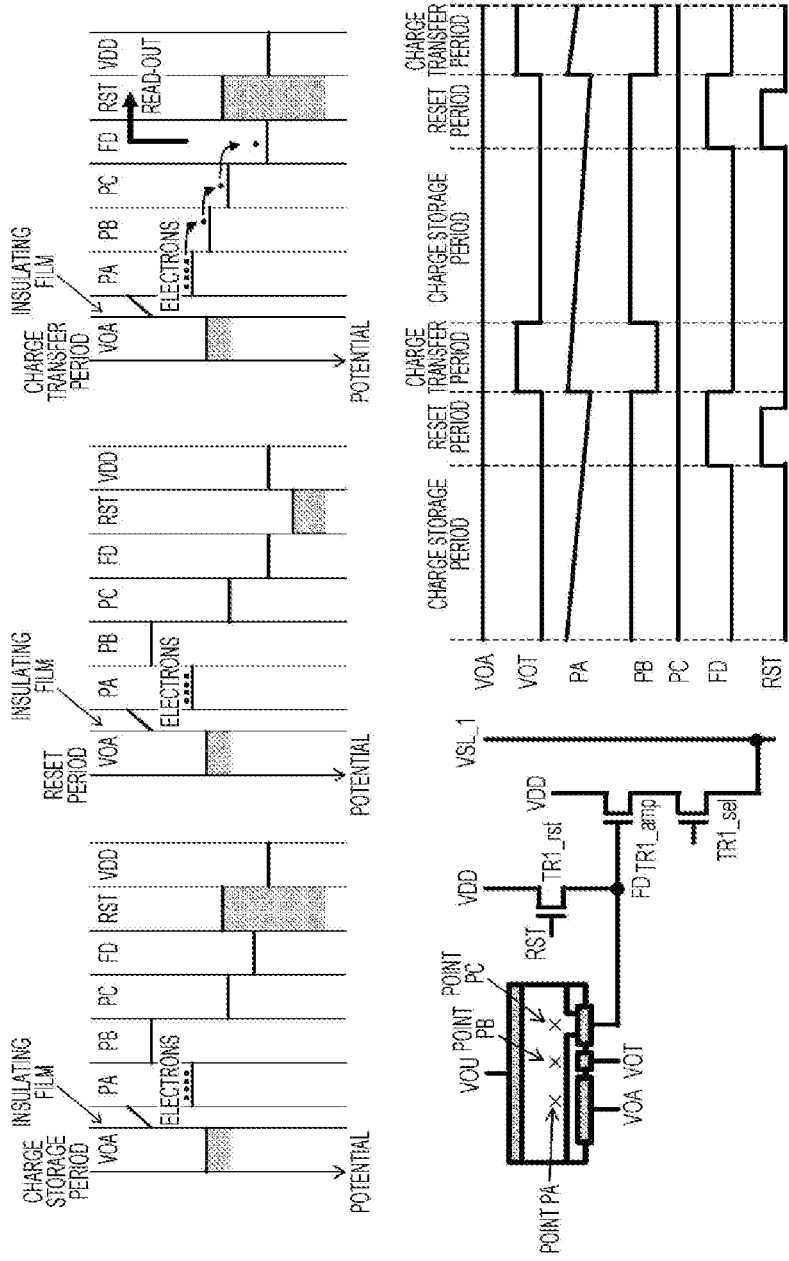
FIG. 21 is a diagram illustrating potential states of components in another operation period of the imaging element of Example 4.

Reference numerals used in FIG. 5, FIG. 20, and FIG. 21 in Example 4 are described later, and FIGS. 32 and 33 in Example 6 described later are as follows.

PA . . . the potential of a point PA of the region of the photoelectric conversion layer 15 facing the charge storage electrode 12 or the potential of a point PA of the region of the photoelectric conversion layer 15 facing the charge storage electrode segment 12C;

PB . . . the potential of a point PB of the region of the photoelectric conversion layer 15 facing a region located in the middle between the charge storage electrode 12 and the first electrode 11, the potential of a point PB of the region of the photoelectric conversion layer 15 facing transfer control electrode (charge transfer electrode) 13, or the potential of a point PB of the region of the photoelectric conversion layer 15 facing the charge storage electrode segment 12B;

PC . . . the potential of a point PC of the region of the photoelectric conversion layer 15 facing the first electrode 11 or the potential of a point PC of the region of the photoelectric conversion layer 15 facing the charge storage electrode segment 12A;

PD . . . the potential of a point PD of the region of the photoelectric conversion layer 15 facing a region located in the middle between the charge storage electrode segment 12C and the first electrode 11;

FD . . . the potential of the first floating diffusion layer FD$_1$;

VOA . . . the potential of the charge storage electrode 12.

VOA-A . . . the potential of the charge storage electrode segment 12A;

VOA-B . . . the potential of the charge storage electrode segment 12B;

VOA-C . . . the potential of the charge storage electrode segment 12C;

VOT . . . the potential of the transfer control electrode (charge transfer electrode) 13;

RST . . . the potential of the gate portion 51 of the reset transistor TR1$_{rst}$;

VDD . . . the potential of the power source;

VSL_1 . . . the signal line (data output line) VSL$_1$;

TR1_rst . . . the reset transistor TR1$_{rst}$;

TR1_amp . . . the amplification transistor TR1$_{amp}$; and

TR1_sel . . . the selection transistor TR1$_{sel}$.

In a charge storage period, a potential V$_{11}$ is applied from the driving circuit to the first electrode 11, and a potential V$_{12}$ is applied from the driving circuit to the charge storage electrode 12. By the light incident on the photoelectric conversion layer 15, photoelectric conversion occurs in the photoelectric conversion layer 15. The holes generated through the photoelectric conversion are transferred from the second electrode 16 through the wire line V$_{OU}$ to the driving circuit. On the other hand, since the potential of the potential of the first electrode 11 is set to be higher than the potential of the second electrode 16, namely, for example, since a positive potential is applied to the first electrode 11 and a negative potential is applied to the second electrode 16, it is set that V$_{12}$≥V$_{11}$, preferably, V$_{12}$>V$_{11}$. Therefore, the electrons generated through the photoelectric conversion are attracted by the charge storage electrode 12, and thus, the electrons are stopped in the region of the photoelectric conversion layer 15 facing the charge storage electrode 12. Namely, the charges are stored in the photoelectric conversion layer 15. Since V$_{12}$>V$_{11}$, the electrons generated in the inner portion of the photoelectric conversion layer 15 do not move toward the first electrode 11. As the time of the photoelectric conversion elapses, the potential of the region of the photoelectric conversion layer 15 facing the charge storage electrode 12 becomes a further negative value.

In the last stage of the charge storage period, a reset operation is performed. Therefore, the potential of the first floating diffusion layer $FD_1$ is reset, and the potential of the first floating diffusion layer $FD_1$ becomes the potential $V_{DD}$ of the power source.

After the completion of the reset operation, charge read-out is performed. Namely, in the charge transfer period, from the driving circuit, a potential $V_{21}$ is applied to the first electrode 11, and a potential $V_{22}$ is applied to the charge storage electrode 12. Herein, it is set that $V_{22} < V_{21}$. By doing so, the electrons, which have stopped in the region of the photoelectric conversion layer 15 facing the charge storage electrode 12, are read out to the first electrode 11, furthermore, to the first floating diffusion layer $FD_1$. Namely, the charges stored in the photoelectric conversion layer 15 are read out to the control unit.

The structure which includes the insulation layer 82 between the charge storage electrode 12 and the first electrode 11 can curb variation of the PB electric potential. Without the insulation layer 82 at such a position, the various positions of the edge of the insulation layer 82 can cause a variation of the PB electric potential in addition to a distance between the charge storage electrode 12 and the first electrode 11. On the contrary, the presence of the insulation layer 82 in an opening between the charge storage electrode 12 and the first electrode 11 allows the distance between the charge storage electrode 12 and the first electrode 11 to determine the effect of the PB electric potential because. Thus, by including insulation layer 82 as mentioned above, the insulation layer 82 may cause the minimum PB electric potential to increase which effectively confines electrons to the PA position and further reduces a leakage of electric current.

In this manner described heretofore, a series of the operations of the charge storage, the reset operation, and the charge transfer is completed.

The operations of the amplification transistor $TR1_{amp}$ and the selection transistor $TR1_{sel}$ after the read-out of the electrons to the first floating diffusion layer $FD_1$ are the same as the operations of such transistors in the related art. In addition, a series of operations of the charge storage, the reset operation, and the charge transfer of the second imaging element and third imaging element is similar to a series of operations of the charge storage, the reset operation, and the charge transfer in the related art. In addition, similarly to the related art, reset noise of the first floating diffusion layer $FD_1$ can be removed by a correlated double sampling (CDS) process.

As described above, in Example 1, since the charge storage electrode, which is arranged to be separated from the first electrode and is arranged to face the photoelectric conversion layer with the insulating layer interposed therebetween, is provided, when the photoelectric conversion unit is illuminated with light and the photoelectric conversion is performed in the photoelectric conversion unit, a kind of capacitor is formed by the, photoelectric conversion layer, the insulating layer, and the charge storage electrode, so that the charges can be stored in the photoelectric conversion layer. Therefore, at the time of starting exposure, by completely depleting a charge storage unit, it is possible to erase the charges. As a result, it is possible to suppress the occurrence of the phenomenon of an increase in kTC noise, deterioration in random noise, and a deterioration in image quality in the imaging. In addition, since the entire pixels can be reset at one time, a so-called global shutter function can be implemented.

A conceptual diagram of a solid-state imaging device of Example 1 is illustrated in FIG. 8. The solid-state imaging device 100 of Example 1 is configured to include an imaging region 111 where stacked-type imaging elements 101 are arranged in a two-dimensional array shape and driving circuits (peripheral circuits) such as a vertical driving circuit 112, a column signal processing circuit 113, a horizontal driving circuit 114, an output circuit 115, and a driving control circuit 116. Note that, these circuits may be configured with well-known circuits. It is obvious that these circuits may also be configured by using other circuit configurations (for example, various circuits used for a CCD imaging device or a CMOS imaging device in the related art. Note that, in FIG. 8, the stacked-type imaging elements 101 of only one row are indicated by reference numerals "101."

The driving control circuit 116 generates a clock signal and a control signal which become references of operations of the vertical driving circuit 112, the column signal processing circuit 113, and the horizontal driving circuit 114 on the basis of a vertical synchronization signal, a horizontal synchronization signal and a master clock. Then, the generated clock signal or control signal is input to the vertical driving circuit 112, the column signal processing circuit 113, and the horizontal driving circuit 114.

The vertical driving circuit 112 is configured with, for example, shift registers and selectively scans the stacked-type imaging elements 101 of the imaging region 111 sequentially in unit of a row in the vertical direction. Then, a pixel signal (image signal) based on a current (signal) generated according to a received light amount of each stacked-type imaging element 101 is transmitted through the signal line (data output line) 117 and VSL to the column signal processing circuit 113.

The column signal processing circuit 113 is arranged, for example, for every column of the stacked-type imaging elements 101 and performs a signal process such as noise removal or signal amplification on the image signal output from one row of the stacked-type imaging elements 101 according to a signal from a black reference pixel (not shown but formed in the periphery of an effective pixel region) for every imaging element.

A horizontal selection switch (not shown) is provided to be connected between the output stage of the column signal processing circuit 113 and the horizontal signal line 118.

The horizontal driving circuit 114 is configured with, for example, shift registers and sequentially selects the column signal processing circuits 113 by sequentially outputting horizontal scan pulses to output signals of the column signal processing circuits 113 to the horizontal signal line 118.

The output circuit 115 performs a signal process on the signals sequentially supplied from the column signal processing circuits 113 through the horizontal signal line 118 and outputs the signals.

Figure 9:
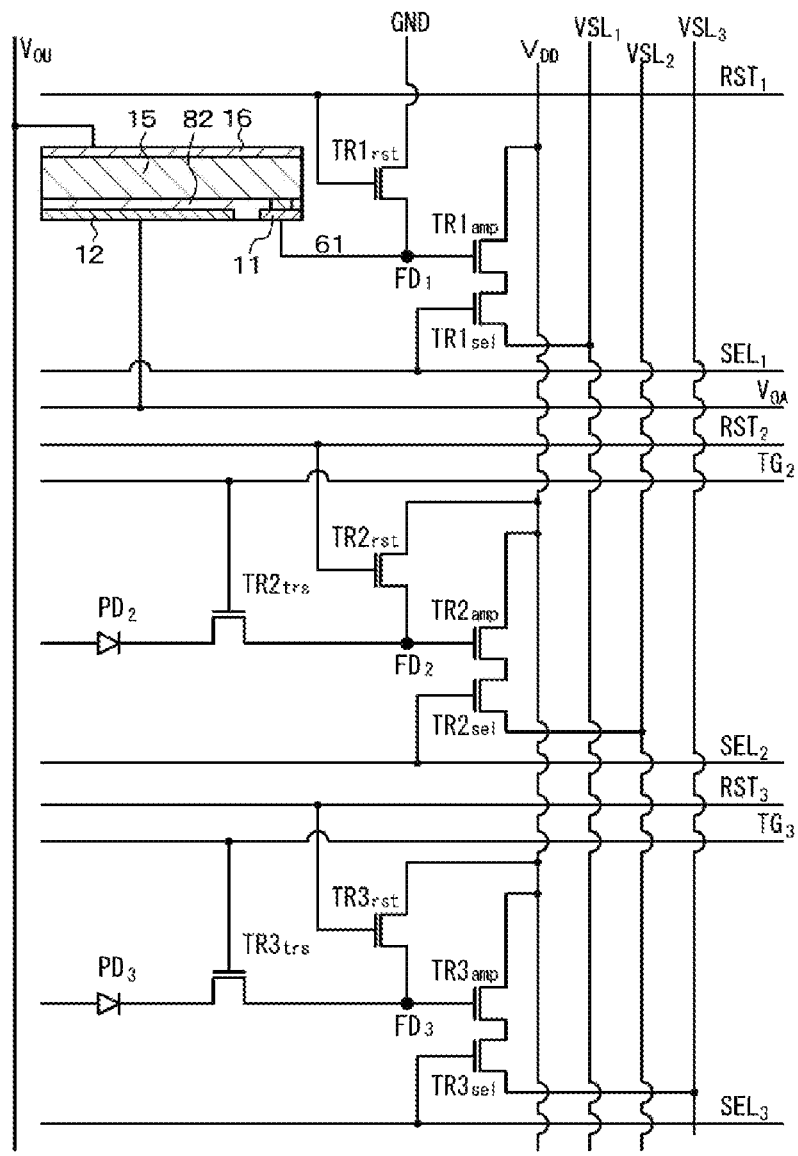
FIG. 9 is an equivalent circuit diagram of a modified example of the imaging element and the stacked-type imaging element of Example 1.
Figure 10:
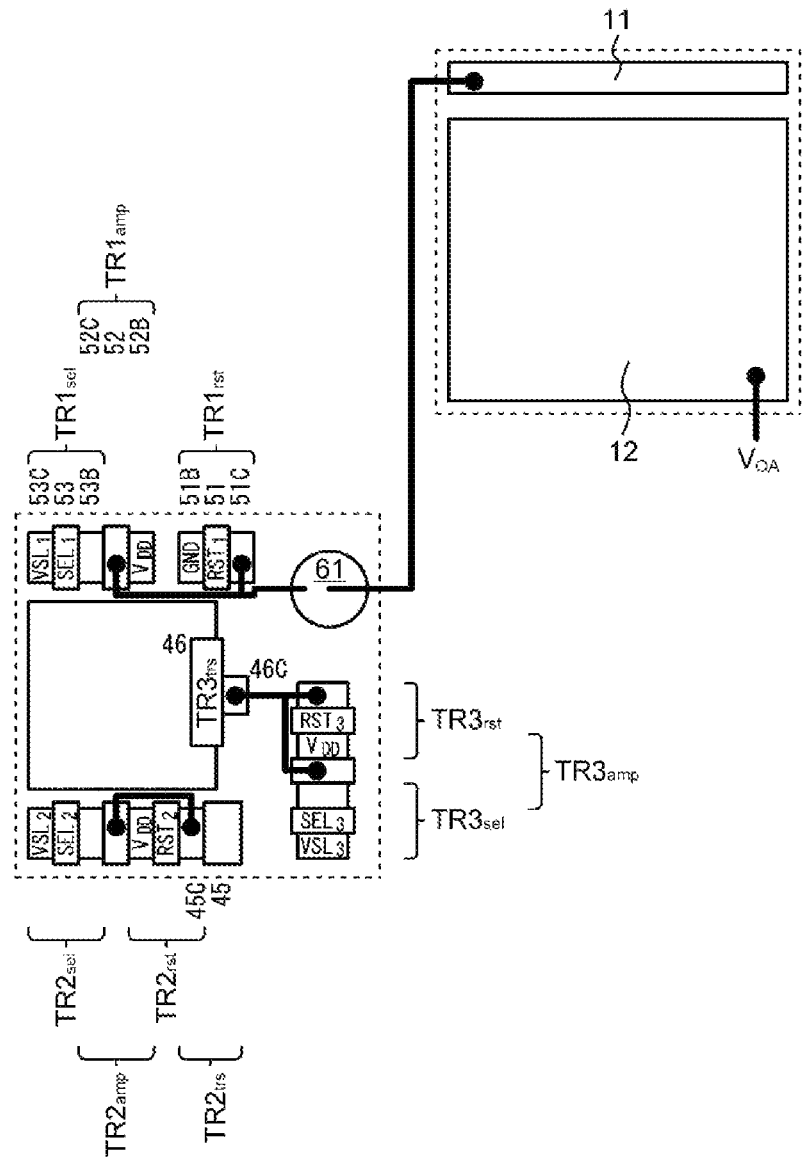
FIG. 10 is a schematic layout view of a first electrode and a charge storage electrode constituting the modified example of the imaging element of Example 1 illustrated in FIG. 9 and transistors constituting a control unit.

An equivalent circuit diagram of a modified example of the imaging element and the stacked-type imaging element of Example 1 is illustrated in FIG. 9. As a schematic layout view of a first electrode and a charge storage electrode constituting a modified example of the imaging element of Example 1 and transistors constituting a control unit is illustrated in FIG. 10, the other source/drain region 51B of the reset transistor $TR1_{rst}$ may be grounded instead of being connected to the power source $V_{DD}$.

The imaging element and the stacked-type imaging element of Example 1 may be manufactured, for example, by the method described hereinafter. Namely, first, an SOI substrate is prepared. Then, a first silicon layer is formed on the surface of the SOI substrate on the basis of an epitaxial growth method, and a p+ layer 73 and an n-type semiconductor region 41 are formed on the first silicon layer. Next, a second silicon layer is formed on the first silicon layer on the basis of an epitaxial growth method, and an element isolation region 71, an oxide film 72, a p+ layer 42, an n-type semiconductor region 43, and a p+ layer 44 are formed on the second silicon layer. In addition, various transistors and the like constituting a control unit of the imaging element are formed in the second silicon layer, and a wire line layer 62, an interlayer insulating layer 76, and various wire lines are formed thereon. The interlayer insulating layer 76 and a support substrate (not shown) are allowed to be adhered to each other. After that, by removing the SOI substrate, the first silicon layer is exposed. Note that the surface of the second silicon layer corresponds to the surface 70A of the semiconductor substrate 70, and the surface of the first silicon layer corresponds to the back surface 70B of the semiconductor substrate 70. In addition, the first silicon layer and the second silicon layer are collectively expressed as the semiconductor substrate 70. Next, in the back surface 70B side of the semiconductor substrate 70, an opening portion for forming a contact hole portion 61 is formed; an $HfO_2$ film 74, an insulating film 75, and the contact hole portion 61 are formed; and pad portions 63 and 64, an interlayer insulating layer 81, connection holes 65 and 66, a first electrode 11, a charge storage electrode 12, and an insulating layer 82 are formed. Next, a connection portion 67 is opened, and a photoelectric conversion layer 15, a second electrode 16, a protective layer 83, and an on-chip microlens 90 are formed. By doing so, the imaging element and the stacked-type imaging element of Example 1 can be obtained.

Example 2

Figure 11:
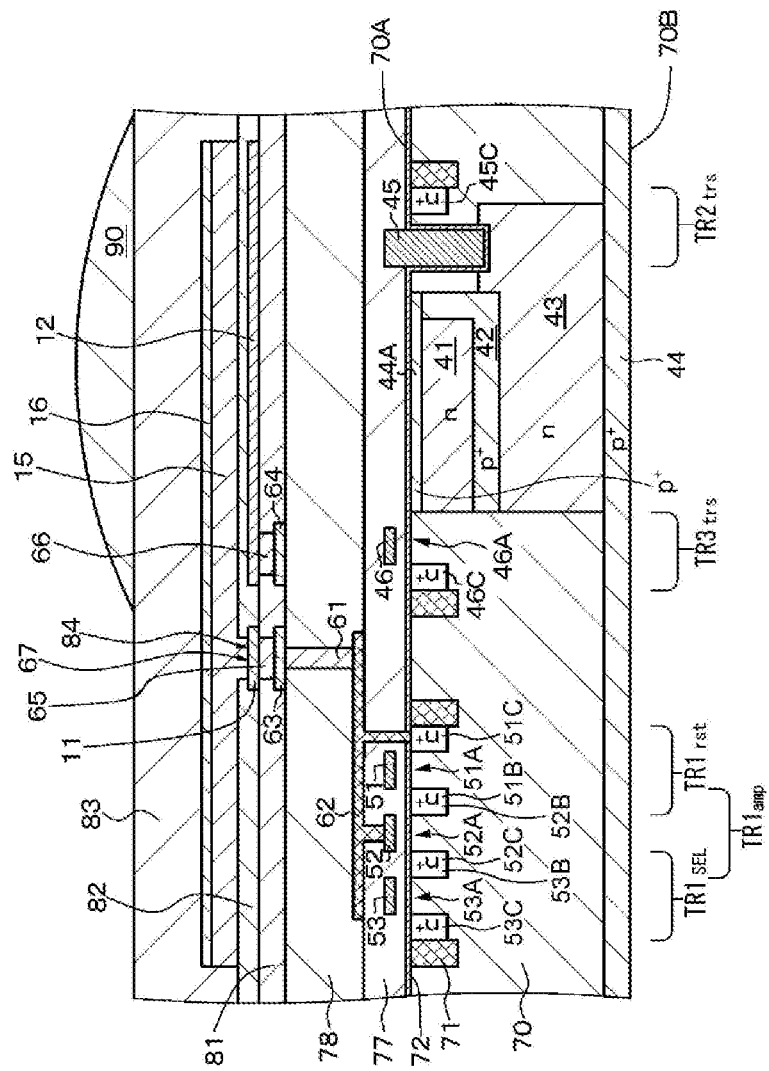
FIG. 11 is a schematic partial cross-sectional view of an imaging element and a stacked-type imaging element of Example 2.

Example 2 is a modification of Example 1. An imaging element and a stacked-type imaging element of Example 2 of which a schematic partial cross-sectional view is illustrated in FIG. 11 are a front-illuminated type imaging element and a front-illuminated type stacked-type imaging element and have a stacked structure of three imaging elements of a first-type green imaging element (first imaging element) of Example 1 being sensitive to green and having a first-type green photoelectric conversion layer absorbing green light, a second-type blue imaging element (second imaging element) of the related art being sensitive to blue and having a second-type blue photoelectric conversion layer absorbing blue light, and a second-type red imaging element (third imaging element) of the related art being sensitive to red and having a second-type red photoelectric conversion layer absorbing red light. Herein, the red imaging element (third imaging element) and the blue imaging element (second imaging element) are provided in the semiconductor substrate 70, and the second imaging element is located to be closer to the light-incident side than the third imaging element. In addition, the green imaging element (first imaging element) is provided above the blue imaging element (second imaging element).

Similarly to Example 1, various transistors constituting the control unit are provided in the surface 70A side of the semiconductor substrate 70. These transistors may be formed with substantially a similar configuration and structure to those of the transistors described in Example 1. In addition, although the second imaging element and the third imaging element are provided in the semiconductor substrate 70, these imaging elements may be formed with substantially a similar configuration and structure to those of the second imaging element and the third imaging element described in Example 1.

Interlayer insulating layers 77 and 78 are formed on the surface 70A of the semiconductor substrate 70, and the photoelectric conversion unit (the first electrode 11, the photoelectric conversion layer 15, and the second electrode 16), the charge storage electrode 12, and the like constituting the imaging element of Example 1 are provided on the interlayer insulating layer 78.

In this manner, except that the imaging element and the stacked-type imaging element are of the front-illuminated type, since the configuration and structure of the imaging element and the stacked-type imaging element of Example 2 can be formed to be similar to the configuration and structure of the imaging element and the stacked-type imaging element of Example 1, the detailed description is omitted.

Example 3

Figure 12:
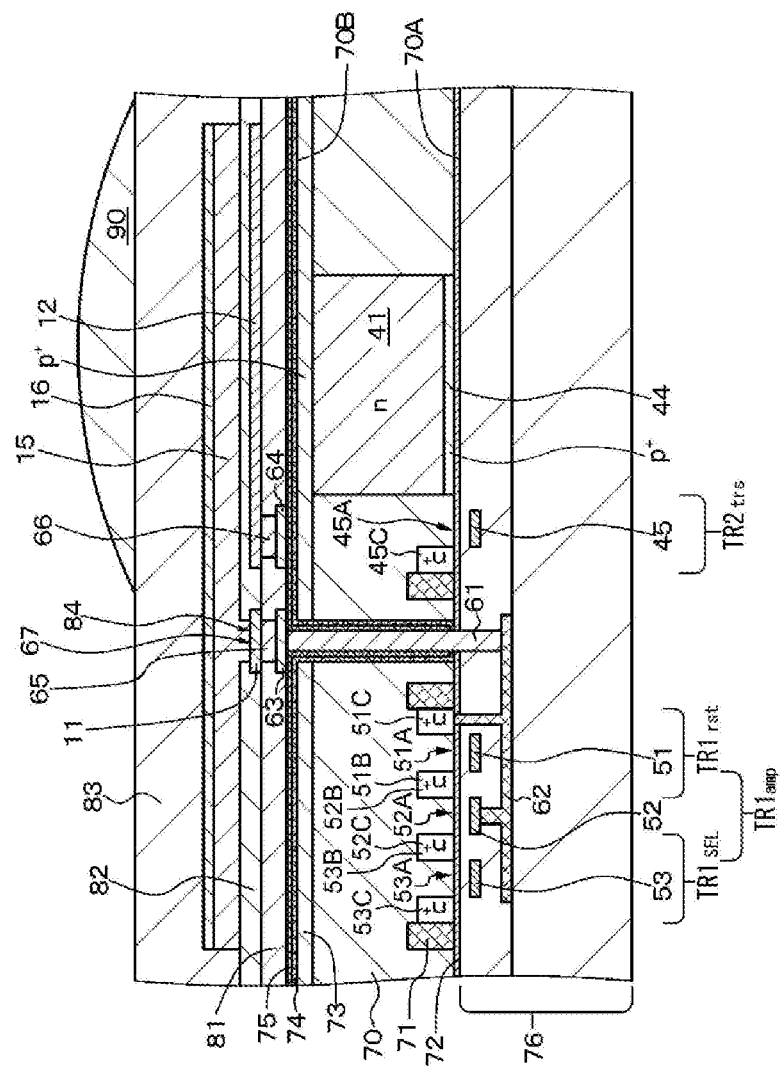
FIG. 12 is a schematic partial cross-sectional view of an imaging element and a stacked-type imaging element of Example 3.
Figure 13:
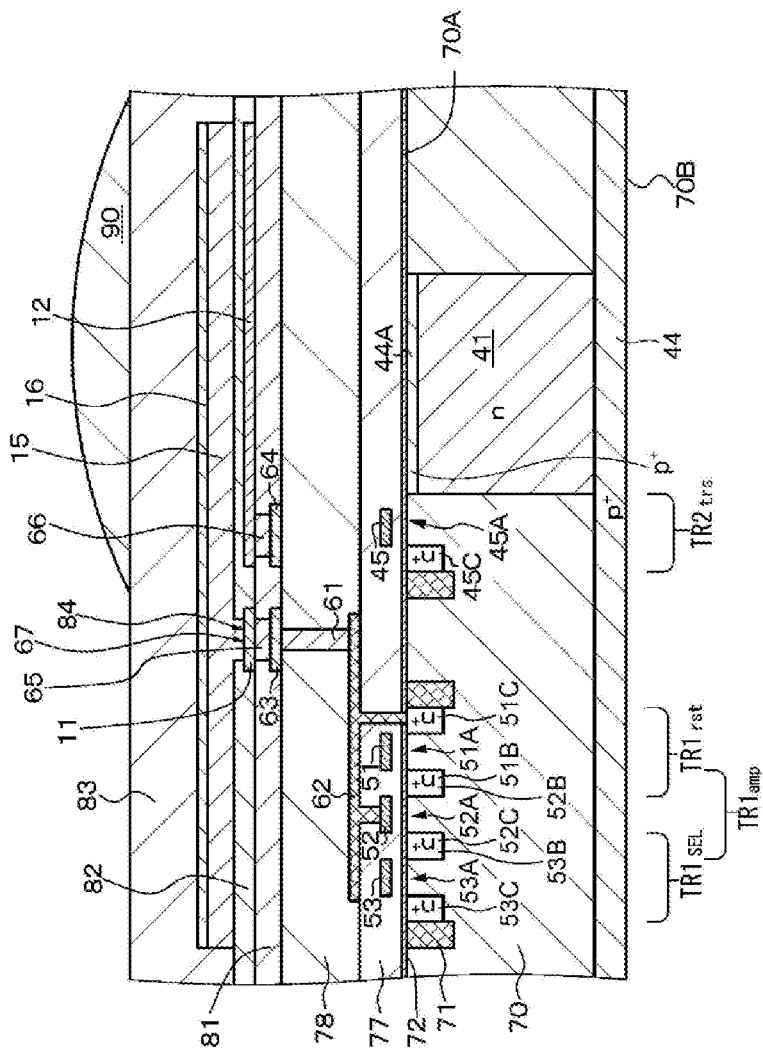
FIG. 13 is a schematic partial cross-sectional view of a modified example of the imaging element and the stacked-type imaging element of Example 3.

Example 3 is a modification of Examples 1 and 2.
An imaging element and a stacked-type imaging element of Example 3 of which a schematic partial cross-sectional view is illustrated in FIG. 12 are a back-illuminated type imaging element and a back-illuminated type stacked-type imaging element and have a stacked structure of two imaging elements of a first-type first imaging element of Example 1 and a second-type second imaging element. In addition, modified examples of the imaging element and the stacked-type imaging element of Example 3 of which a schematic partial cross-sectional view is illustrated in FIG. 13 are a front-illuminated type imaging element and a front-illuminated type stacked-type imaging element and have a stacked structure of two imaging elements of a first-type first imaging element of Example 1 and a second-type second imaging element. Herein, the first imaging element absorbs primary color light, and the second imaging element absorbs complementary color light. Alternatively, the first imaging element absorbs white light, and the second imaging element absorbs an infrared ray.

Figure 14:
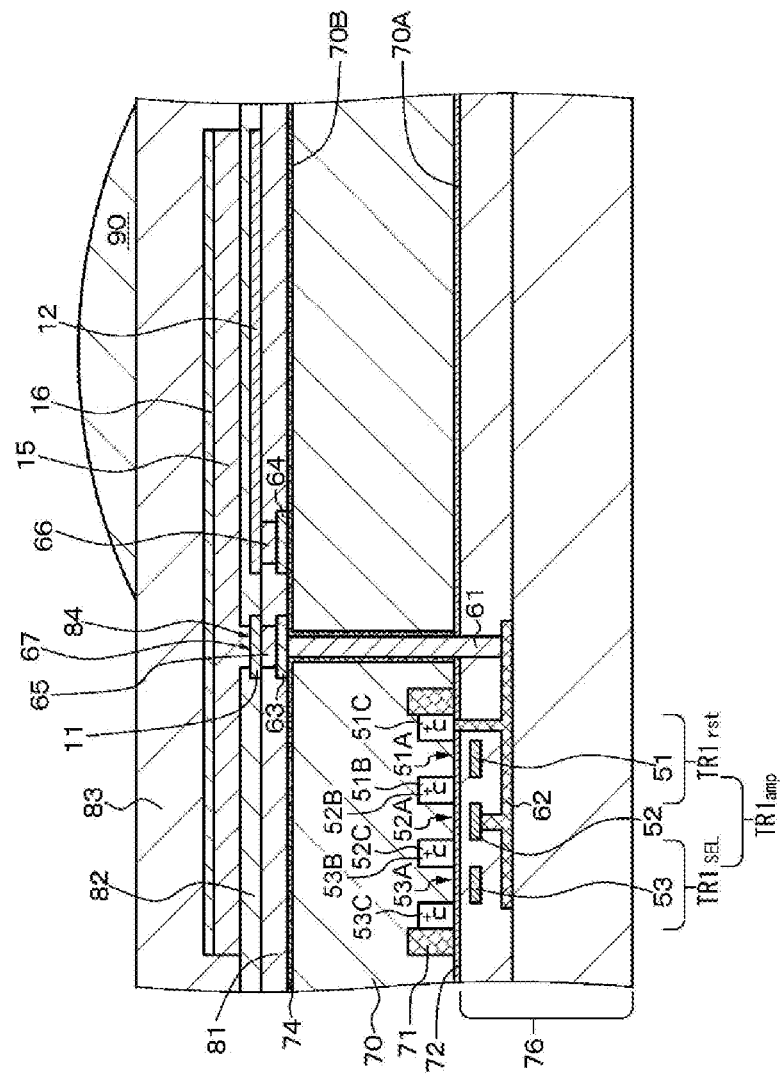
FIG. 14 is a schematic partial cross-sectional view of another modified example of the imaging element of Example 3.
Figure 15A:
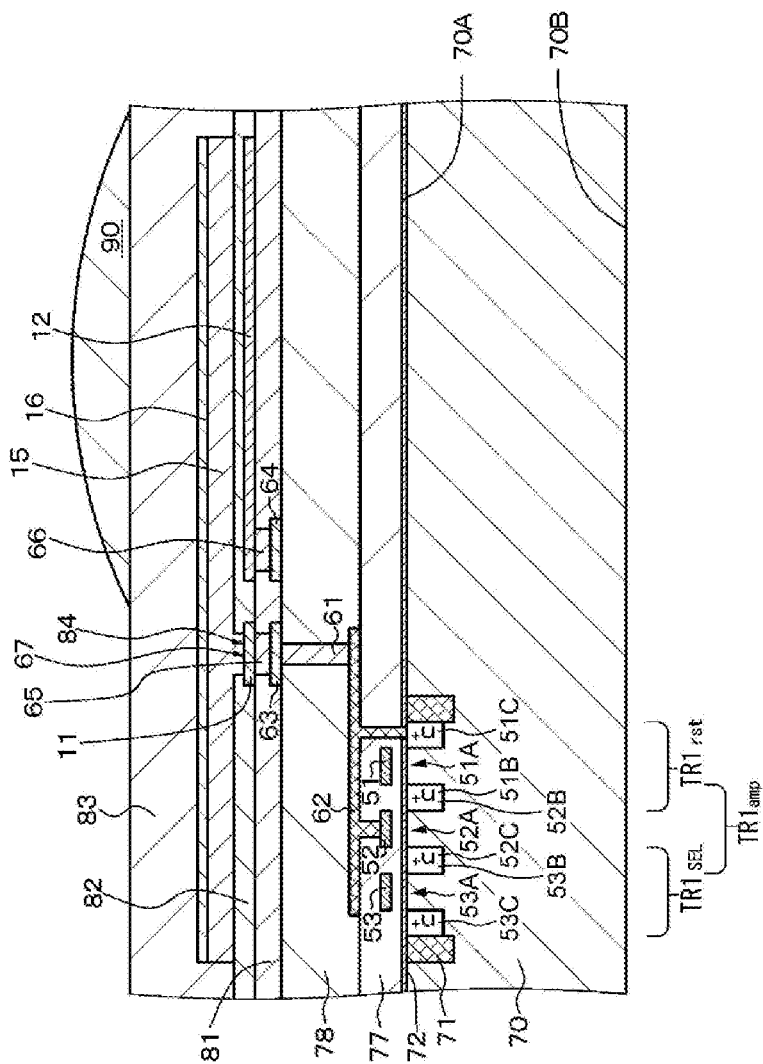
FIG. 15A is a schematic partial cross-sectional view of another modified example of the imaging element of Example 3.
Figure 15B:
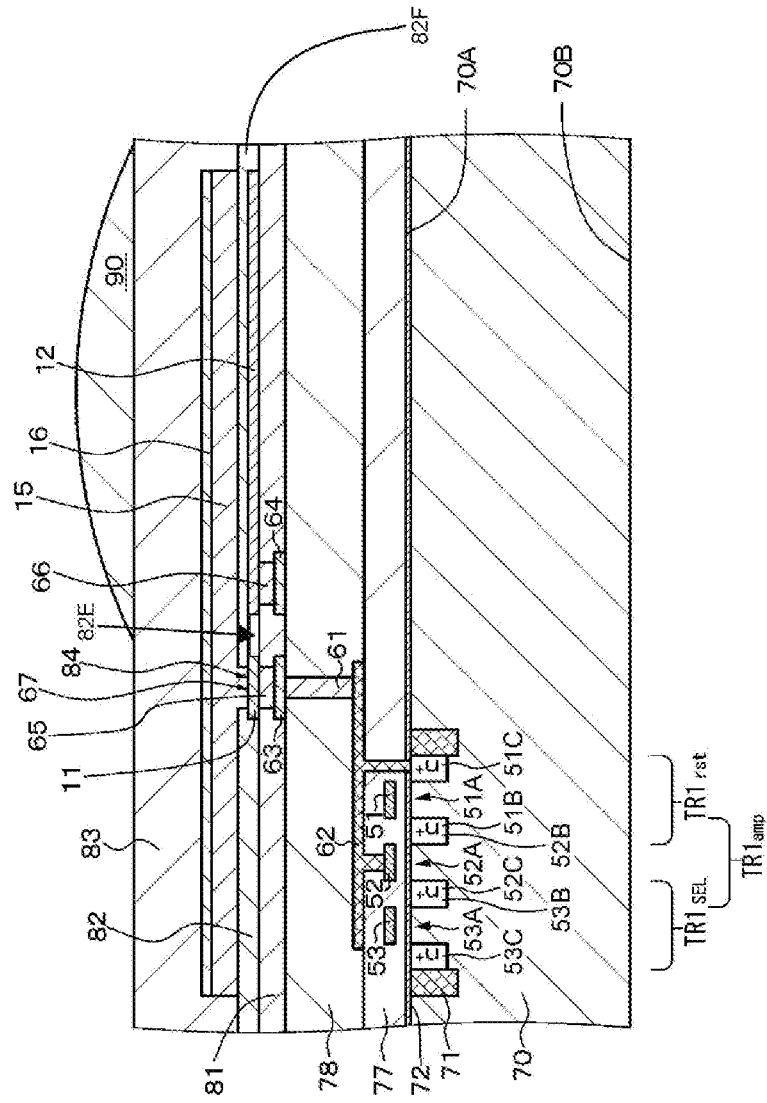
FIG. 15B is a schematic partial cross-sectional view of another modified example of the imaging element of Example 3.
Figure 15D:
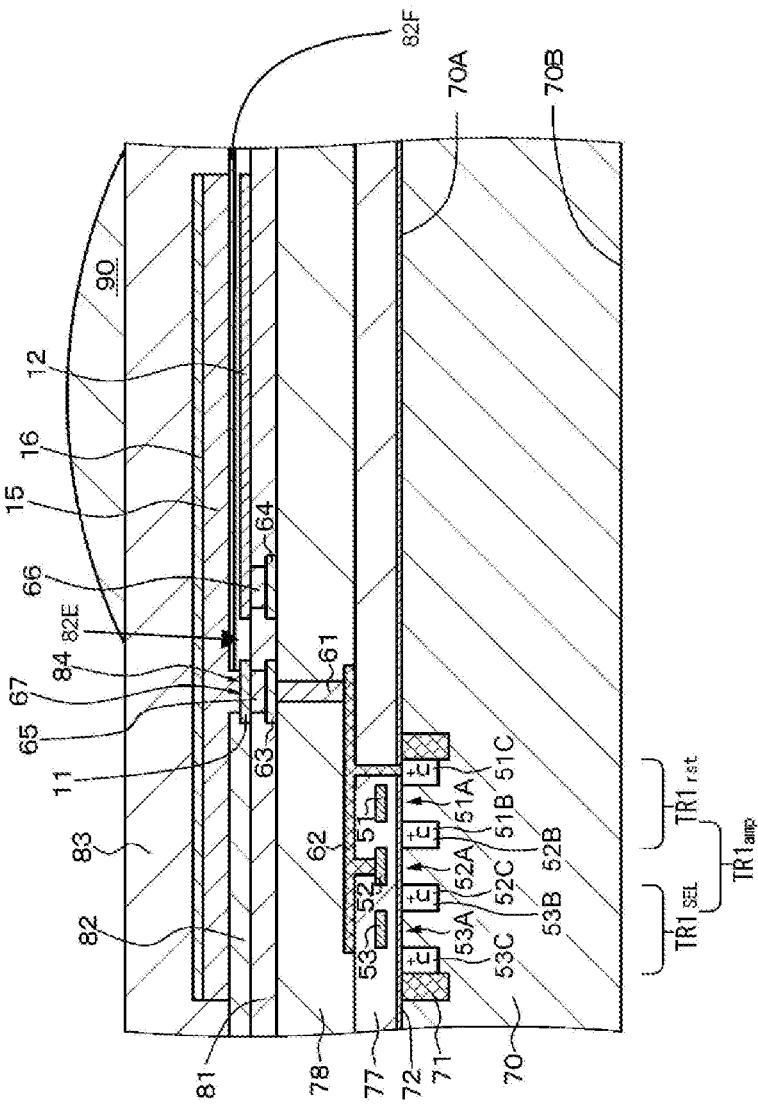
FIG. 15D is a schematic partial cross-sectional view of another modified example of the imaging element of Example 3.

A modified example of the imaging element of Example 3 of which a schematic partial cross-sectional view is illustrated in FIG. 14 is a back-illuminated type imaging element and is configured with a first-type first imaging element of Example 1. Alternatively, a modified example of the imaging element of Example 3 of which a schematic partial cross-sectional view is illustrated in FIG. 15A is a front-illuminated type imaging element and is configured with a first-type first imaging element of Example 1. Herein, the first imaging element is configured with three types of imaging elements of an imaging element absorbing red light and an imaging element absorbing green light, and an imaging element absorbing blue light. Furthermore, the solid-state imaging device according to the first embodiment of the present disclosure is configured with a plurality of the imaging elements. As an array of a plurality of the imaging elements, there may be exemplified a Bayer array. If necessary, color filters for performing spectral separation of blue light, green light, and red light are arranged in the light-incident side of each imaging element. Moreover, and as depicted in FIGS. 15B-D, the insulating layer 82 may include multiple layers. As depicted in FIGS. 15B-D, the insulating layer 82 may include multiple layers 82E and 82F. For example, a first region of the insulating material 82 between the charge storage electrode 12 and the photoelectric conversion layer 15 may exist, and a second region of the insulating material 82 between the charge storage electrode 12 and the first electrode 11 may exist. In some embodiments, the second region of the insulating material includes a first insulating layer 82E including the insulating material and a second insulating layer 82F including the insulating material, and the first insulating material 82F is stacked on the second insulating material 82E. FIGS. 15B-D further depict various configurations with respect to the insulating layer 82 (e.g., the configurations of layers 82E and 82F change).

Note that, instead of preparing one first-type imaging element of Example 1, two imaging elements may be stacked (namely, the two photoelectric conversion units are stacked and the control units for the two imaging elements are prepared in the semiconductor substrate), or three imaging elements may be stacked (namely, the three photoelectric conversion units are stacked and the control units for the three imaging elements are prepared in the semiconductor substrate). Examples of the stacked structures of the first-type imaging element and the second-type imaging element are listed in the following table.

TABLE 1

|  | First type | Second type | Reference figure |
|---|---|---|---|
| Back-illuminated type and front-illuminated type | 1 Green | 2 Blue + Red | FIG. 1A-D |
|  | 1 Primary color | 1 Complementary color | FIG. 11 |
|  | 1 White | 1 Infrared ray | FIG. 12 |
|  | 1 Blue or Green or Red | 0 | FIG. 13 |
|  | 2 | 2 | FIG. 14 |
|  | Green + Infrared light | Blue + Red | FIG. 15A-D |
|  | 2 Green + Blue | 1 Red |  |
|  | 2 White + Infrared light | 0 |  |
|  | 3 Green + Blue + Red | 2 Bluish green (Emerald Color) + Infrared light |  |
|  | 3 Green + Blue + Red | 1 Infrared light |  |
|  | 3 Blue + Green + Red | 0 |  |

Example 4

Figure 16:
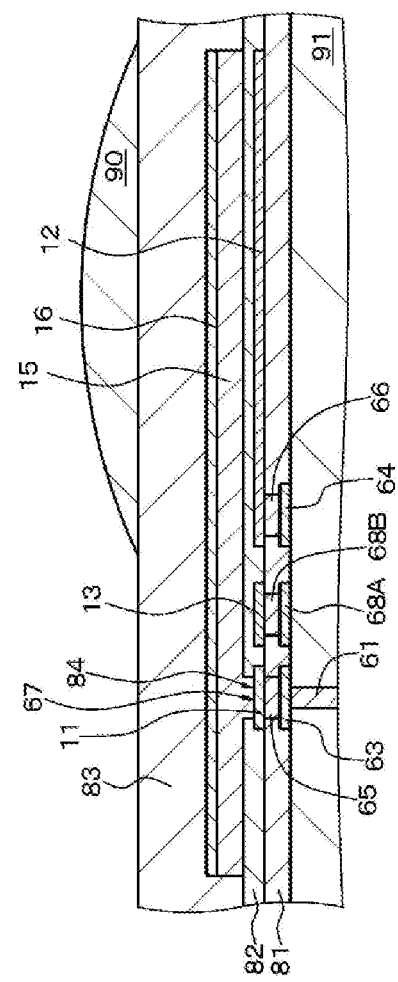
FIG. 16 is a schematic partial cross-sectional view of a portion of an imaging element and a stacked-type imaging element of Example 4.
Figure 17:
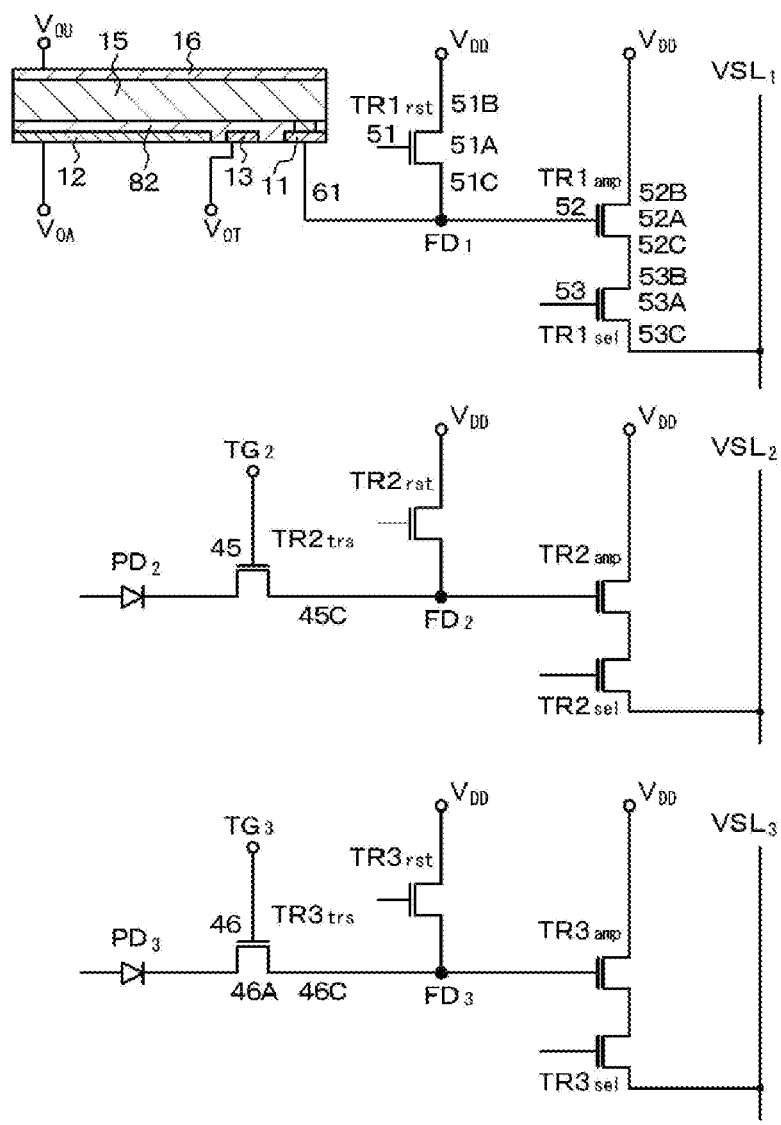
FIG. 17 is an equivalent circuit diagram of the imaging element and the stacked-type imaging element of Example 4.
Figure 18:
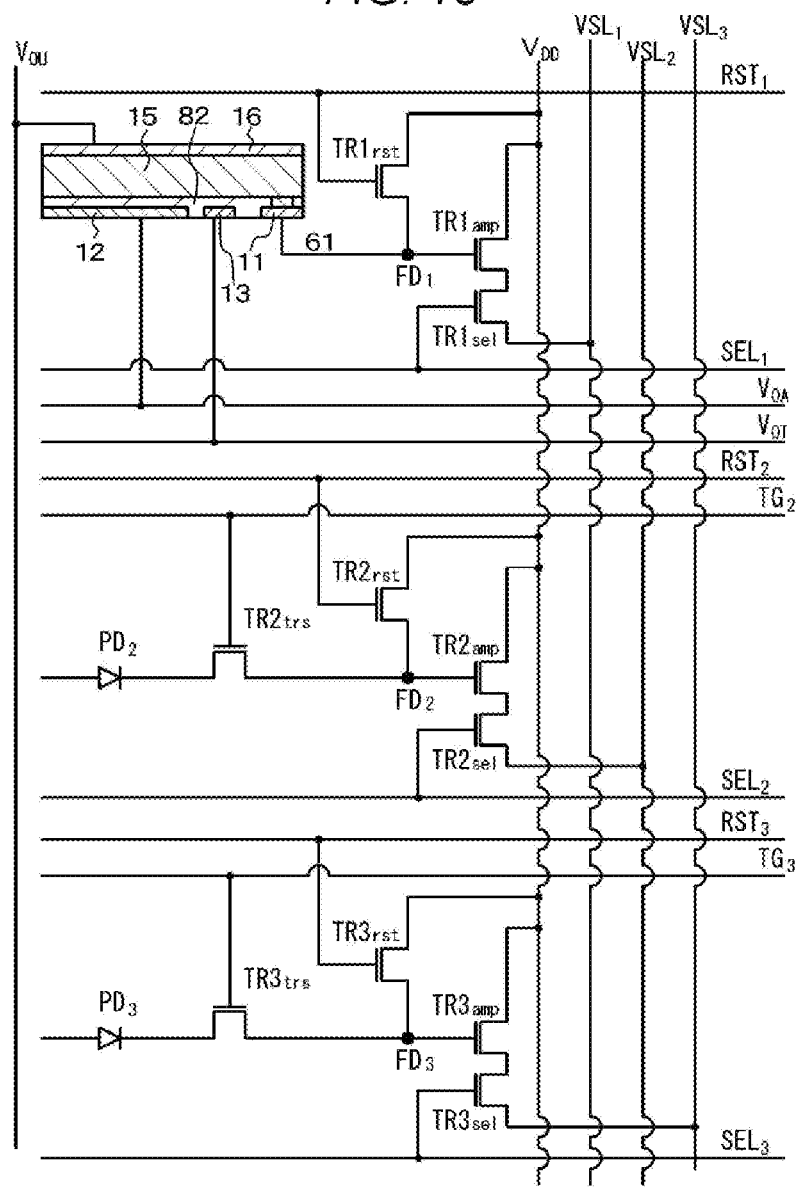
FIG. 18 is an equivalent circuit diagram of the imaging element and the stacked-type imaging element of Example 4.
Figure 19:
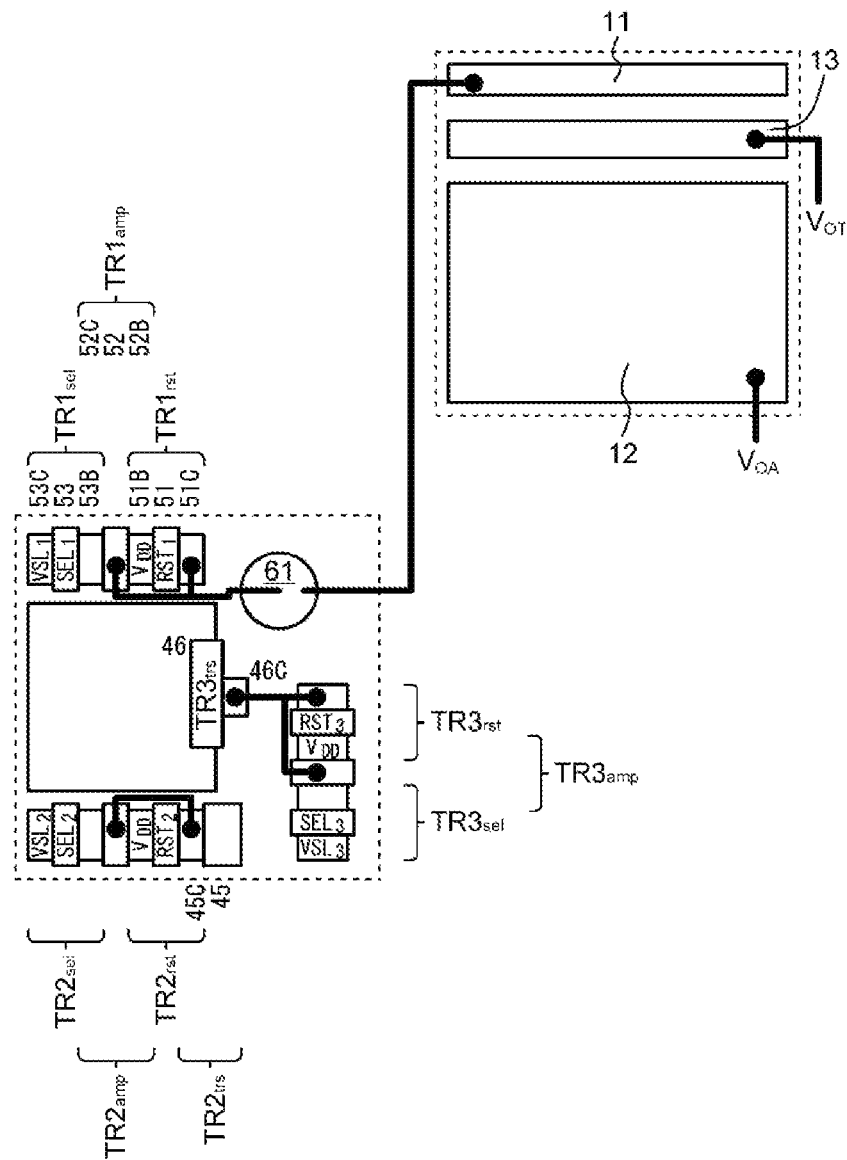
FIG. 19 is a schematic layout view of a first electrode, a transfer control electrode, and a charge storage electrode constituting the imaging element of Example 4 and transistors constituting a control unit.
Figure 22:
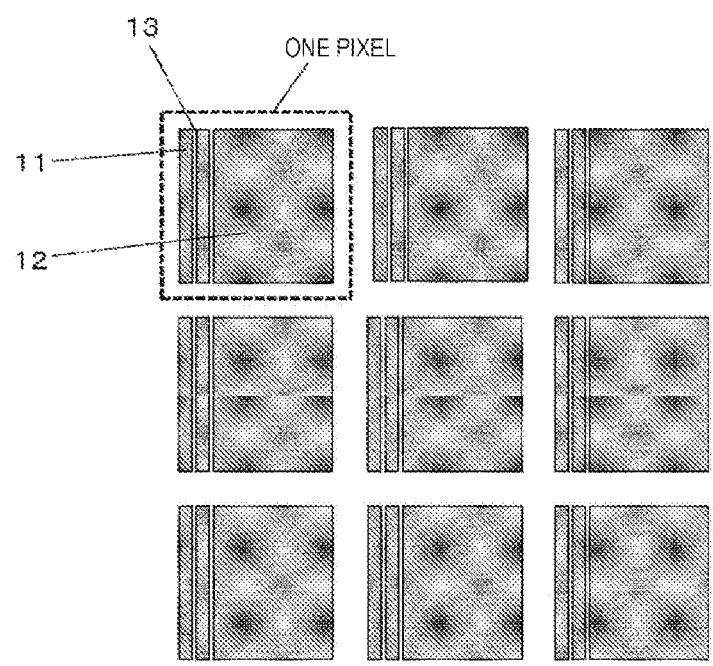
FIG. 22 is a schematic layout view of the first electrode, the transfer control electrode, and the charge storage electrode constituting the imaging element of Example 4.
Figure 23:
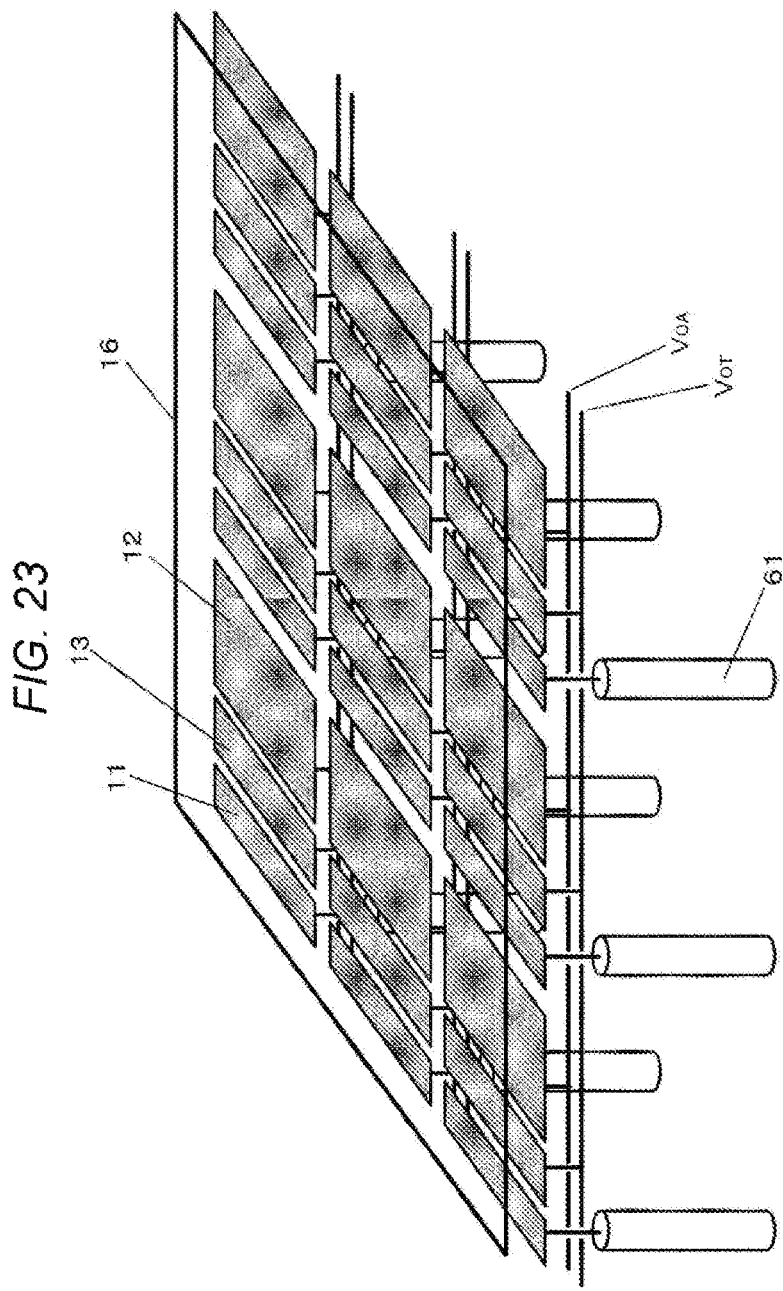
FIG. 23 is a schematic perspective view of the first electrode, the transfer control electrode, the charge storage electrode, and a second electrode, and a contact hole portion constituting the imaging element of Example 4.

Example 4 is a modification of Examples 1 to 3 and relates to an imaging element or the like according to an embodiment of the present disclosure having transfer control electrode (charge transfer electrode). A schematic partial cross-sectional view of a portion of the imaging element and the stacked-type imaging element of Example 4 is illustrated in FIG. 16. Equivalent circuit diagrams of the imaging element and the stacked-type imaging element of Example 4 are illustrated in FIGS. 17 and 18. A schematic layout view of a first electrode, a transfer control electrode, and a charge storage electrode constituting the imaging element of Example 4 and transistors constituting a control unit is illustrated in FIG. 19. Potential states of components in an operation period of the imaging element of Example 4 are illustrated in FIGS. 20 and 21. In addition, a schematic layout view of the first electrode, the transfer control electrode, and the charge storage electrode constituting the imaging element of Example 4 is illustrated in FIG. 22. A schematic perspective view of the first electrode, the transfer control electrode, the charge storage electrode, a second electrode, and a contact hole portion constituting the imaging element of Example 4 is illustrated in FIG. 23.

The imaging element and the stacked-type imaging element of Example 4 are configured to further include a transfer control electrode (charge transfer electrode) 13 which is arranged between the first electrode 11 and the charge storage electrode 12 to be separated from the first electrode 11 and the charge storage electrode 12 and is arranged to face the photoelectric conversion layer 15 through the insulating layer 82. The transfer control electrode 13 is connected to the pixel driving circuit constituting the driving circuit through a connection hole 68B, a pad portion 68A, and a wire line $V_{OT}$ provided in the interlayer insulating layer 81. Note that, various components of the imaging element located below the interlayer insulating layer 81 are collectively denoted by reference numeral 91 for the convenience in order to simplify the drawings.

Hereinafter, operations of the imaging element (first imaging element) of Example 4 will be described with reference to FIGS. 20 and 21. Note that FIG. 20 and FIG. 21 are different from each other, particularly, in terms of the potential applied to the charge storage electrode 12 and the potential of the point PB.

In the charge storage period, from the driving circuit, a potential $V_{11}$ is applied to the first electrode 11, a potential $V_{12}$ is applied to the charge storage electrode 12, and a potential $V_{13}$ is applied to the transfer control electrode 13. By the light incident on the photoelectric conversion layer 15, photoelectric conversion occurs in the photoelectric conversion layer 15. The holes generated through the photoelectric conversion are transferred from the second electrode 16 through the wire line $V_{OU}$ to the driving circuit. On the other hand, since the potential of the potential of the first electrode 11 is set to be higher than the potential of the second electrode 16, namely, for example, since a positive potential is applied to the first electrode 11 and a negative potential is applied to the second electrode 16, it is set that $V_{12} > V_{13}$ (for example, $V_{12} > V_{11} > V_{13}$, or $V_{11} > V_{12} > V_{13}$). Therefore, the electrons generated through the photoelectric conversion are attracted by the charge storage electrode 12, and thus, the electrons are stopped in the region of the photoelectric conversion layer 15 facing the charge storage electrode 12. Namely, the charges are stored in the photoelectric conversion layer 15. Since $V_{12} > V_{13}$, it is possible to reliably prevent the electrons generated in the photoelectric conversion layer 15 from moving toward the first electrode 11. As the time of the photoelectric conversion elapses, the potential of the region of the photoelectric conversion layer 15 facing the charge storage electrode 12 becomes a further negative value.

In the last stage of the charge storage period, a reset operation is performed. Therefore, the potential of the first floating diffusion layer $FD_1$ is reset, and the potential of the first floating diffusion layer $FD_1$ becomes the potential $V_{DD}$ of the power source.

After the completion of the reset operation, charge readout is performed. Namely, in the charge transfer period, from the driving circuit, a potential $V_{21}$ is applied to the first electrode 11, a potential $V_{22}$ is applied to the charge storage electrode 12, and a potential $V_{23}$ is applied to the transfer control electrode 13. Herein, it is set that $V_{22} \leq V_{23} \leq V_{21}$. By doing so, the electrons, which have stopped in the region of the photoelectric conversion layer 15 facing the charge storage electrode 12, are reliably read out to the first electrode 11, and furthermore, to the first floating diffusion layer $FD_1$. Namely, the charges stored in the photoelectric conversion layer 15 are read out to the control unit.

In this manner described heretofore, a series of the operations of the charge storage, the reset operation, and the charge transfer is completed.

The operations of the amplification transistor $TR1_{amp}$ and the selection transistor $TR1_{sel}$ after the read-out of the electrons to the first floating diffusion layer $FD_1$ are the same as the operations of such transistors in the related art. In addition, a series of operations of the charge storage, the reset operation, and the charge transfer of, for example, the second imaging element and third imaging element is similar to a series of operations of the charge storage, the reset operation, and the charge transfer in the related art.

Figure 24:
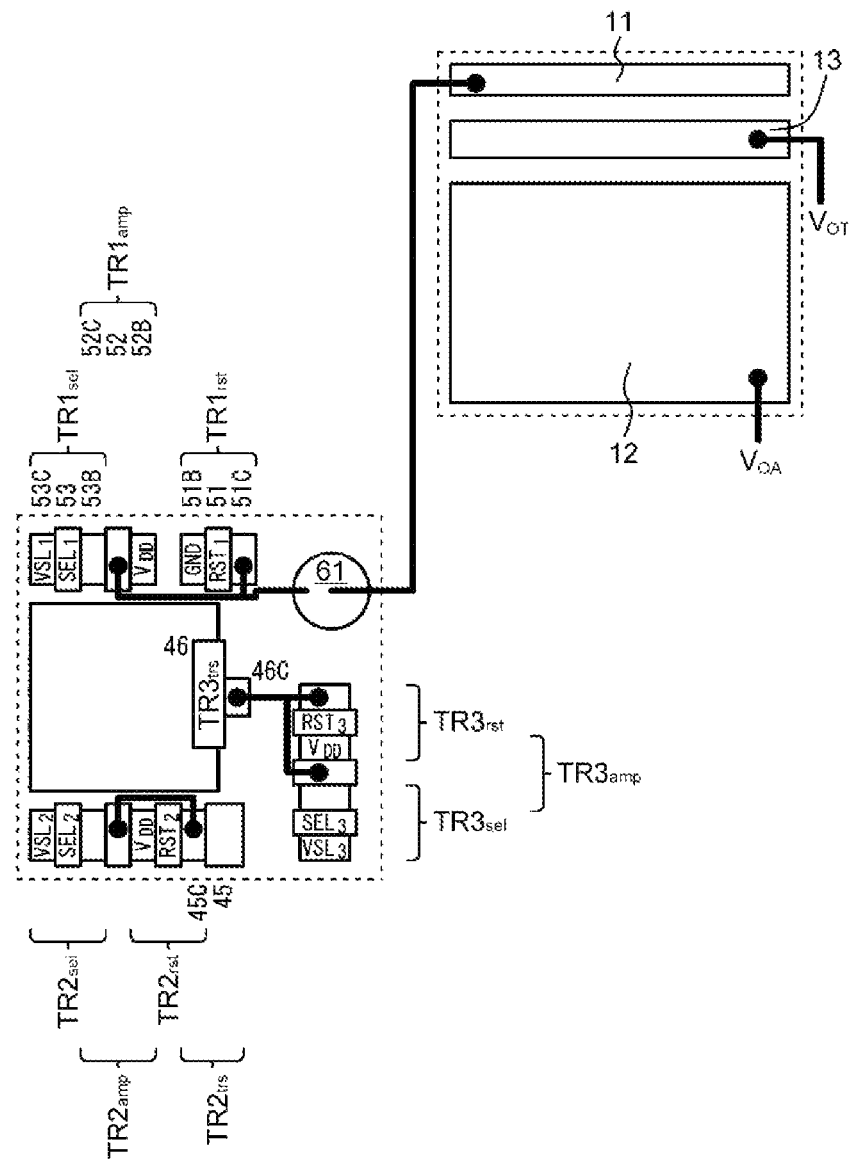
FIG. 24 is a schematic layout view of a first electrode, a transfer control electrode, and a charge storage electrode constituting a modified example of the imaging element of Example 4 and transistors constituting a control unit.

As a schematic layout view of the first electrode and the charge storage electrode constituting a modified example of the imaging element of Example 4 and transistors constituting a control unit is illustrated in FIG. 24, the other source/drain region 51B of the reset transistor $TR1_{rst}$ may be grounded instead of being connected to the power source $V_{DD}$.

Example 5

Figure 25:
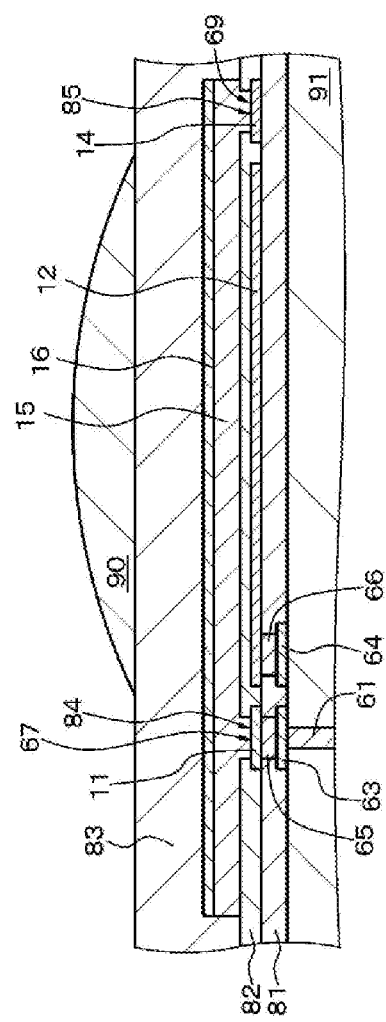
FIG. 25 is a schematic partial cross-sectional view of a portion of an imaging element and a stacked-type imaging element of Example 5.
Figure 26:
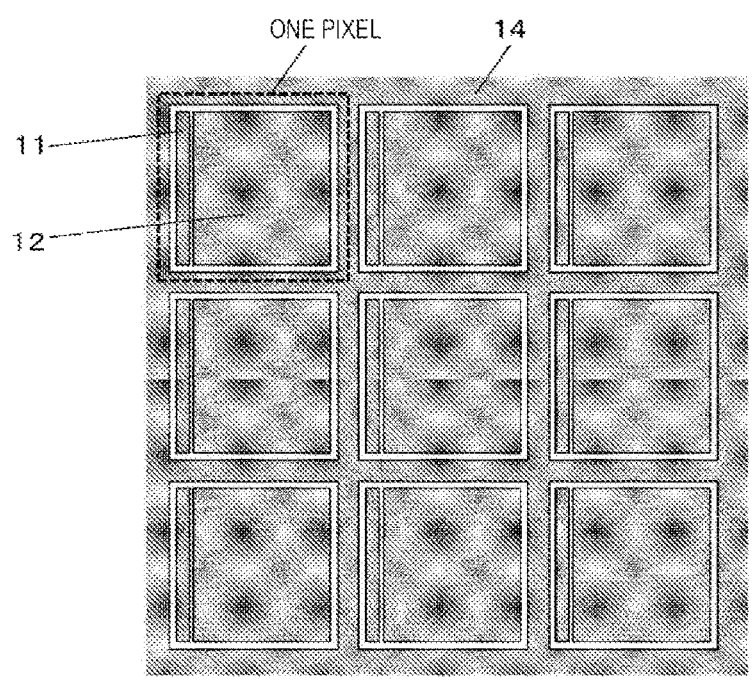
FIG. 26 is a schematic layout view of a first electrode, a charge storage electrode, and a charge ejection electrode constituting the imaging element of Example 5.
Figure 27:
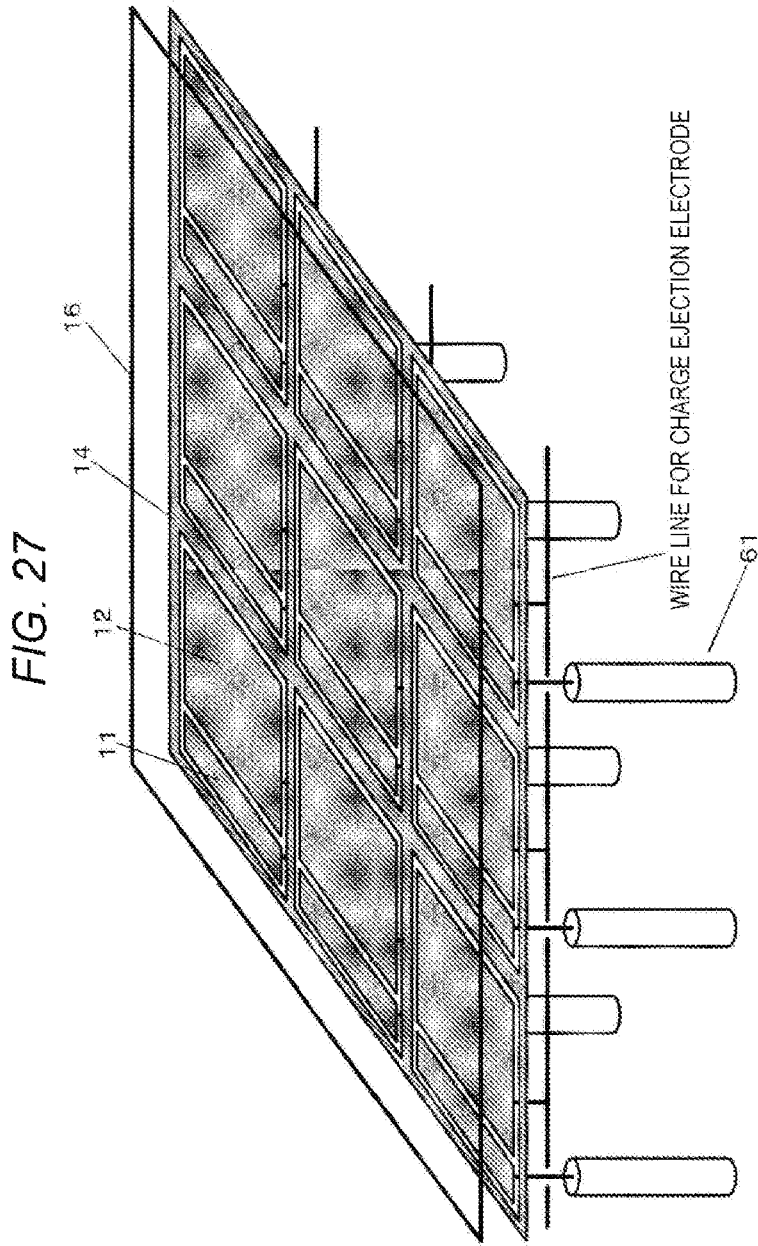
FIG. 27 is a schematic perspective view of the first electrode, the charge storage electrode, the charge ejection electrode, a second electrode, and a contact hole portion constituting the imaging element of Example 5.

Example 5 is a modification of Examples 1 to 4 relates to an imaging element or the like according to an embodiment of the present disclosure having a charge ejection electrode. A schematic partial cross-sectional view of a portion of the imaging element and the stacked-type imaging element of Example 5 is illustrated in FIG. 25. A schematic layout view of a first electrode, a charge storage electrode, and a charge ejection electrode constituting the imaging element of Example 5 is illustrated in FIG. 26. A schematic perspective view of the first electrode, the charge storage electrode, the charge ejection electrode, a second electrode, and a contact hole portion constituting the imaging element of Example 5 is illustrated in FIG. 27.

In the imaging element and the stacked-type imaging element of Example 5, the imaging element is configured to further include a charge ejection electrode 14, which is connected through a connection portion 69 to a photoelectric conversion layer 15 and is arranged to be separated from the first electrode 11 and the charge storage electrode 12. The charge ejection electrode 14 is arranged to surround the first electrode 11 and the charge storage electrode 12 (namely, in a frame shape). The charge ejection electrode 14 is connected to the pixel driving circuit constituting the driving circuit. The photoelectric conversion layer 15 extends in the connection portion 69. Namely, the photoelectric conversion layer 15 extends in the second opening portion 85 provided in the insulating layer 82 to be connected to the charge ejection electrode 14. The charge ejection electrode 14 is shared (commonly used) by a plurality of the imaging elements.

In Example 5, in the charge storage period, from the driving circuit, a potential $V_{11}$ is applied to the first electrode 11, a potential $V_{12}$ is applied to the charge storage electrode 12, and a potential $V_{14}$ is applied to the charge ejection electrode 14, so that the charges are stored in the photoelectric conversion layer 15. By the light incident on the photoelectric conversion layer 15, photoelectric conversion occurs in the photoelectric conversion layer 15. The holes generated through the photoelectric conversion are transferred from the second electrode 16 through the wire line $V_{OU}$ to the driving circuit. On the other hand, since the potential of the potential of the first electrode 11 is set to be higher than the potential of the second electrode 16, namely, for example, since a positive potential is applied to the first electrode 11 and a negative potential is applied to the second electrode 16, it is set that $V_{14} > V_{11}$ (for example, $V_{12} > V_{14} > V_{11}$). Therefore, the electrons generated through the photoelectric conversion are attracted by the charge storage electrode 12, and thus, the electrons are stopped in the region of the photoelectric conversion layer 15 facing the charge storage electrode 12, so that it is possible to reliably prevent the electrons from moving toward the first electrode 11. However, the electrons (so-called overflowed electrons), which are not sufficiently attracted by the charge storage electrode 12 or not stored in the photoelectric conversion layer 15, are transferred through the charge ejection electrode 14 to the driving circuit.

In the last stage of the charge storage period, a reset operation is performed. Therefore, the potential of the first floating diffusion layer $FD_1$ is reset, and the potential of the first floating diffusion layer $FD_1$ becomes the potential $V_{DD}$ of the power source.

After the completion of the reset operation, charge read-out is performed. Namely, in the charge transfer period, from the driving circuit, a potential $V_{21}$ is applied to the first electrode 11, a potential $V_{22}$ is applied to the charge storage electrode 12, and a potential $V_{24}$ is applied to the charge ejection electrode 14. Herein, it is set that $V_{24} < V_{21}$ (for example, $V_{24} < V_{22} < V_{21}$). By doing so, the electrons, which have stopped in the region of the photoelectric conversion layer 15 facing the charge storage electrode 12, are reliably read out to the first electrode 11, and furthermore, to the first floating diffusion layer $FD_1$. Namely, the charges stored in the photoelectric conversion layer 15 are read out to the control unit.

In this manner described heretofore, a series of the operations of the charge storage, the reset operation, and the charge transfer is completed.

The operations of the amplification transistor $TR1_{amp}$ and the selection transistor $TR1_{sel}$ after the read-out of the electrons to the first floating diffusion layer $FD_1$ are the same as the operations of such transistors in the related art. In addition, a series of operations of the charge storage, the reset operation, and the charge transfer of, for example, the second imaging element and third imaging element is similar to a series of operations of the charge storage, the reset operation, and the charge transfer in the related art.

In Example 5, since the overflowed electrons are transferred to the driving circuit through the charge ejection electrode 14, leakage out to the charge storage units of the adjacent pixels can be suppressed, so that it is possible to suppress the occurrence of blooming. Furthermore, therefore, it is possible to improve imaging performance of the imaging element.

Example 6

Example 6 is a modification of Examples 1 to 5 and relates to an imaging element or the like according to an embodiment of the present disclosure having a plurality of charge storage electrode segments.

Figure 28:
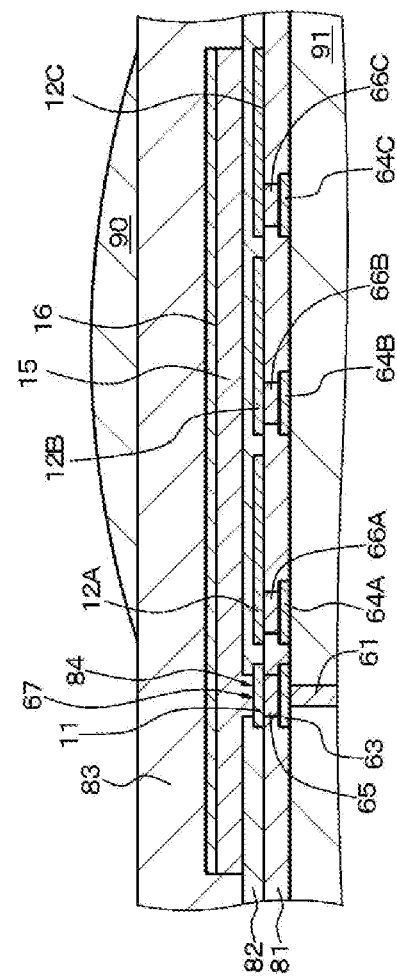
FIG. 28 is a schematic partial cross-sectional view of a portion of an imaging element and a stacked-type imaging element of Example 6.
Figure 29:
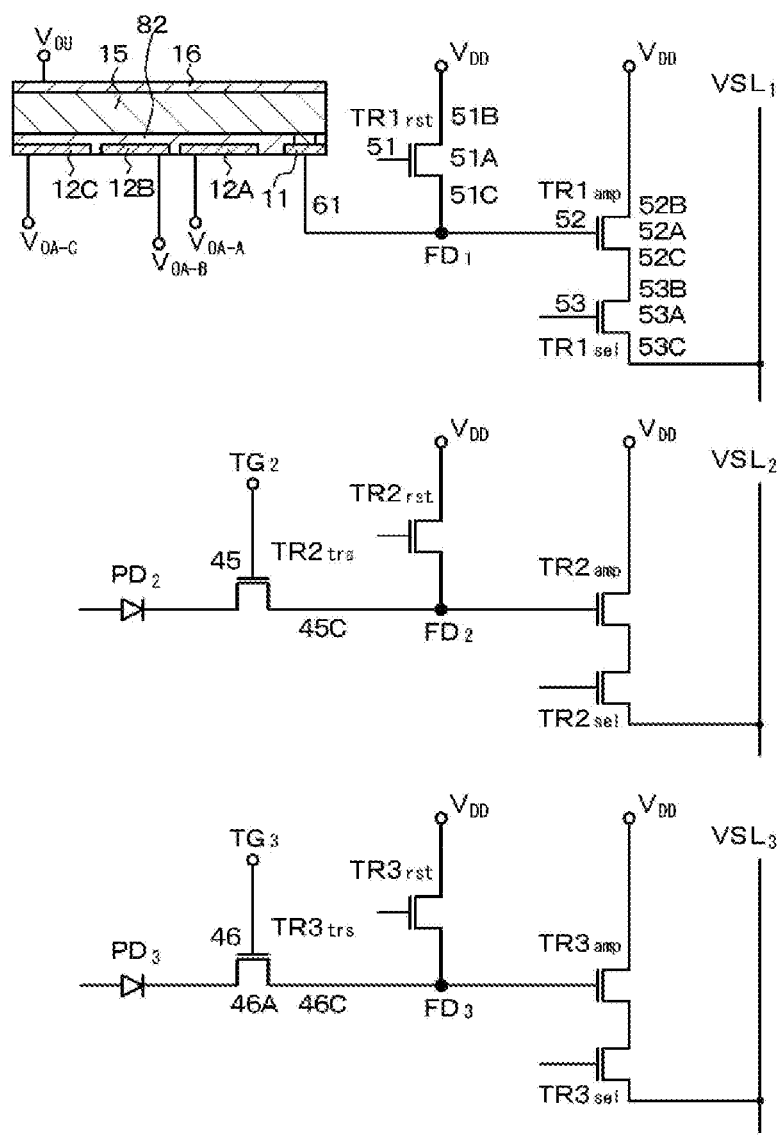
FIG. 29 is an equivalent circuit diagram of the imaging element and the stacked-type imaging element of Example 6.
Figure 30:
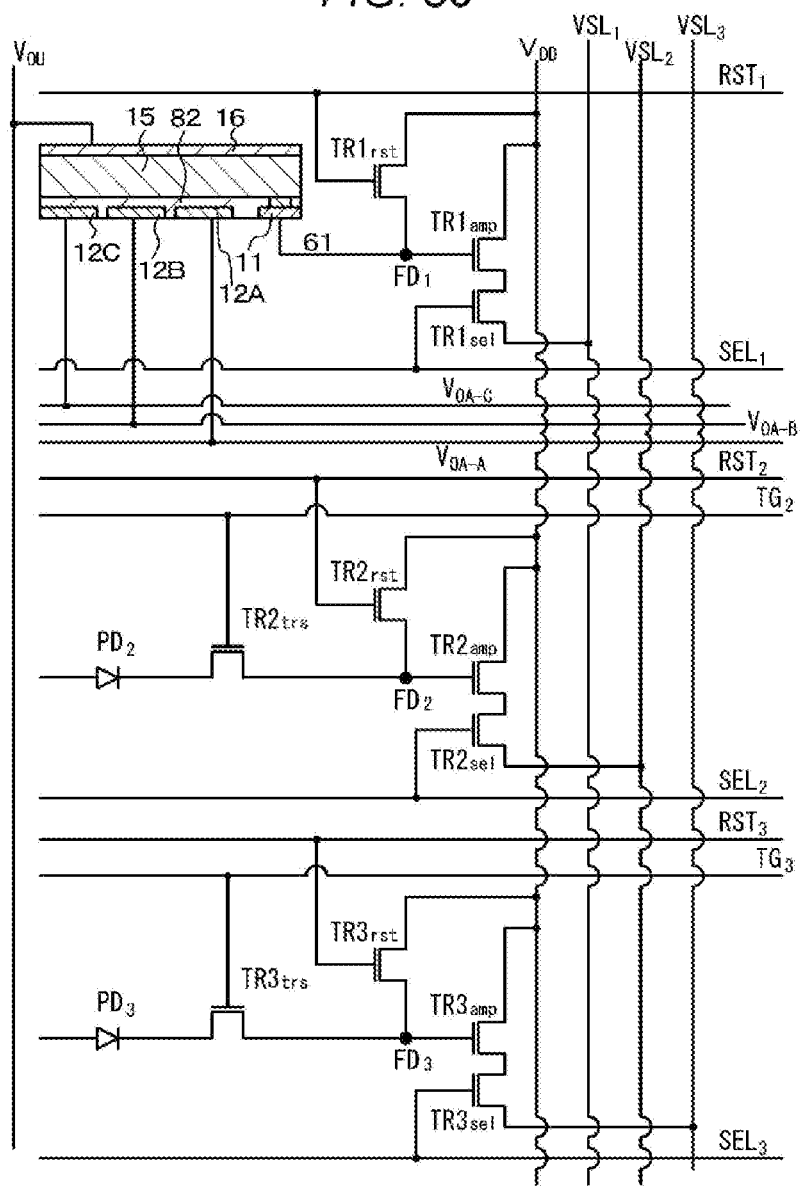
FIG. 30 is an equivalent circuit diagram of the imaging element and the stacked-type imaging element of Example 6.
Figure 31:
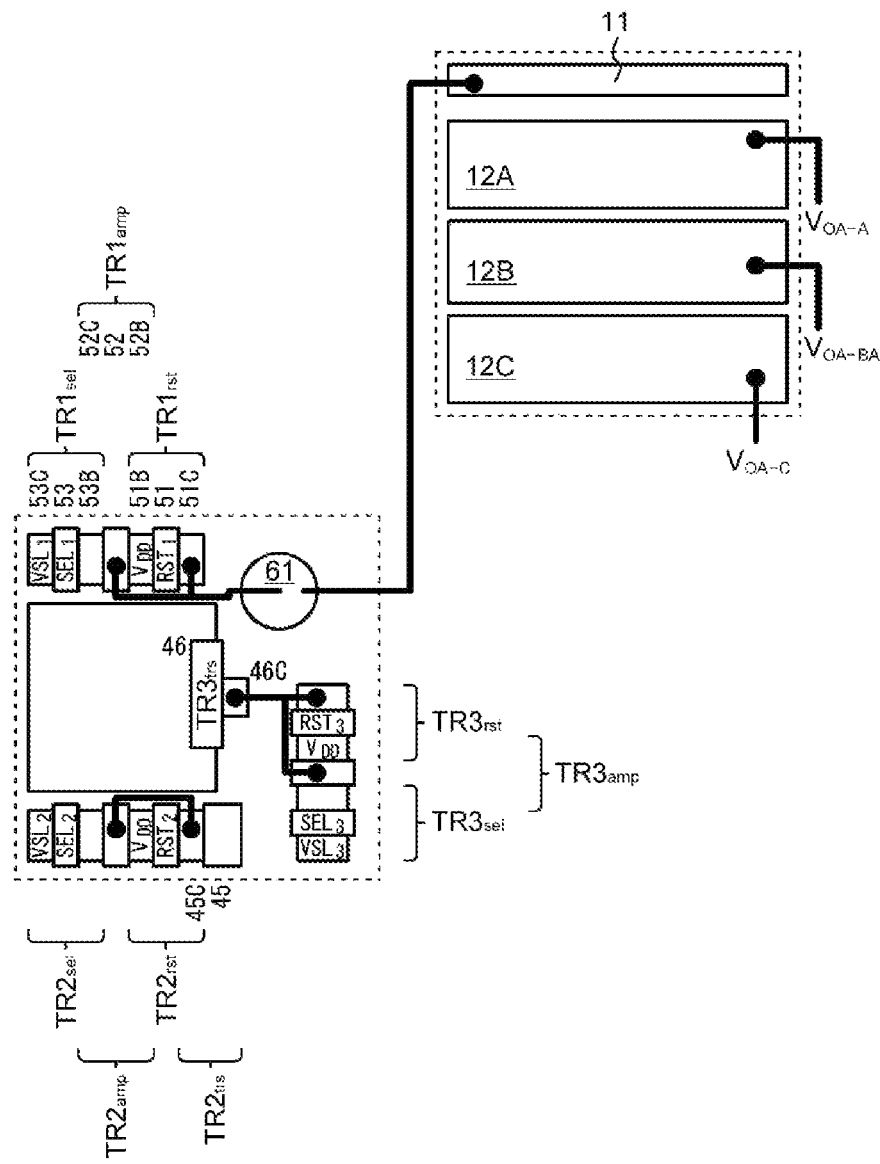
FIG. 31 is a schematic layout view of a first electrode and a charge storage electrode constituting the imaging element of Example 6 and transistors constituting a control unit.
Figure 33:
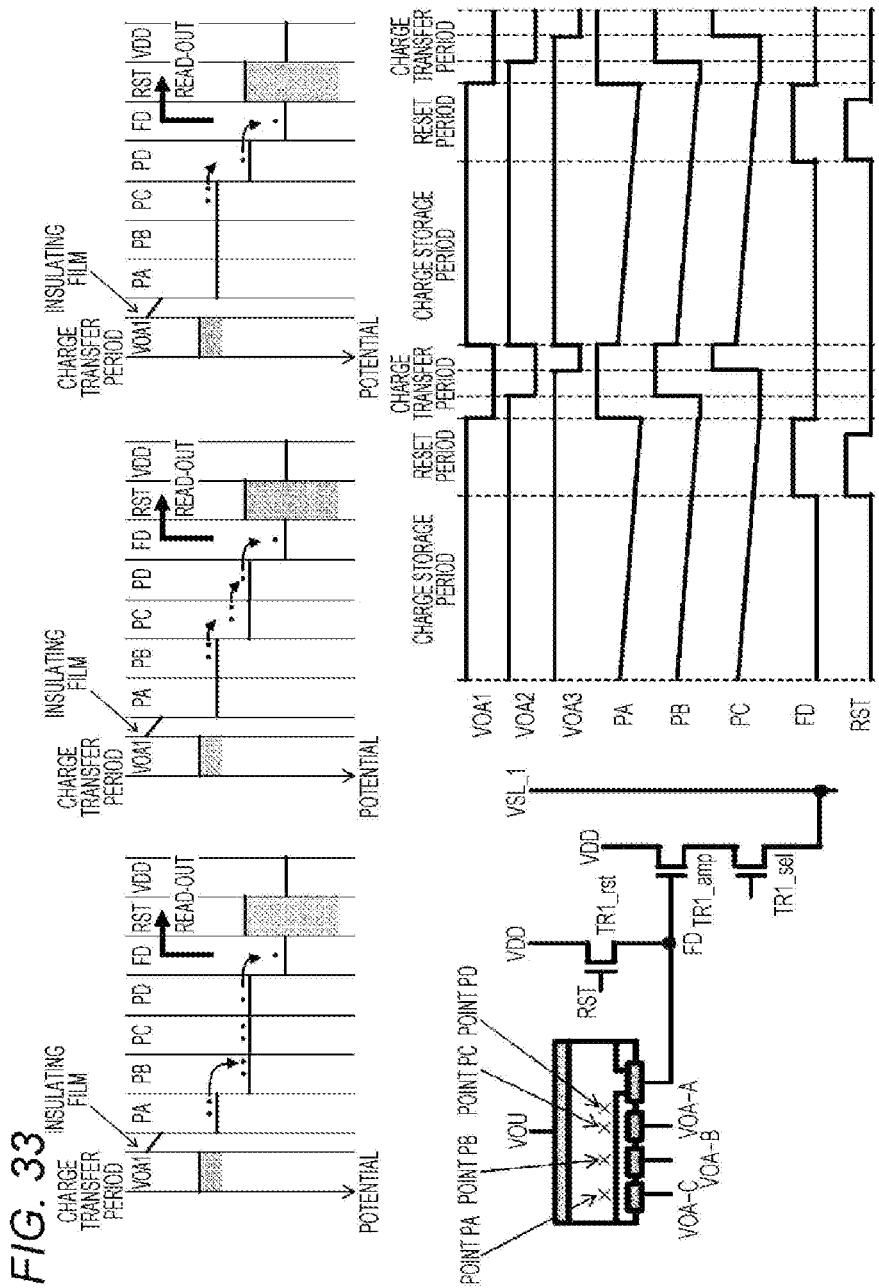
FIG. 33 is a diagram illustrating potential states of components in another operation period (transfer period) of the imaging element of Example 6.
Figure 34:
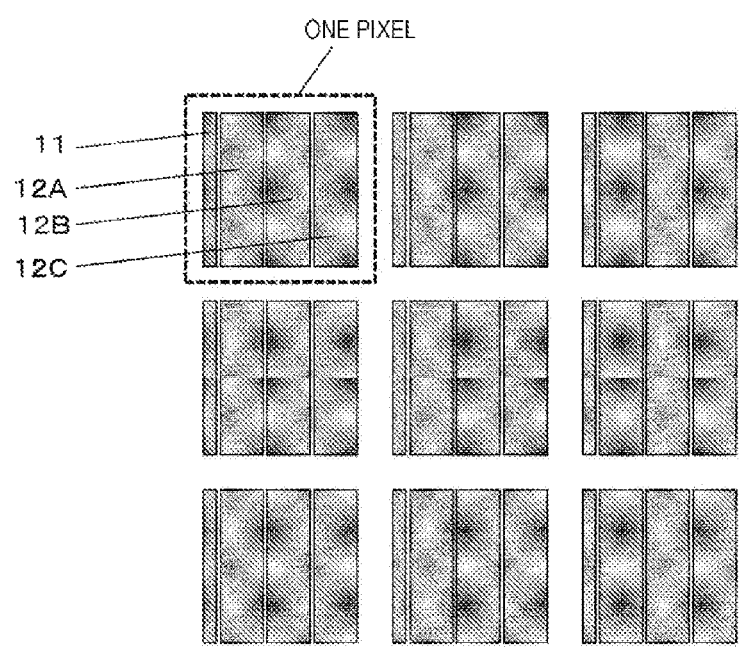
FIG. 34 is a schematic layout view of the first electrode and the charge storage electrode constituting the imaging element of Example 6.
Figure 35:
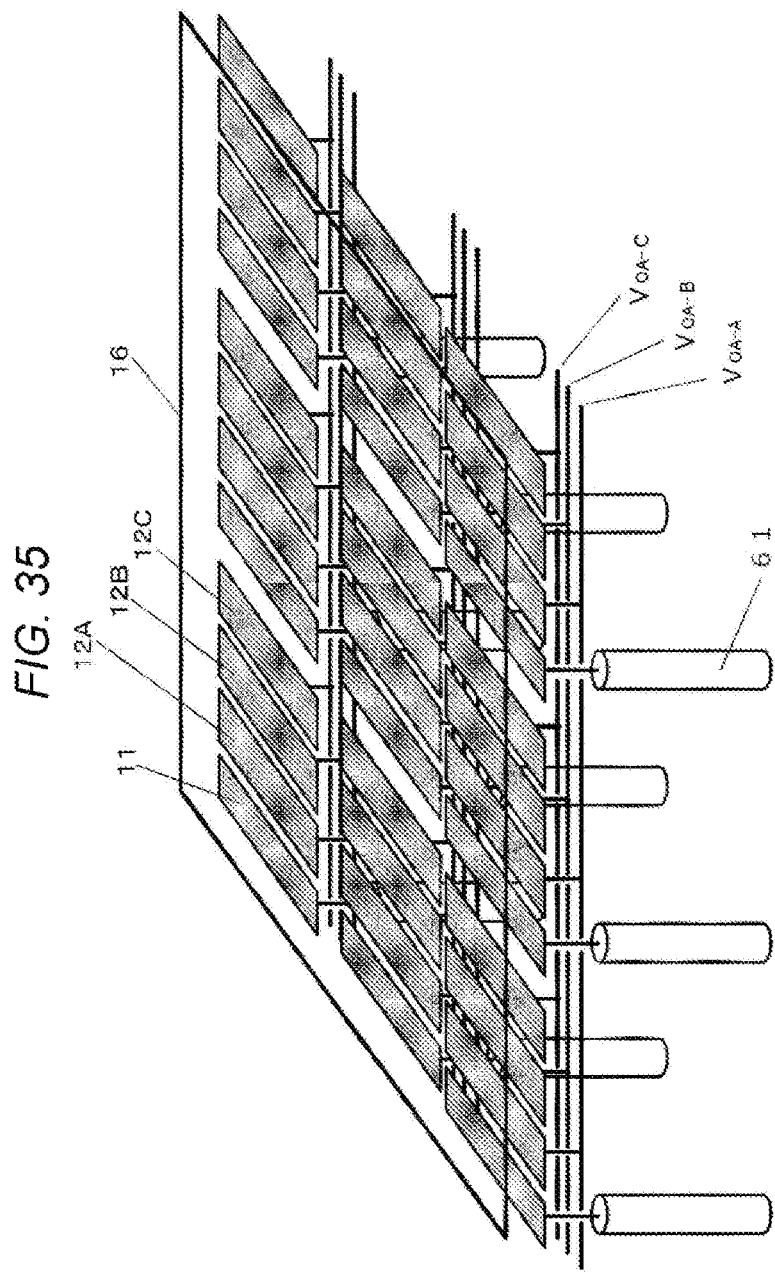
FIG. 35 is a schematic perspective view of the first electrode, the charge storage electrode, a second electrode, and a contact hole portion constituting the imaging element of Example 6.

A schematic partial cross-sectional view of a portion of the imaging element of Example 6 is illustrated in FIG. 28. Equivalent circuit diagrams of the imaging element and the stacked-type imaging element of Example 6 are illustrated in FIGS. 29 and 30. A schematic layout view of a first electrode and a charge storage electrode constituting the imaging element of Example 6 and transistors constituting a control unit is illustrated in FIG. 31. Potential states of components in an operation period of the imaging element of Example 6 are illustrated in FIGS. 32 and 33. In addition, a schematic layout view of the first electrode and the charge storage electrode constituting the imaging element of Example 6 is illustrated in FIG. 34. A schematic perspective view of the first electrode, the charge storage electrode, a second electrode, and a contact hole portion constituting the imaging element of Example 6 is illustrated in FIG. 35.

In Example 6, the charge storage electrode 12 is configured with a plurality of charge storage electrode segments 12A, 12B, and 12C. The number of charge storage electrode segments may be two or more, and in Example 6, the number is set to "3". Then, in the imaging element and the stacked-type imaging element of Example 6, since the potential of the first electrode 11 is higher than the potential of the second electrode 16, namely, for example, since a positive potential is applied to the first electrode 11 and a negative potential is applied to the second electrode 16, in the charge transfer period, the potential applied to the charge storage electrode segment 12A located at the position closest to the first electrode 11 is higher than the potential applied to the charge storage electrode segment 12C located at the position farthest from the first electrode 11. In this manner, potential gradient is provided to the charge storage electrode 12, so that the electrons, which have stopped in the region of the photoelectric conversion layer 15 facing the charge storage electrode 12, are more reliably read out to the first electrode 11, and furthermore, to the first floating diffusion layer $FD_1$. Namely, the charges stored in the photoelectric conversion layer 15 are read out to the control unit.

Figure 32:
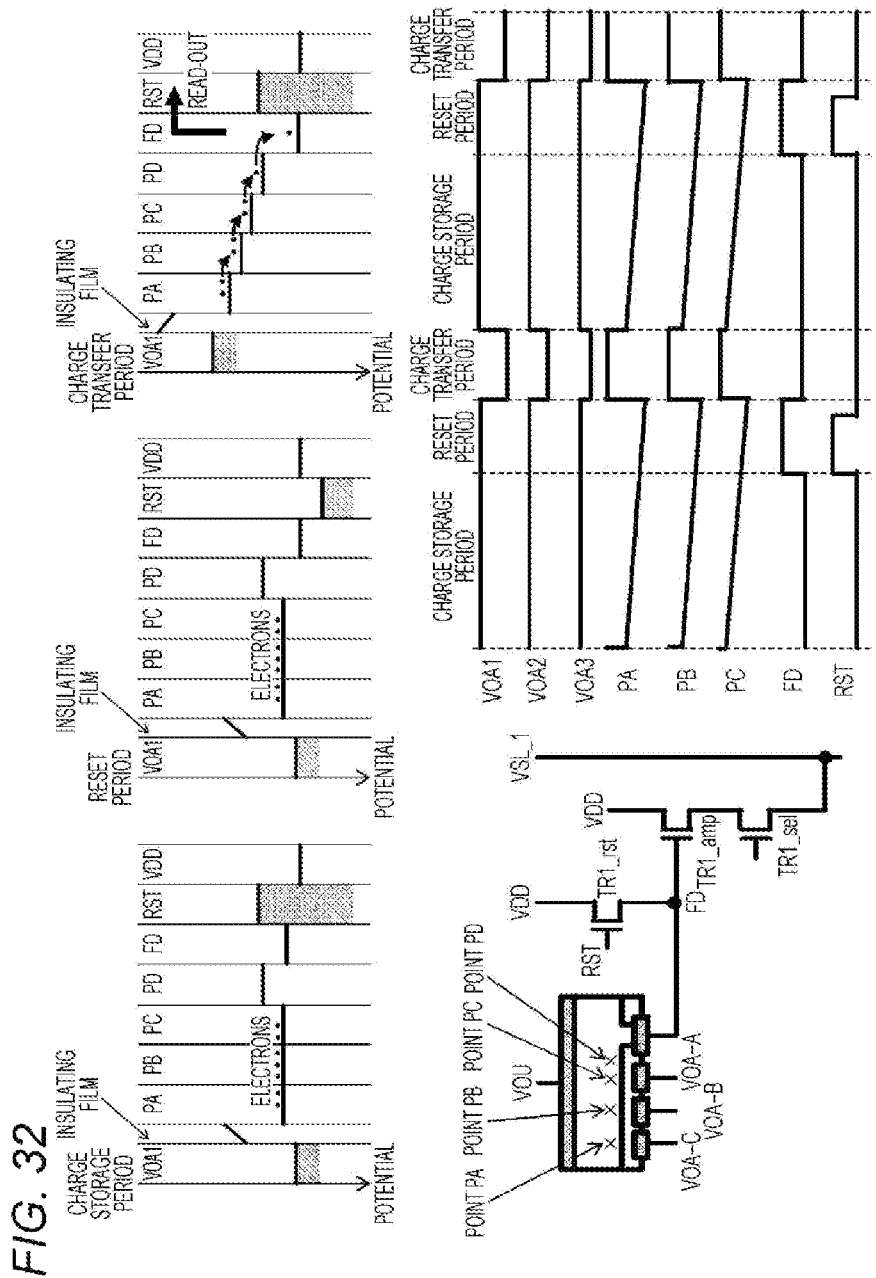
FIG. 32 is a diagram illustrating potential states of components in an operation period of the imaging element of Example 6.

In the example illustrated in FIG. 32, in the charge transfer period, it is set that the potential of the charge storage electrode segment 12C<the potential of the charge storage electrode segment 12B<the potential of the charge storage electrode segment 12A, and thus, the electrons, which have stopped in the region of the photoelectric conversion layer 15, are read out to the first floating diffusion layer $FD_1$ at one time. On the other hand, in the example illustrated in FIG. 33, in the charge transfer period, the potential of the charge storage electrode segment 12C, the potential of the charge storage electrode segment 12B, and the potential of the charge storage electrode segment 12A are allowed to be gradually changed (namely, changed stepwise or in a slope shape). Therefore, the electrons, which have stopped in the region of the photoelectric conversion layer 15 facing the charge storage electrode segment 12C, are allowed to be moved to the photoelectric conversion layer 15 facing the charge storage electrode segment 12B. Subsequently, the electrons, which have stopped in the region of the photoelectric conversion layer 15 facing the charge storage electrode segment 12B, are allowed to be moved to the photoelectric conversion layer 15 facing the charge storage electrode segment 12A. Subsequently, the electrons, which have stopped in the region of the photoelectric conversion layer 15 facing the charge storage electrode segment 12A, are allowed to be reliably read out to the first floating diffusion layer $FD_1$.

Figure 36:
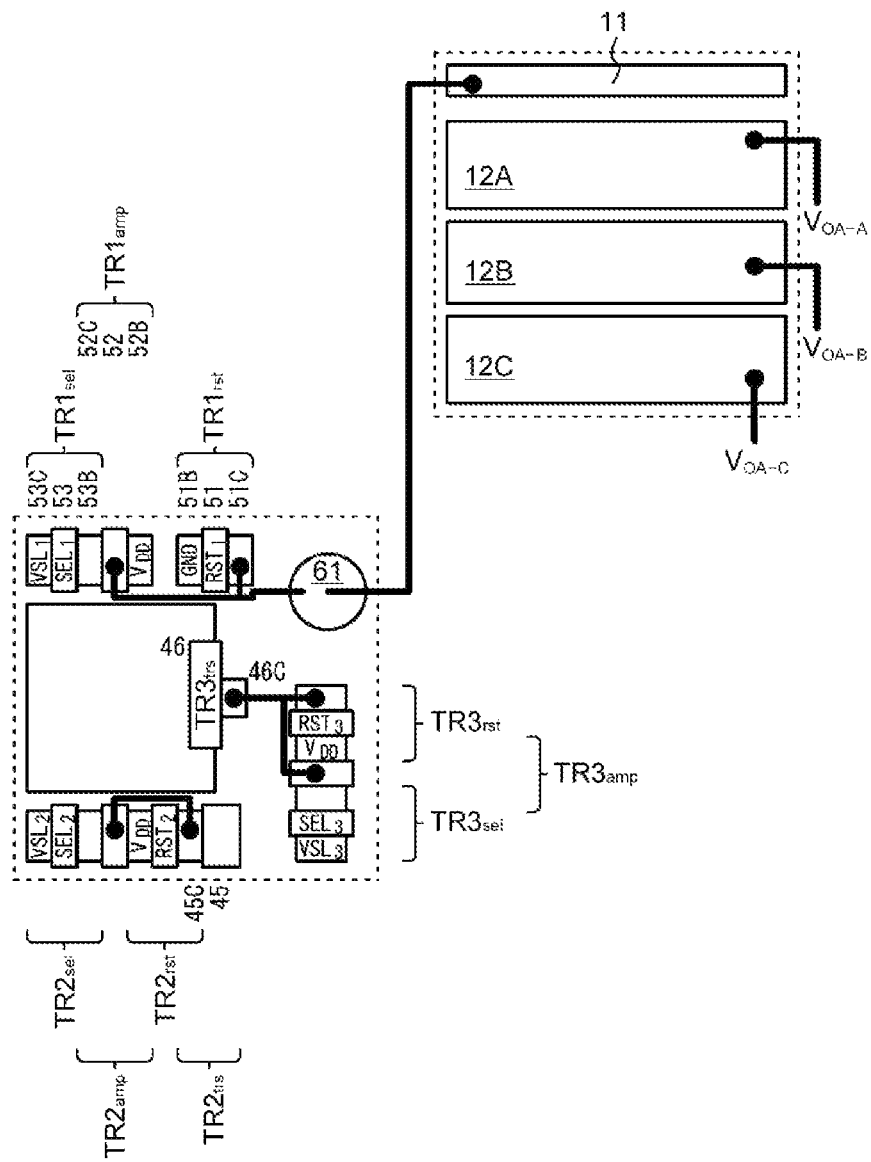
FIG. 36 is a schematic layout view of a first electrode and a charge storage electrode constituting a modified example of the imaging element of Example 6.

As a schematic layout view of a first electrode and a charge storage electrode constituting a modified example of the imaging element of Example 6 and transistors constituting a control unit is illustrated in FIG. 36, the other source/drain region 51B of the reset transistor $TR1_{rst}$ may be grounded instead of being connected to the power source $V_{DD}$.

Heretofore, although the present disclosure is described on the basis of the preferred examples, the present disclosure is not limited to the examples. The structure, configuration, manufacturing conditions, manufacturing methods, and used materials of the imaging elements, stacked-type imaging elements, and solid-state imaging devices described in the example are exemplary ones, and thus, these are appropriately changed. Besides the form where one floating diffusion layer is provided to one imaging element, there may be implemented a form where one floating diffusion layer is provided to a plurality of imaging elements. Namely, by appropriately controlling a timing of the charge transfer period, a plurality of the imaging elements can be allowed to share one floating diffusion layer. Furthermore, in this case, a plurality of the imaging elements can also be allowed to share one contact hole portion.

Figure 37:
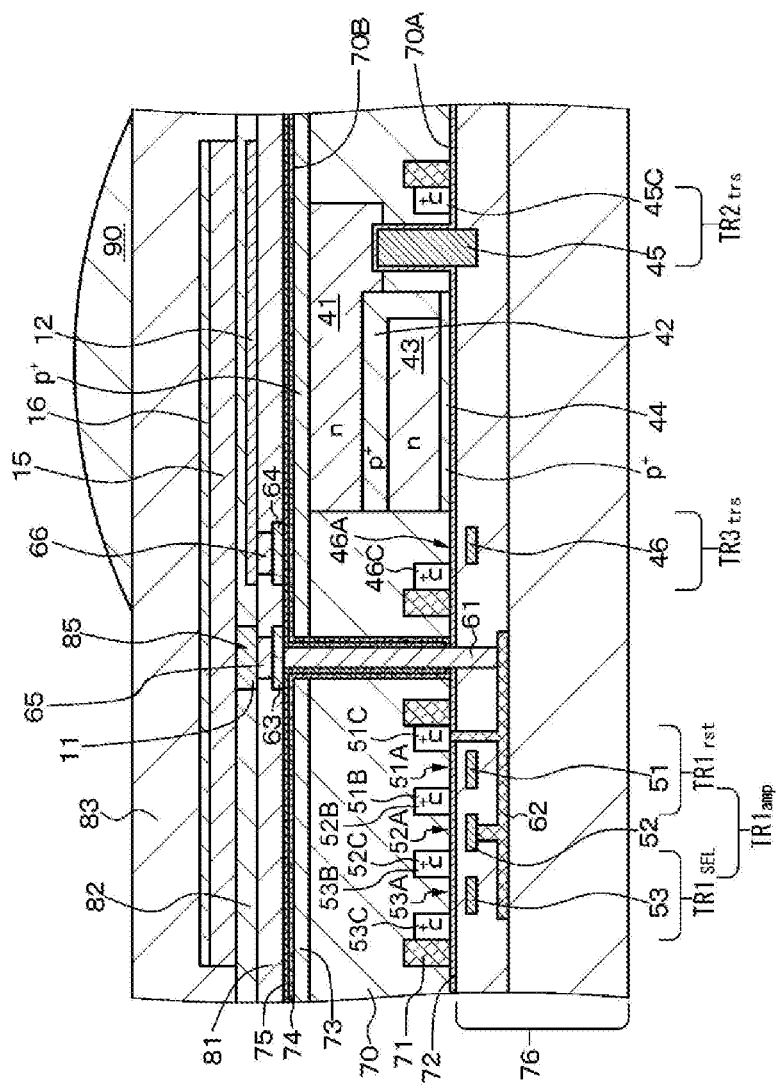
FIG. 37 is a schematic partial cross-sectional view of another modified example of the imaging element and the stacked-type imaging element of Example 1.

As a modified example of the imaging element and the stacked-type imaging element described in Example 1 is illustrated in FIG. 37, the first electrode 11 may be configured to extend in an opening portion 84A provided to the insulating layer 82 to be connected to the photoelectric conversion layer 15.

Figure 38:
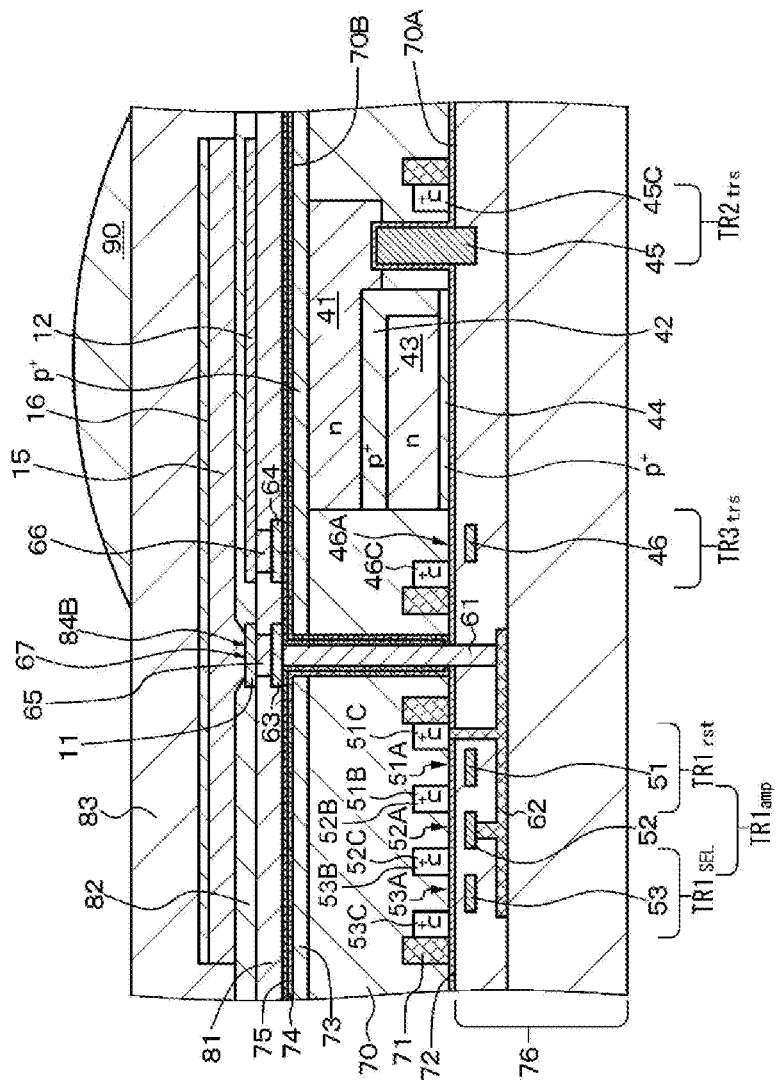
FIG. 38 is a schematic partial cross-sectional view of another modified example of the imaging element and the stacked-type imaging element of Example 1.
Figure 39A:
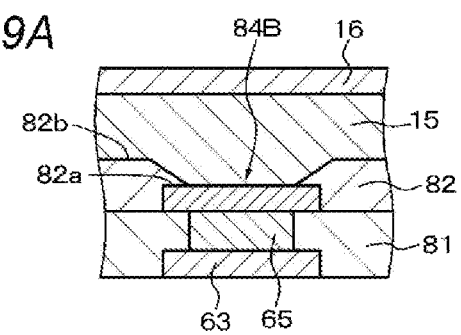
FIG. 39A is a schematic enlarged partial cross-sectional view of a portion of a first electrode and the like of another modified example of the imaging element and the stacked-type imaging element of Example 1.
Figure 39B:
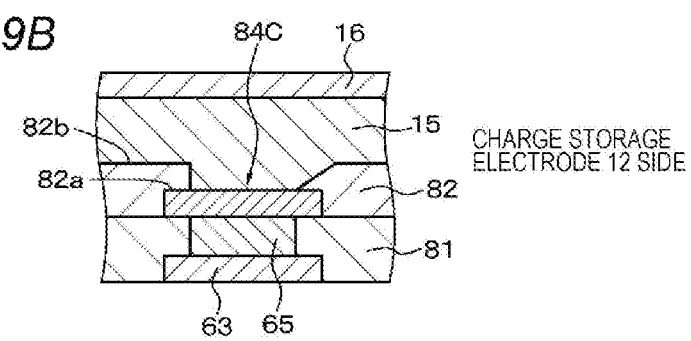
FIG. 39B is a schematic enlarged partial cross-sectional view of a portion of a first electrode and the like of another modified example of the imaging element and the stacked-type imaging element of Example 1.
Figure 39C:
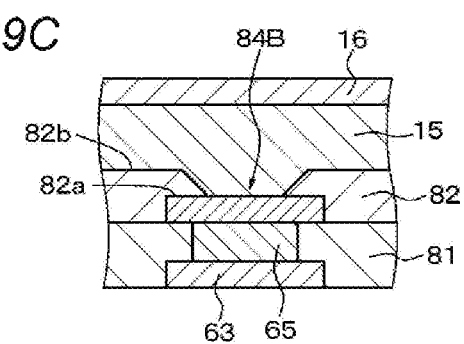
FIG. 39C is a schematic enlarged partial cross-sectional view of a portion of a first electrode and the like of another modified example of the imaging element and the stacked-type imaging element of Example 1.

Alternatively, as a modified example of the imaging element and the stacked-type imaging element described in Example 1 is illustrated in FIG. 38 and a schematic enlarged partial cross-sectional view of a portion and the like of the first electrode is illustrated in FIG. 39A, the edge of the top surface of the first electrode 11 is covered with the insulating layer 82; the first electrode 11 is exposed to the bottom surface of an opening portion 84B; and when the surface of the insulating layer 82 being in contact with the top surface of the first electrode 11 is defined by a first surface 82a and the surface of the insulating layer 82 being in contact with the portion of the photoelectric conversion layer 15 facing the charge storage electrode 12 is defined by a second surface 82b, the side surface of the opening portion 84B has a slope expanding from the first surface 82a toward the second surface 82b. In this manner, since a slope is provided to the side surface of the opening portion 84B, the charge more smoothly moves from the photoelectric conversion layer 15 to the first electrode 11. Note that, in the example illustrated in FIG. 39A, the axial line of the opening portion 84B is used as a center, and the side surface of the opening portion 84B has a rotation symmetry. However, as illustrated in FIG. 39B, the opening portion 84C may be provided so that the side surface of the opening portion 84C having a slope expanding from the first surface 82a toward the second surface 82b is located in the charge storage electrode 12 side. Therefore, the charges from the portion of the photoelectric conversion layer 15 at the side opposite to the charge storage electrode 12 with the opening portion 84C interposed therebetween are hard to move. In addition, although the side surface of the opening portion 84B has a slope expanding from the first surface 82a toward the second surface 82b, the edge of the side surface of the opening portion 84B in the second surface 82b may be located in the outer side from the edge of the first electrode 11 as illustrated in FIG. 39A or may be located in the side inner from the edge of the first electrode 11 as illustrated in FIG. 39C. By employing the former configuration, the charge transfer can be more easily performed; and by employing the latter configuration, the shape irregularity at the time of forming the opening portion can be reduced.

The opening portions 84B and 84C can be formed by reflowing an etching mask made of a resist material formed at the time of forming the opening portion in the insulating layer on the basis of an etching method to provide a slope to the side surface of an opening portion of an etching mask and by etching the insulating layer 82 by using the etching mask.

Figure 40:
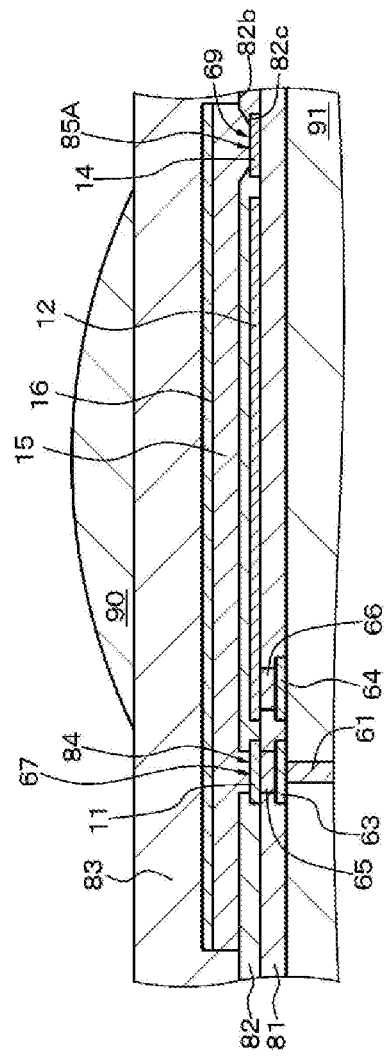
FIG. 40 is a schematic enlarged partial cross-sectional view of a portion of a charge ejection electrode and the like of another modified example of the imaging element and the stacked-type imaging element of Example 5.

Alternatively, with respect to the charge ejection electrode 14 described in Example 5, as illustrated in FIG. 40, the photoelectric conversion layer 15 may be formed to extend in a second opening portion 85A provided to the insulating layer 82 to be connected to the charge ejection electrode 14; the edge of the top surface of the charge ejection electrode 14 is covered with the insulating layer 82; the charge ejection electrode 14 is exposed in the bottom surface of the second opening portion 85A; and when the surface of the insulating layer 82 being in contact with the top surface of the charge ejection electrode 14 is defined by a third surface 82c and the surface of the insulating layer 82 being in contact with the portion of the photoelectric conversion layer 15 facing the charge storage electrode 12 is defined by a second surface 82b, the side surface of the second opening portion 85A has a slope expanding from the third surface 82c toward the second surface 82b.

Figure 41:
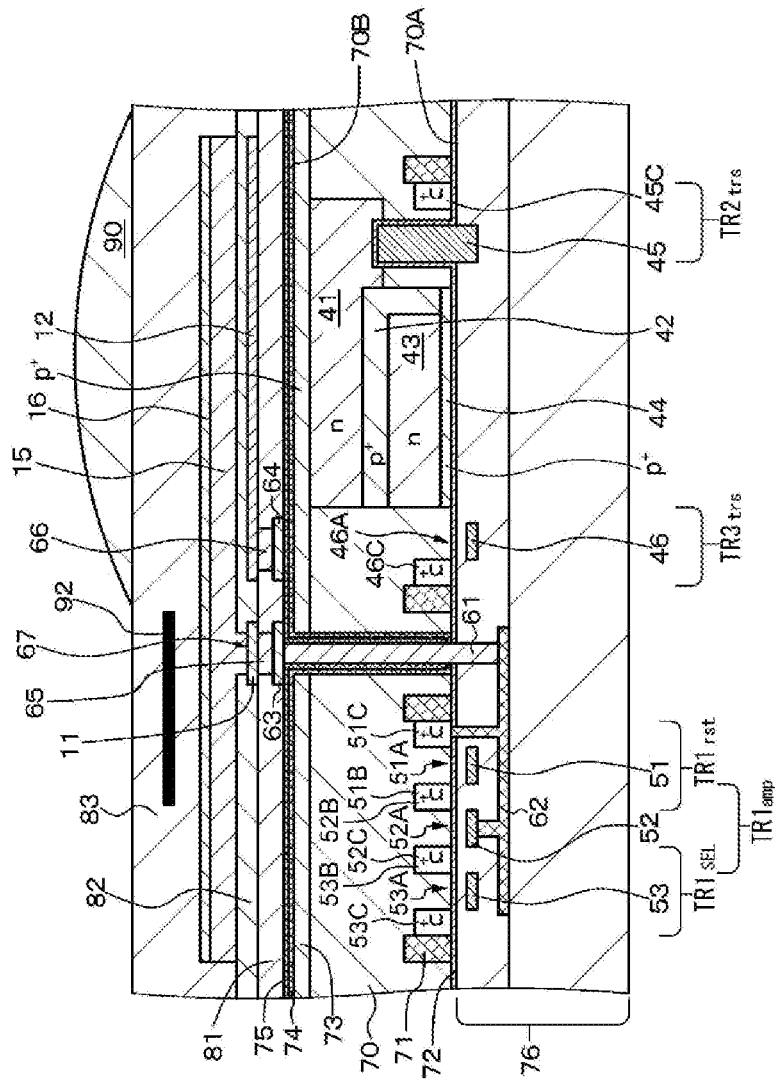
FIG. 41 is a schematic partial cross-sectional view of another modified example of the imaging element and the stacked-type imaging element of Example 1.

Alternatively, as a modified example of the imaging element and the stacked-type imaging element described in Example 1 is illustrated in FIG. 41, light may be configured to be incident on the side of the second electrode 16, and a light-shielding layer 92 may be configured to be formed in the light-incident side of the second electrode 16. Note that various wire lines provided to be closer to the light-incident side than to the photoelectric conversion layer may be allowed to function as light-shielding layers.

Figure 42:
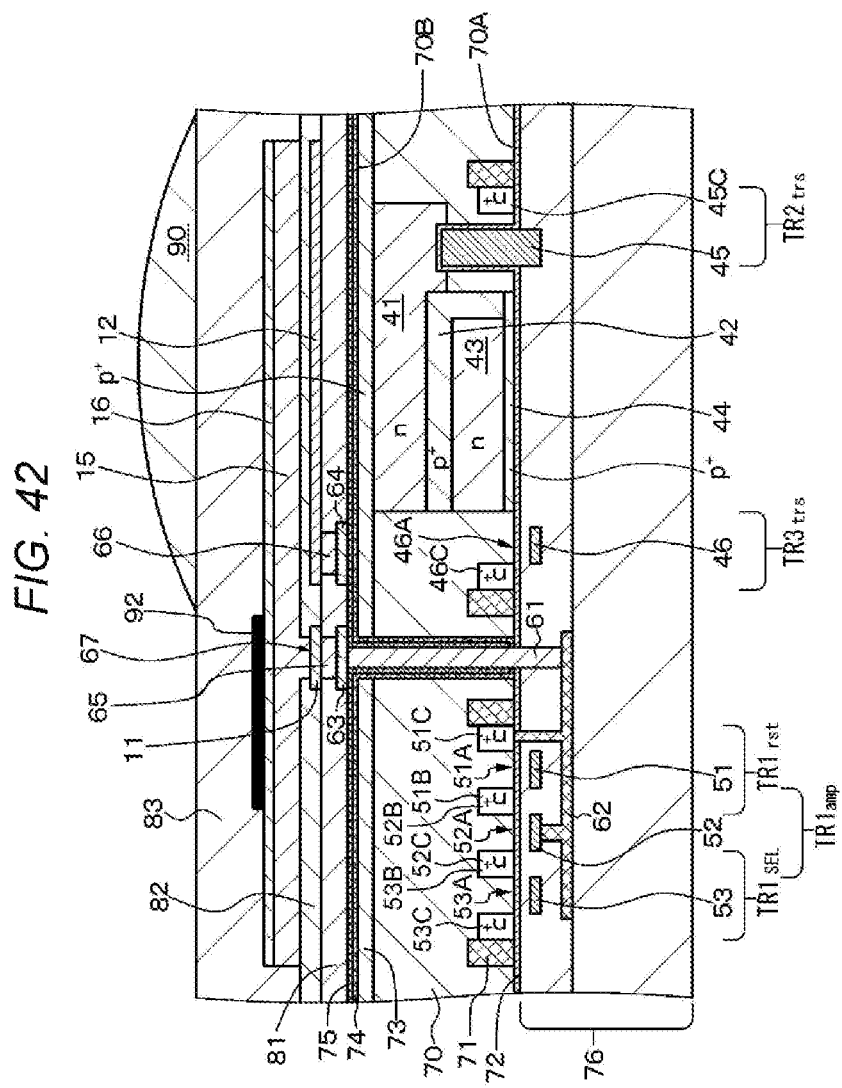
FIG. 42 is a schematic partial cross-sectional view of another modified example of the imaging element and the stacked-type imaging element of Example 1.
Figure 43:
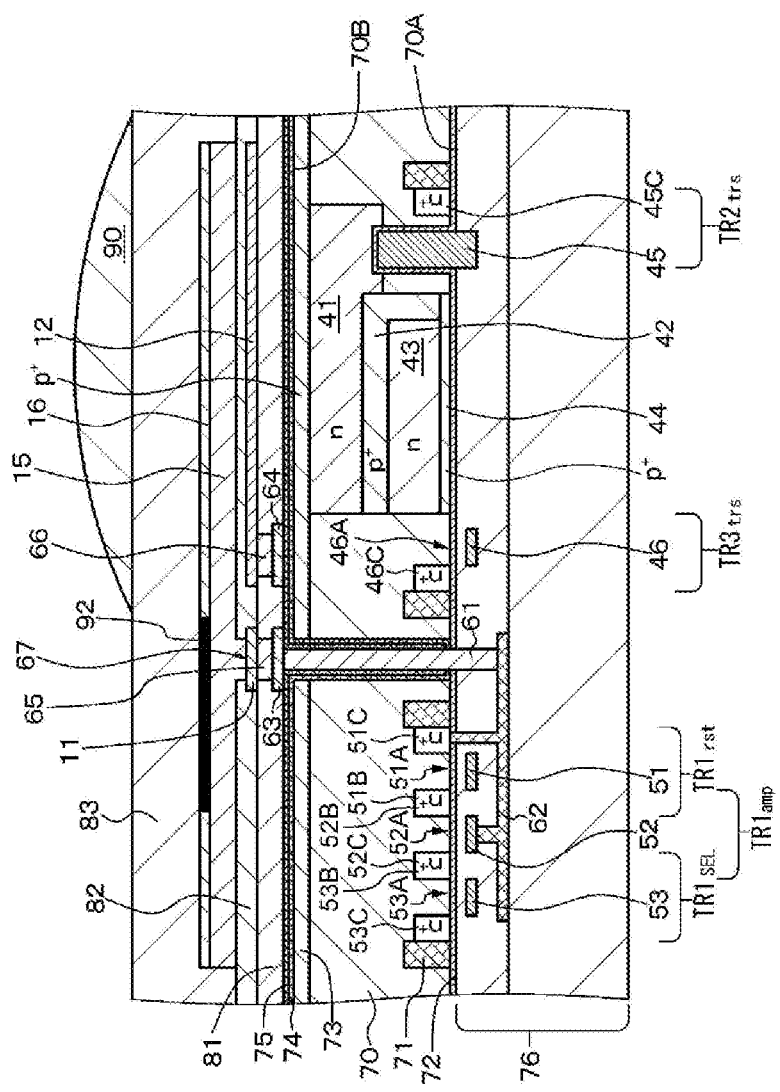
FIG. 43 is a schematic partial cross-sectional view of another modified example of the imaging element and the stacked-type imaging element of Example 1.

Note that in the example illustrated in FIG. 41, although the light-shielding layer 92 is formed above the second electrode 16, namely, although the light-shielding layer 92 is formed above the first electrode 11 as the light incidence side of the second electrode 16, as illustrated in FIG. 42, the light-shielding layer may be arranged on the surface of the light incidence side of the second electrode 16. In addition, in some cases, as illustrated in FIG. 43, the light-shielding layer 92 may be formed in the second electrode 16.

Figure 44:
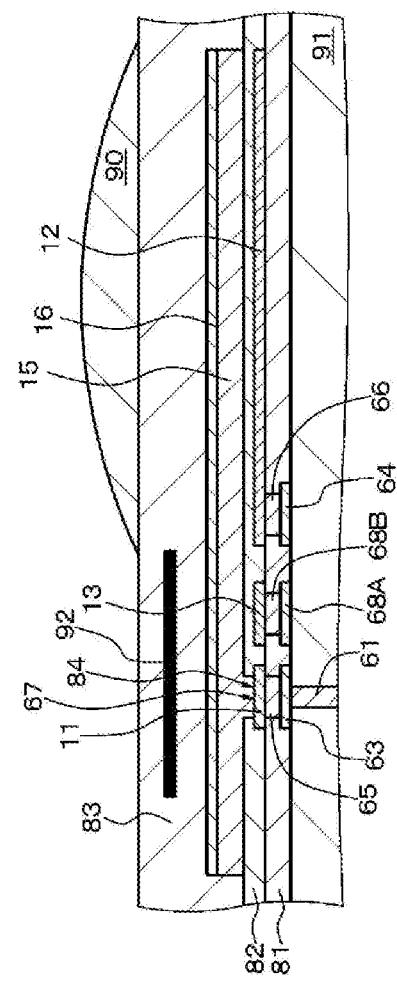
FIG. 44 is a schematic partial cross-sectional view of another modified example of the imaging element and the stacked-type imaging element of Example 4.
Figure 45:
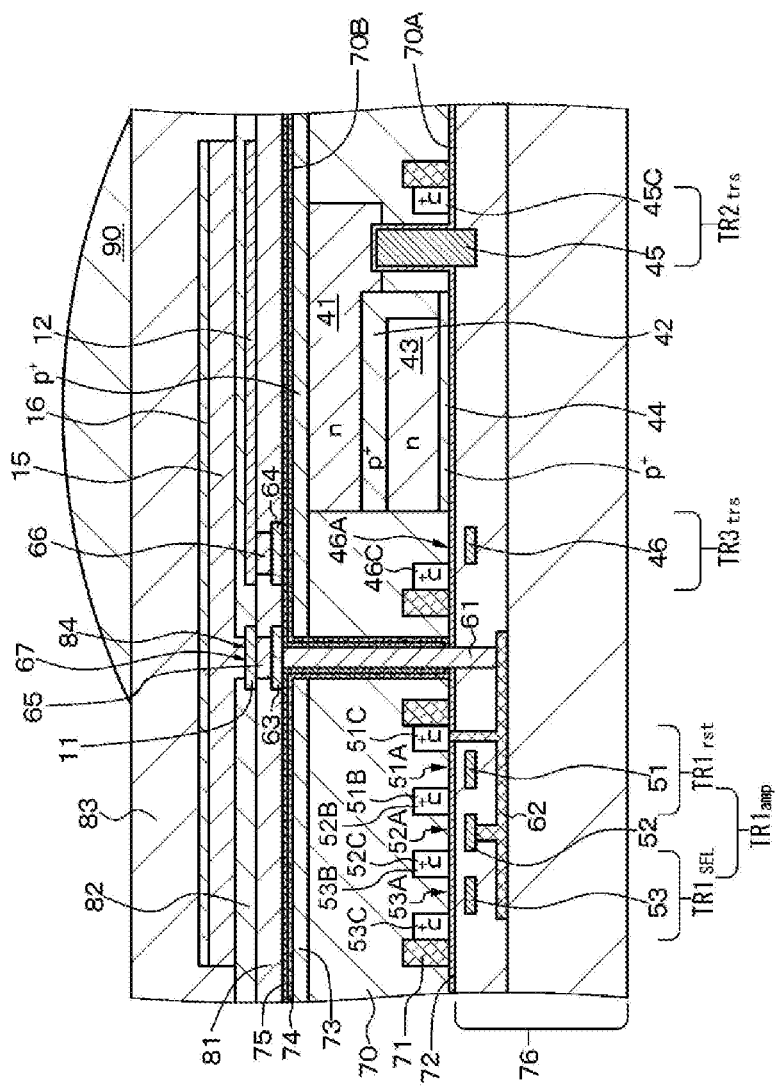
FIG. 45 is a schematic partial cross-sectional view of another modified example of the imaging element and the stacked-type imaging element of Example 1.

Alternatively, there may be provided a structure where light is incident from the second electrode 16 side, and no light is incident on the first electrode 11. Specifically, as illustrated in FIG. 41, the light-shielding layer 92 is formed above the first electrode 11 as the light-incident side of the second electrode 16. Alternatively, as illustrated in FIG. 45, there may be provided a structure where an on-chip microlens 90 is provided above the charge storage electrode 12 and the second electrode 16, and light incident on the on-chip microlens 90 is collected in the charge storage electrode 12, so that light may not reach the first electrode 11. Note that as described in Example 4, in the case where the transfer control electrode 13 is provided, it is possible to implement a form where light is not incident on the first electrode 11 and the transfer control electrode 13. Specifically, as illustrated in FIG. 44, there may be provided a form where the light-shielding layer 92 is formed above the first electrode 11 and the transfer control electrode 13. Alternatively, there may be provided a structure where the light incident on the on-chip microlens 90 does not reach the first electrode 11 and the transfer control electrode 13.

By employing the above-described configurations and structures, alternatively, providing the light-shielding layer 92 so that light is incident on only the portion of the photoelectric conversion layer 15 located above the charge storage electrode 12, or alternatively designing the on-chip microlens 90, since the portion of the photoelectric conversion layer 15 located above the first electrode 11 (or above the first electrode 11 and the transfer control electrode 13) does not contribute to the photoelectric conversion, it is possible to more reliably reset the entire pixels at one time, so that it is possible to more easily implement a global shutter function. Namely, in a driving method for a solid-state imaging device including a plurality of imaging elements having the above-described configuration and structure, repeated are the following processes:

in all the imaging elements, at one time, charges are stored in the photoelectric conversion layer 15, and the charges of the first electrode 11 are ejected to the outside; and in all imaging elements, at one time, the charges stored in the photoelectric conversion layer 15 are transferred to the first electrode 11, and after the completion of transfer, the charges transferred to the first electrode 11 in the respective imaging elements are sequentially read out.

The photoelectric conversion layer is not limited to the configuration where the photoelectric conversion layer is one layer. For example, as a modified example of the imaging element and the stacked-type imaging element described in Example 1 is illustrated in FIG. 46A, the photoelectric conversion layer 15 may be configured to have a stacked layer structure of, for example, a lower semiconductor layer 15B made of IGZO and an upper photoelectric conversion layer 15A made of a material constituting the photoelectric conversion layer 15 described in Example 1. In this manner, by providing the lower semiconductor layer 15B, it is possible to prevent recoupling in the charge storage period, so that it is possible to increase transfer efficiency of the charges stored in the photoelectric conversion layer 15 to the first electrode 11, and it is possible to suppress the occurrence of dark current. In addition, as a modified example of Example 4, as illustrated in FIG. 47, a plurality of the transfer control electrodes may be provided from the position closest to the first electrode 11 toward the charge storage electrode 12. Note that an example where two transfer control electrodes 13A and 13B are provided is illustrated in FIG. 47.

Figure 46B:
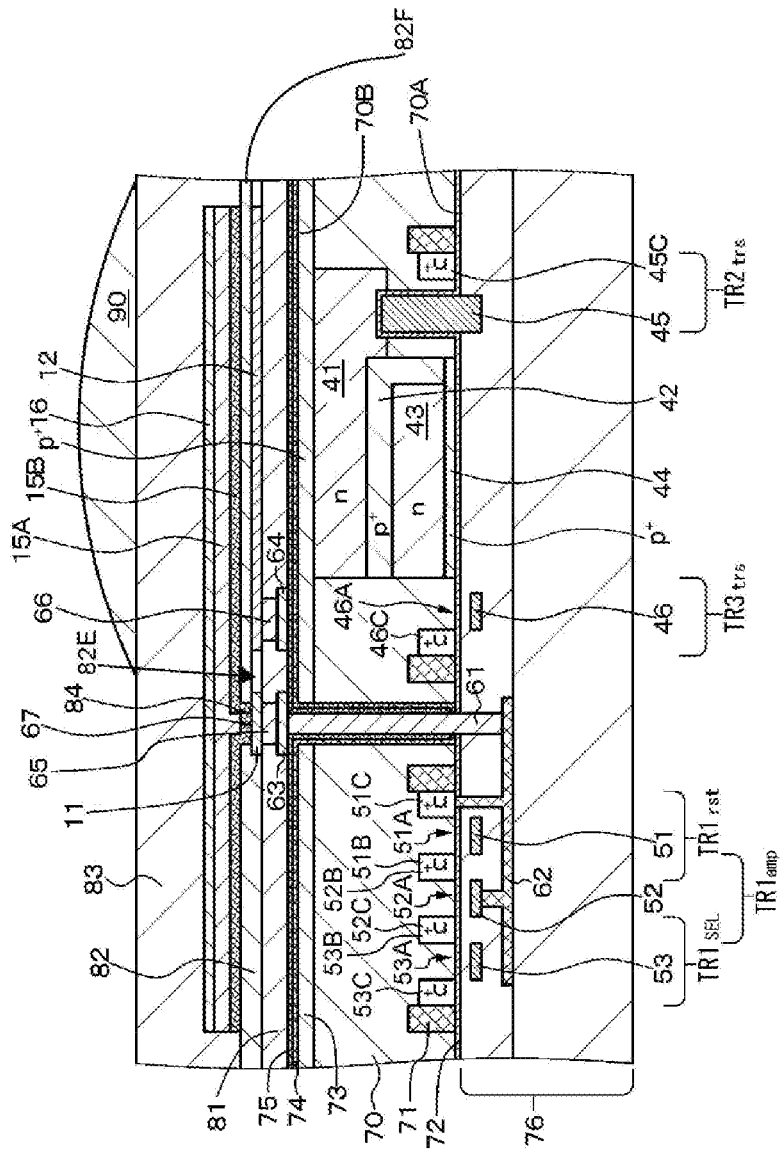
FIG. 46B is a schematic partial cross-sectional view of another modified example of the imaging element and the stacked-type imaging element of Example 1.
Figure 46C:
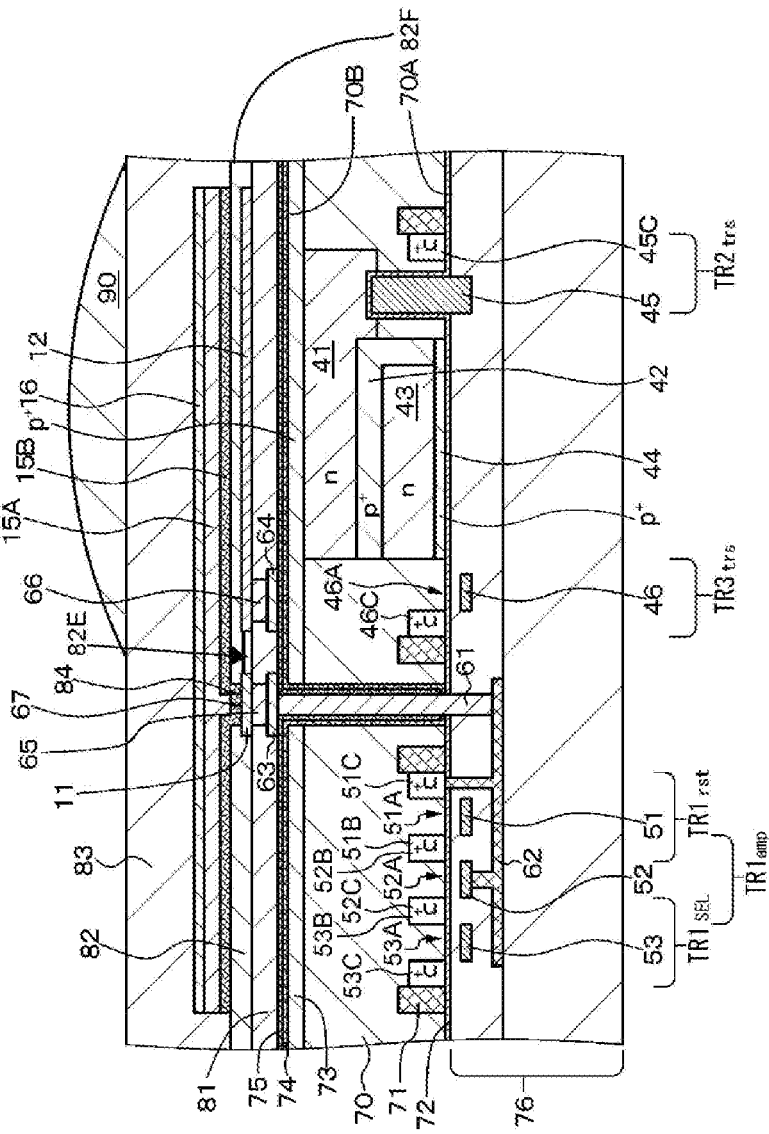
FIG. 46C is a schematic partial cross-sectional view of another modified example of the imaging element and the stacked-type imaging element of Example 1.
Figure 46D:
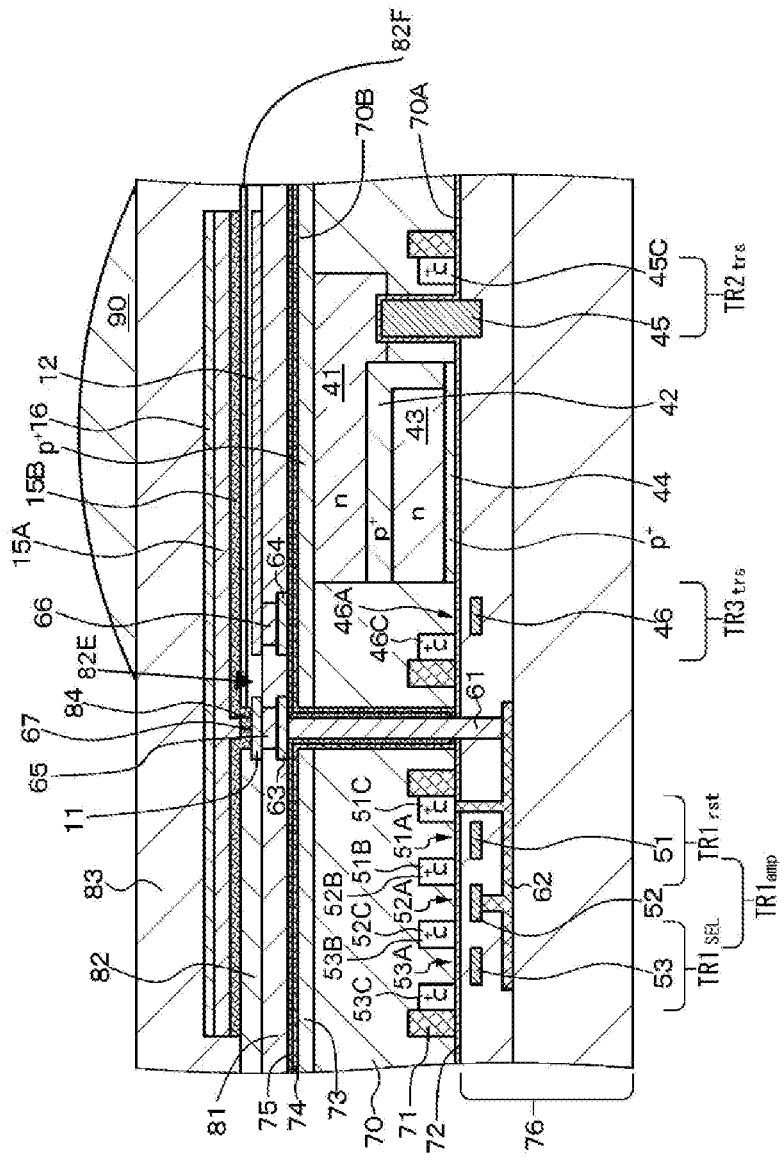
FIG. 46D is a schematic partial cross-sectional view of another modified example of the imaging element and the stacked-type imaging element of Example 1.
Figure 46E:
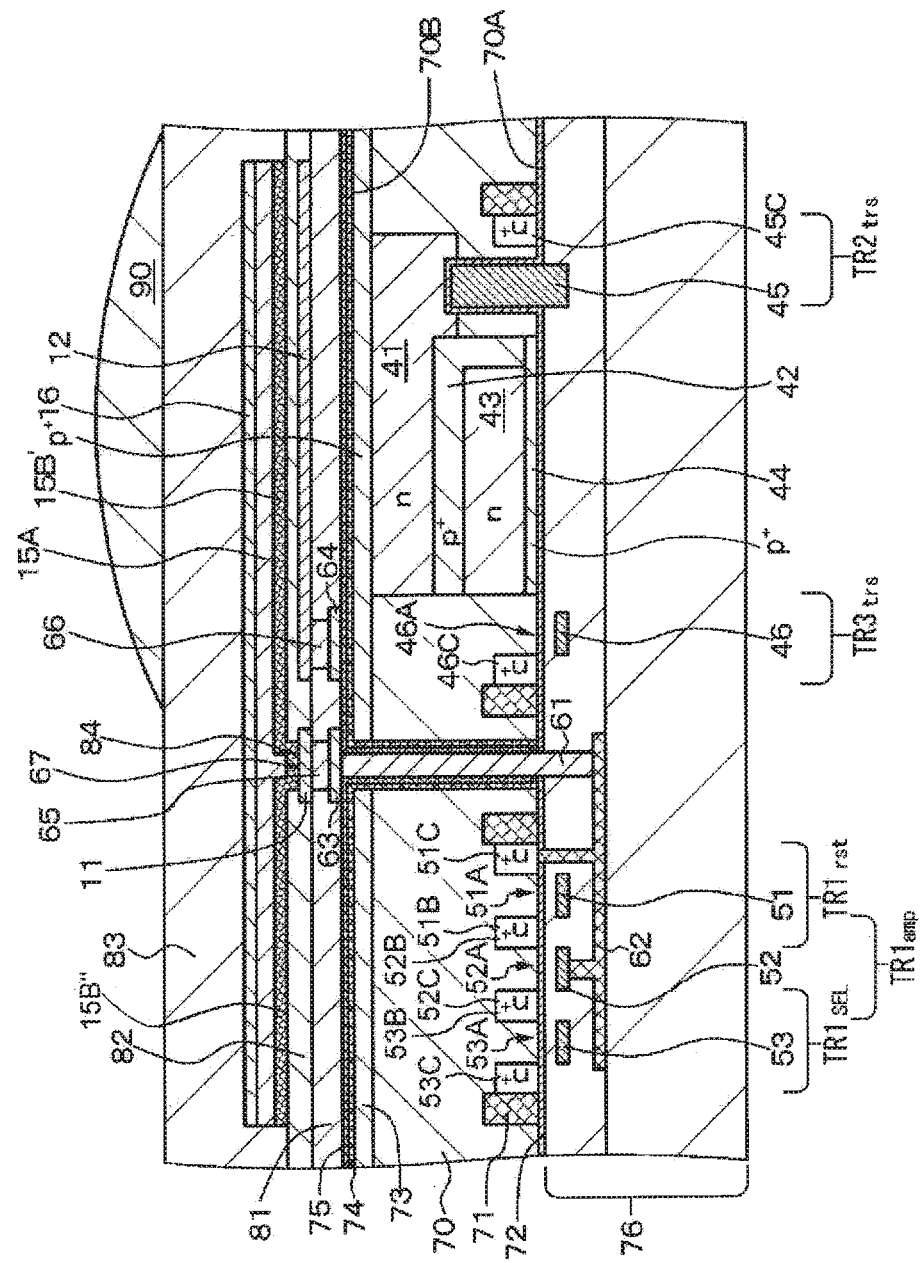
FIG. 46E is a schematic partial cross-sectional view of another modified example of the imaging element and the stacked-type imaging element of Example 1.
Figure 47:
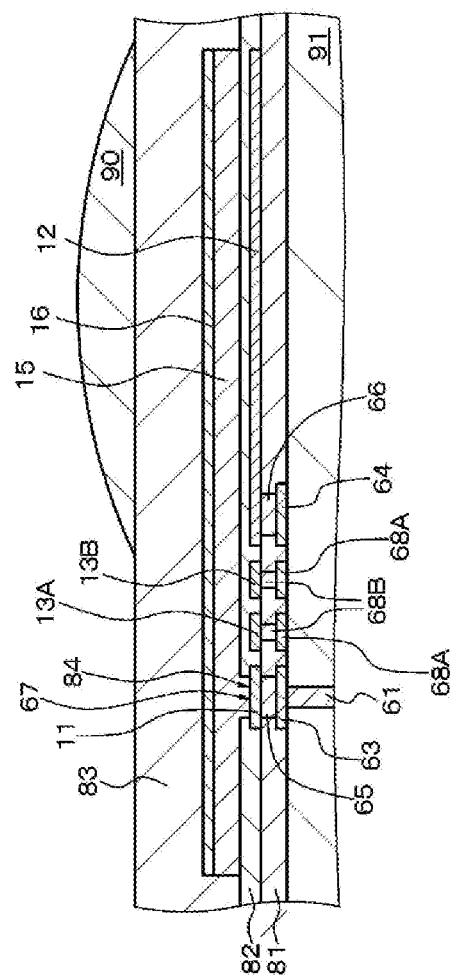
FIG. 47 is a schematic partial cross-sectional view of another modified example of the imaging element and the stacked-type imaging element of Example 4.

As depicted in FIGS. 46B-D, the insulating layer 82 may include multiple layers 82E and 82F. For example, a first region of the insulating material 82 between the charge storage electrode 12 and the photoelectric conversion layer 15 may exist, and a second region of the insulating material 82 between the charge storage electrode 12 and the first electrode 11 may exist. In some embodiments, the second region of the insulating material includes a first insulating layer 82E including the insulating material and a second insulating layer 82F including the insulating material, and the first insulating material 82F is stacked on the second insulating material 82E. FIGS. 46B-D further depict various configurations with respect to the insulating layer 82 (e.g., the configurations of layers 82E and 82F change).

Various modified examples described hereinbefore may be appropriately applied to Example 1 or other examples.

In examples, although the electrons are set as the signal charges and the conductive type of the photoelectric conversion layer formed in the semiconductor substrate is set as the n type, the present disclosure can be applied to a solid-state imaging device where holes are set as the signal charges. In this case, each semiconductor region may be configured as a semiconductor region having the opposite conductive type, and the conductive type of the photoelectric conversion layer formed in the semiconductor substrate may be of p type.

In addition, in the examples, although the case of the application to the CMOS-type solid-state imaging device where the unit pixels of detecting signal charges according to incident light amount as a physical quantity are arranged in a matrix shape is exemplified in the description, the present disclosure is not limited to the application to the CMOS-type solid-state imaging device, but it may be applied to a CCD-type solid-state imaging device. In the latter case, the signal charges are transferred in the vertical direction by a vertical transfer register having CCD-type structure, and the signal charges are transferred in the horizontal direction by a horizontal transfer register to be amplified, so that a pixel signal (image signal) is output. In addition, the present disclosure is not limited to overall column-type solid-state imaging devices where pixels are formed in a two-dimensional matrix shape and column signal processing circuits are arranged for the respective pixel columns. Furthermore, in some cases, the selection transistors may be omitted.

Furthermore, the imaging element and the stacked-type imaging element of the present disclosure are not limited to the application to the solid-state imaging device which detects a distribution of the incident light amount of visible light to image the distribution as an image, but the imaging element and the stacked-type imaging element of the present disclosure may also be applied to a solid-state imaging device which images a distribution of incident amount of infrared ray, X-ray, particles, or the like as an image. In addition, in a broad sense, the imaging element and the stacked-type imaging element of the present disclosure may be applied to overall solid-state imaging devices (physical quantity distribution detection devices) such as a fingerprint detection sensor which detects a distribution of another physical quantity such as pressure or electrostatic capacitance to image the distribution as an image.

Furthermore, the present disclosure is not limited to a solid-state imaging device which scans the unit pixels of the imaging region sequentially in unit of a row to read out pixel signals from the unit pixels. The present disclosure may be applied to an X-Y address type solid-state imaging device which arbitrarily selects pixels in unit of a pixel and reads out pixel signals from select pixels in unit of a pixel. The solid-state imaging device may be formed as one chip, or the solid-state imaging device may be formed in a module shape having an imaging function where an imaging region, a driving circuit, or an optical system is collectively packaged.

In addition, the present disclosure is not limited to the application to the solid-state imaging device, but the present disclosure may be applied to an imaging device. Herein, the imaging device denotes a camera system such as a digital still camera or a video camera or an electronic apparatus such as a mobile phone having an imaging function. In some cases, the present disclosure may be implemented as a module-shaped form which is to be mounted on an electronic apparatus, that is, a camera module.

Figure 48:
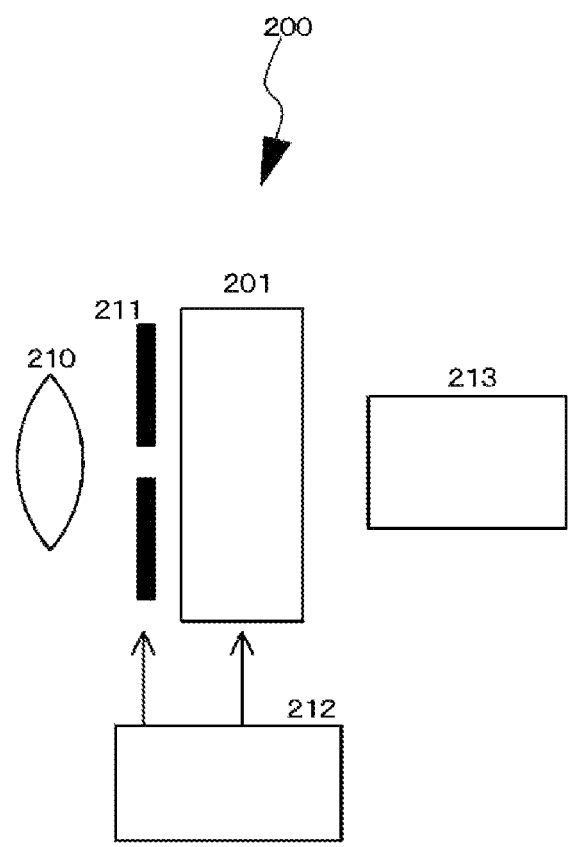
FIG. 48 is a conceptual diagram of an example of an electronic apparatus (camera) using a solid-state imaging device configured with the imaging element and the stacked-type imaging element according to an embodiment of the present disclosure.
Figure 49:
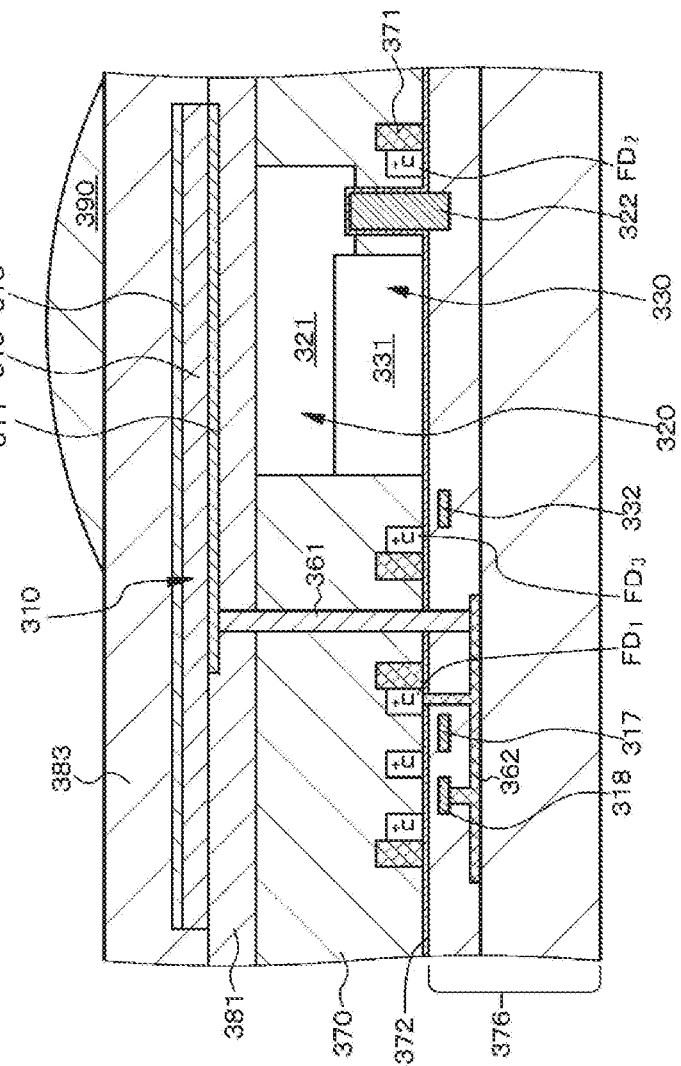
FIG. 49 is a conceptual diagram of a stacked-type imaging element (stacked-type solid-state imaging device) in the related art.

An example where a solid-state imaging device 201 configured with the imaging element or the stacked-type imaging element of the present disclosure is used for an electronic apparatus (camera) 200 is illustrated in a conceptual diagram of FIG. 48. The electronic apparatus 200 includes a solid-state imaging device 201, an optical lens 210, a shutter device 211, a driving circuit 212, and a signal processing circuit 213. The optical lens 210 forms an image of image light (incident light) from a subject on an imaging place of the solid-state imaging device 201. Therefore, signal charges are stored in the solid-state imaging device 201 for a certain period. The shutter device 211 controls a light-illuminating period and a light-shielding period for the solid-state imaging device 201. The driving circuit 212 supplies driving signals for controlling a transfer operation of the solid-state imaging device 201 and a shutter operation of the shutter device 211. According to the driving signal (timing signal) supplied from the driving circuit 212, signal transfer of the solid-state imaging device 201 is performed.

The signal processing circuit 213 performs various signal processes. An image signal, which is subject to the signal processes, is stored in a storage medium such as a memory or is output to a monitor. In the electronic apparatus 200, since pixel size and transfer efficiency of the solid-state imaging device 201 are improved, it is possible to achieve the electronic apparatus 200 of which pixel characteristics are improved. The electronic apparatus 200 to which the solid-state imaging device 201 can be applied is not limited to the camera, but the electronic apparatus can be applied to an imaging device such as a digital still camera or a camera module for a mobile apparatus such as a mobile phone.

It should be understood by those skilled in the art that various modifications, combinations, sub-combinations and alterations may occur depending on design requirements and other factors insofar as they are within the scope of the appended claims or the equivalents thereof.

Further, for example, the present technology can have the following configurations.

(1) An imaging device including:
a substrate including a first photoelectric conversion unit; and a second photoelectric conversion unit at a light-incident side of the substrate, the second photoelectric conversion unit including: a photoelectric conversion layer, a first electrode, a second electrode above the photoelectric conversion layer, a third electrode, and an insulating material between the third electrode and the photoelectric conversion layer, wherein a portion of the insulating material is between the first electrode and the third electrode.

(2) The imaging device according to (1) above, further including a first region of the insulating material between the third electrode and the photoelectric conversion layer, a second region of the insulating material between the third electrode and the first electrode, wherein the second region of the insulating material includes a first insulating layer including the insulating material and a second insulating layer including the insulating material, and wherein the first insulating material is stacked on the second insulating material.

(3) The imaging device according to (2) above, wherein a portion of the first insulating layer in the second region is between the first electrode and the photoelectric conversion layer.

(4) The imaging device according to (3) above, wherein the first region and the second region include a different number of insulating layers including the insulating material.

(5) The imaging device according to any one of (1) to (4) above, further including a transfer control electrode between the first electrode and the third electrode.

(6) The imaging device according to (5) above, wherein during a charge storage operation, a potential applied to the transfer control electrode is less than a potential applied to the third electrode.

(7) The imaging device according to any one of (5) to (6) above, wherein the substrate includes a third photoelectric conversion unit, and wherein each of the first, second, and third photoelectric conversion units are coupled to separate signal lines.

(8) The imaging device according to any one of (1) to (7) above, further including a charge ejection electrode separate and apart from the first electrode and the third electrode, wherein the photoelectric conversion layer contacts the charge ejection electrode.

(9) The imaging device according to (8) above, wherein the charge ejection electrode surrounds the first electrode and the third electrode.

(10) The imaging device according to any one of (1) to (9) above, further including a plurality of third electrode segments.

(11) The imaging device according to (10) above, wherein a potential of a third electrode segment located at a position closest to the first electrode is greater than a potential of a third electrode segment located at a position farthest from the first electrode.

(12) The imaging device according to any one of (1) to (11) above, wherein the photoelectric conversion layer includes a stacked layer structure including a lower semiconductor layer and an upper photoelectric conversion layer.

(13) The imaging device according to (12) above, wherein a material composition of the lower semiconductor layer located above the third electrode is different from a material composition of the lower semiconductor layer located above the first electrode.

(14) The imaging device according to any one of (12) to (13) above, wherein the lower semiconductor layer includes an oxide including indium.

(15) The imaging device according to any one of (1) to (14) above, wherein during a charge storage period, a potential applied to the third electrode is greater than a potential applied to the first electrode.

(16) The imaging device according to any one of (1) to (15) above, wherein at least a part of the insulating material is disposed above the first electrode.

(17) The imaging device according to (16) above, wherein a thickness of the insulating material between the upper surface of the first electrode and the photoelectric conversion layer increases at a third electrode side of the first electrode as a distance between the first electrode and the third electrode decreases.

(18) The imaging device according to any one of (1) to (17) above, wherein the imaging device is a back-illuminated type imaging device.

(19) An electronic apparatus including: an imaging device including: a substrate including a first photoelectric conversion unit, and a second photoelectric conversion unit at a light-incident side of the substrate, the second photoelectric conversion unit including: a photoelectric conversion layer, a first electrode, a second electrode above the photoelectric conversion layer, a third electrode, and an insulating material between the third electrode and the photoelectric conversion layer, wherein a portion of the insulating material is between the first electrode and the third electrode, a lens configured to direct light onto a surface of the imaging device, and circuitry configured to control output signals from the imaging device.

(20) A method of driving an imaging device, the method including: applying a first potential to a charge storage electrode during a charging period; applying a second potential to a first electrode during a charging period, wherein the first potential is greater than the second potential, applying a third potential to the charge storage electrode during a charge transfer period, and applying a fourth potential to the first electrode during the charge transfer period, wherein the fourth potential is greater than the third potential, and wherein, the imaging device includes: a substrate including a first photoelectric conversion unit, and a second photoelectric conversion unit at a light-incident side of the substrate, the second photoelectric conversion unit including: a photoelectric conversion layer, the first electrode, a second electrode above the photoelectric conversion layer, the charge storage electrode, and an insulating material between the charge storage electrode and the photoelectric conversion layer, wherein a portion of the insulating material is between the first electrode and the charge storage electrode.

(A01) <<Imaging Element>>

An imaging element including a photoelectric conversion unit configured by stacking a first electrode, a photoelectric conversion layer, and a second electrode, wherein the photoelectric conversion unit further includes a charge storage electrode which is arranged to be separated from the first electrode and is arranged to face the photoelectric conversion layer through an insulating layer.

(A02)

The imaging element according to (A01), further including a semiconductor substrate, wherein the photoelectric conversion unit is arranged above the semiconductor substrate.

(A03)

The imaging element according to (A01) or (A02), wherein the first electrode extends in an opening portion provided to the insulating layer to be connected to the photoelectric conversion layer.

(A04)

The imaging element according to (A01) or (A02), wherein the photoelectric conversion layer extends in an opening portion provided to the insulating layer to be connected to the first electrode.

(A05)

The imaging element according to (A04), wherein an edge of a top surface of the first electrode is covered with the insulating layer, the first electrode is exposed to a bottom surface of the opening portion, and when a surface of the insulating layer being in contact with the top surface of the first electrode is defined by a first surface and a surface of the insulating layer being in contact with a portion of the photoelectric conversion layer facing the charge storage electrode is defined by a second surface, a side surface of the opening portion has a slope expanding from the first surface toward the second surface.

(A06)

The imaging element according to (A05), wherein the side surface of the opening portion having the slope expanding from the first surface toward the second surface is located in a charge storage electrode side.

(A07) <<Control of Potentials of First Electrode and Charge Storage Electrode>>

The imaging element according to any one of (A01) to (A06), further including a control unit which is provided to a semiconductor substrate and includes a driving circuit, wherein the first electrode and the charge storage electrode are connected to the driving circuit, in a charge storage period, from the driving circuit, a potential $V_{11}$ is applied to the first electrode, and a potential $V_{12}$ is applied to the charge storage electrode, so that charges are stored in the photoelectric conversion layer, and in a charge transfer period, from the driving circuit, a potential $V_{21}$ is applied to the first electrode, and a potential $V_{22}$ is applied to the charge storage electrode, so that the charges stored in the photoelectric conversion layer are read out to the control unit through the first electrode, in the case where a potential of the first electrode is higher than a potential of the second electrode, $V_{12} \geq V_{11}$, and $V_{22} < V_{21}$, and in the case where the potential of the first electrode is lower than the potential of the second electrode, $V_{12} \leq V_{11}$ and $V_{22} > V_{21}$.

(A08) <<Transfer Control Electrode>>

The imaging element according to any one of (A01) to (A06), further including a transfer control electrode which is arranged between the first electrode and the charge storage electrode to be separated from the first electrode and the charge storage electrode and is arranged to face the photoelectric conversion layer through the insulating layer.

(A09) <<Control of Potentials of First Electrode, Charge Storage Electrode, and Transfer Control Electrode>>

The imaging element according to (A08), further including a control unit which is provided to a semiconductor substrate and includes a driving circuit, wherein the first electrode, the charge storage electrode, and the transfer control electrode are connected to the driving circuit, in a charge storage period, from the driving circuit, a potential $V_{11}$ is applied to the first electrode, a potential $V_{12}$ is applied to the charge storage electrode, and a potential $V_{13}$ is applied to the transfer control electrode, so that charges are stored in the photoelectric conversion layer, and in a charge transfer period, from the driving circuit, a potential $V_{21}$ is applied to the first electrode, a potential $V_{22}$ is applied to the charge storage electrode, and a potential $V_{23}$ is applied to the transfer control electrode, so that the charges stored in the photoelectric conversion layer are read out to the control unit through the first electrode, in the case where a potential of the first electrode is higher than a potential of the second electrode, $V_{12} > V_{13}$ and $V_{22} \leq V_{23} \leq V_{21}$, and in the case where the potential of the first electrode is lower than the potential of the second electrode, $V_{12} < V_{13}$ and $V_{22} \geq V_{23} \geq V_{21}$.

(A10) <<Charge Ejection Electrode>>

The imaging element according to any one of (A01) to (A09), further including a charge ejection electrode which is connected to the photoelectric conversion layer and is arranged to be separated from the first electrode and the charge storage electrode.

(A11)

The imaging element according to (A10), wherein the charge ejection electrode is arranged to surround the first electrode and the charge storage electrode.

(A12)

The imaging element according to (A10) or (A11), wherein the photoelectric conversion layer extends in a second opening portion provided to the insulating layer to be connected to the charge ejection electrode, an edge of a top surface of the charge ejection electrode is covered with the insulating layer, the charge ejection electrode is exposed to a bottom surface of the second opening portion, and when a surface of the insulating layer being in contact with the top surface of the charge ejection electrode is defined by a third surface and a surface of the insulating layer being in contact with a portion of the photoelectric conversion layer facing the charge storage electrode is defined by a second surface, a side surface of the second opening portion has a slope expending from the third surface toward the second surface.

(A13) <<Control of Potentials of First Electrode, Charge Storage Electrode, and Charge Ejection Electrode>>

The imaging element according to any one of (A10) to (A12), further including a control unit which is provided to the semiconductor substrate and has a driving circuit, wherein the first electrode, the charge storage electrode, and the charge ejection electrode are connected to the driving circuit, in a charge storage period, from the driving circuit, a potential $V_{11}$ is applied to the first electrode, a potential $V_{12}$ is applied to the charge storage electrode, and a potential $V_{14}$ is applied to the charge ejection electrode, so that charges are stored in the photoelectric conversion layer, in a charge transfer period, from the driving circuit, a potential $V_{21}$ is applied to the first electrode, a potential $V_{22}$ is applied to the charge storage electrode, and a potential $V_{24}$ is applied to the charge ejection electrode, so that the charges stored in the photoelectric conversion layer are read out to the control unit through the first electrode, in the case where a potential of the first electrode is higher than a potential of the second electrode, $V_{14} > V_{11}$ and $V_{24} < V_{21}$, and in the case where the potential of the first electrode is lower than the potential of the second electrode, $V_{14} < V_{11}$ and $V_{24} > V_{21}$.

(A14) <<Charge Storage Electrode Segment>>

The imaging element according to any one of (A01) to (A13), wherein the charge storage electrode is configured with a plurality of charge storage electrode segments.

(A15)

The imaging element according to (A14), wherein in the case where a potential of the first electrode is higher than a potential of the second electrode, in a charge transfer period, a potential applied to the charge storage electrode segment located at the position closest to the first electrode is higher than a potential applied to the charge storage electrode segment located at the position farthest from the first electrode, and in the case where the potential of the first electrode is lower than the potential of the second electrode, in the charge transfer period, the potential applied to the charge storage electrode segment located at the position closest to the first electrode is lower than the potential applied to the charge storage electrode segment located at the position farthest from the first electrode.

(B01)

The imaging element according to any one of (A01) to (A15), wherein at least a floating diffusion layer and an amplification transistor constituting a control unit are provided to a semiconductor substrate, and the first electrode is connected to the floating diffusion layer and a gate portion of the amplification transistor.

(B02)

The imaging element according to (B01), wherein a reset transistor and a selection transistor constituting the control unit are further provided to the semiconductor substrate, the floating diffusion layer is connected to one source/drain region of the reset transistor, and one source/drain region of the amplification transistor is connected to one source/drain region of the selection transistor, and the other source/drain region of the selection transistor is connected to a signal line.

(B03)

The imaging element according to any one of (A01) to (B02), wherein the charge storage electrode is larger than the first electrode.

(B04)

The imaging element according to any one of (A01) to (B03), wherein light is incident from a second electrode side, and a light-shielding layer is formed in a light incidence side of the second electrode.

(B05)

The imaging element according to any one of (A01) to (B03), wherein light is incident from a second electrode side, and light is not incident on the first electrode.

(B06)

The imaging element according to (B05), wherein a light-shielding layer is formed above the first electrode as a light incidence side of the second electrode.

(B07)

The imaging element according to (B05), wherein an on-chip microlens is provided above the charge storage electrode and the second electrode, and light incident on the on-chip microlens is collected in the charge storage electrode.

(C01) <<Stacked-Type Imaging Element>>

A stacked-type imaging element including at least one imaging element according to any one of (A01) to (B07).

(D01) <<Solid-State Imaging Device . . . First Embodiment>>

A solid-state imaging device including a plurality of the imaging elements according to any one of (A01) to (B04).

(D02) <<Solid-State Imaging Device . . . Second Embodiment>>

A solid-state imaging device including a plurality of the stacked-type imaging elements according to (C01).

(E01) <<Driving Method for Solid-State Imaging Device>>

A driving method for a solid-state imaging device having a plurality of imaging elements having a structure where a photoelectric conversion unit configured by stacking a first electrode, a photoelectric conversion layer, and a second electrode is included, the photoelectric conversion unit further includes a charge storage electrode which is arranged to be separated from the first electrode and is arranged to face the photoelectric conversion layer through an insulating layer, and light is incident from a second electrode side, and light is not incident on the first electrode, the driving method including repetitively:

in all the imaging elements, at one time, storing charges in the photoelectric conversion layer, and ejecting the charges of the first electrode to the outside;

in all the imaging elements, at one time, transferring the charges stored in the photoelectric conversion layer to the first electrode; and after the completion of transfer, sequentially, reading out the charges transferred to the first electrodes in the respective imaging elements.

REFERENCE SIGNS LIST

11 First electrode
12 Charge storage electrode
12A, 12B, 12C Charge storage electrode segment
13, 13A, 13B Transfer control electrode (charge transfer electrode)
14 Charge ejection electrode
15 Photoelectric conversion layer
16 Second electrode
41 n-type semiconductor region constituting second imaging element
43 n-type semiconductor region constituting third imaging element
42, 44, 73 p+ layer
$FD_1$, $FD_2$, $FD_3$, 45C, 46C Floating diffusion layer
$TR1_{amp}$ Amplification transistor
$TR1_{rst}$ Reset transistor
$TR1_{sel}$ Selection transistor
51 Gate portion of reset transistor $TR1_{rst}$
51A Channel forming region of reset transistor $TR1_{rst}$
51B, 51C Source/drain region of reset transistor $TR1_{rst}$
52 Gate portion of amplification transistor $TR1_{amp}$
52A Channel forming region of amplification transistor $TR1_{amp}$
52B, 52C Source/drain region of amplification transistor $TR1_{amp}$
53 Gate portion of selection transistor $TR1_{sel}$
53A Channel forming region of selection transistor $TR1_{sel}$
53B, 53C Source/drain region of selection transistor $TR1_{sel}$
$TR2_{trs}$ Transfer transistor
45 Gate portion of transfer transistor
$TR2_{rst}$ Reset transistor
$TR2_{amp}$ Amplification transistor
$TR2_{sel}$ Selection transistor
$TR3_{trs}$ Transfer transistor
46 Gate portion of transfer transistor
$TR3_{rst}$ Reset transistor
$TR3_{amp}$ Amplification transistor
$TR3_{sel}$ Selection transistor
$V_{DD}$ Power source
$RST_1$, $RST_2$, $RST_3$ Reset line
$SEL_1$, $SEL_2$, $SEL_3$ Select line
117, $VSL_1$, $VSL_2$, $VSL_3$ Signal line
$TG_2$, $TG_3$ Transfer gate line
$V_{OA}$, $V_{OT}$, $V_{OU}$ Wire line
61 Contact hole portion
62 Wire line layer
63, 64, 68A Pad portion
65, 68B Connection hole
66, 67, 69 Connection portion
70 Semiconductor substrate
70A First surface (front surface) semiconductor substrate
70B Second surface (back surface) semiconductor substrate
71 Element isolation region
72 Oxide film
74 $HfO_2$ film
75 Insulating film
76 Interlayer insulating layer
77, 78, 81 Interlayer insulating layer
82 Insulating layer
82a First surface of insulating layer
82b Second surface of insulating layer
82c Third surface of insulating layer
83 Protective layer
84, 84A, 84B, 84C Opening portion
85, 85A Second opening portion
90 On-chip microlens
91 Various components of imaging element located below interlayer insulating layer 81
92 Light-shielding layer
100 Solid-state imaging device
101 Stacked-type imaging element
111 Imaging region
112 Vertical driving circuit
113 Column signal processing circuit
114 Horizontal driving circuit
115 Output circuit
116 Driving control circuit 118 Horizontal signal line
200 Electronic apparatus (camera)
201 Solid-state imaging device
210 Optical lens
211 Shutter device
212 Driving circuit
213 Signal processing circuit

The invention claimed is:

1. An imaging device, comprising:
a substrate including a first photoelectric conversion unit; and
a second photoelectric conversion unit at a light-incident side of the substrate, the second photoelectric conversion unit including:
a photoelectric conversion layer;
a first electrode;
a second electrode above the photoelectric conversion layer;
a third electrode; and
an insulating material between the third electrode and the photoelectric conversion layer,
wherein a portion of the insulating material is between the first electrode and the third electrode,
wherein at least a portion of the first electrode is in contact with the photoelectric conversion layer,
wherein at least a portion of the insulating material is disposed between the first electrode and the photoelectric conversion layer; and
wherein, in a cross-sectional view, a first width in a lateral direction of a portion of the photoelectric conversion layer in contact with the first electrode is smaller than a second width in the lateral direction of a portion of the photoelectric conversion layer at a same level as an upper surface of the insulating material.

2. The imaging device according to claim 1, further comprising:
a first region of the insulating material between the third electrode and the photoelectric conversion layer; and
a second region of the insulating material between the third electrode and the first electrode, wherein the second region of the insulating material includes a first insulating layer including the insulating material and a second insulating layer including the insulating material, and wherein the first insulating layer is stacked on the second insulating layer.

3. The imaging device according to claim 2, wherein a portion of the first insulating layer in the second region is between the first electrode and the photoelectric conversion layer.

4. The imaging device according to claim 2, wherein the first region and the second region include a different number of insulating layers including the insulating material.

5. The imaging device according to claim 1, further comprising:
a transfer control electrode between the first electrode and the third electrode.

6. The imaging device according to claim 5, wherein during a charge storage operation, a potential applied to the transfer control electrode is less than a potential applied to the third electrode.

7. The imaging device according to claim 5, wherein the substrate includes a third photoelectric conversion unit, and wherein each of the first, second, and third photoelectric conversion units are coupled to separate signal lines.

8. The imaging device according to claim 1, further comprising:

a charge ejection electrode separate and apart from the first electrode and the third electrode, wherein the photoelectric conversion layer contacts the charge ejection electrode.

9. The imaging device according to claim 8, wherein the charge ejection electrode surrounds the first electrode and the third electrode.

10. The imaging device according to claim 1, further comprising:
a plurality of third electrode segments.

11. The imaging device according to claim 10, wherein a potential of a third electrode segment located at a position closest to the first electrode is greater than a potential of a third electrode segment located at a position farthest from the first electrode.

12. The imaging device according to claim 1, wherein the photoelectric conversion layer includes a stacked layer structure including a lower semiconductor layer and an upper photoelectric conversion layer.

13. The imaging device according to claim 12, wherein a material composition of the lower semiconductor layer located above the third electrode is different from a material composition of the lower semiconductor layer located above the first electrode.

14. The imaging device according to claim 12, wherein the lower semiconductor layer includes an oxide semiconductor layer.

15. The imaging device according to claim 1, wherein during a charge storage period, a potential applied to the third electrode is greater than a potential applied to the first electrode.

16. The imaging device according to claim 1, wherein a thickness of the insulating material between the upper surface of the first electrode and the photoelectric conversion layer increases at a third electrode side of the first electrode as a distance between the first electrode and the third electrode decreases.

17. The imaging device according to claim 1, wherein the imaging device is a back-illuminated type imaging device.

18. The imaging device according to claim 14, wherein the oxide semiconductor layer includes indium.

19. An electronic apparatus, comprising:
an imaging device including:
a substrate including a first photoelectric conversion unit; and
a second photoelectric conversion unit at a light-incident side of the substrate, the second photoelectric conversion unit including:
a photoelectric conversion layer;
a first electrode;
a second electrode above the photoelectric conversion layer;
a third electrode; and
an insulating material between the third electrode and the photoelectric conversion layer,
wherein a portion of the insulating material is between the first electrode and the third electrode,
wherein at least a portion of the first electrode is in contact with the photoelectric conversion layer, and
wherein, in a cross-sectional view, a first width in a lateral direction of a portion of the photoelectric conversion layer in contact with the first electrode is smaller than a second width in the lateral direction of a portion of the photoelectric conversion layer at a same level as an upper surface of the insulating material;

a lens configured to direct light onto a surface of the imaging device; and circuitry configured to control output signals from the imaging device.

20. The electronic apparatus according to claim 19, wherein the imaging device further comprises:
a first region of the insulating material between the third electrode and the photoelectric conversion layer; and
a second region of the insulating material between the third electrode and the first electrode, wherein the second region of the insulating material includes a first insulating layer including the insulating material and a second insulating layer including the insulating material, and wherein the first insulating layer is stacked on the second insulating layer.

21. The electronic apparatus according to claim 20, wherein a portion of the first insulating layer in the second region is between the first electrode and the photoelectric conversion layer.

22. The electronic apparatus according to claim 19, wherein at least a portion of the insulating material is disposed between the first electrode and the photoelectric conversion layer.

23. A method of driving an imaging device, the method comprising:
applying a first potential to a third electrode during a charging period;
applying a second potential to a first electrode during the charging period, wherein the first potential is greater than the second potential;
applying a third potential to the third electrode during a charge transfer period; and
applying a fourth potential to the first electrode during the charge transfer period, wherein the fourth potential is greater than the third potential, and
wherein the imaging device includes:
a substrate including a first photoelectric conversion unit; and
a second photoelectric conversion unit at a light-incident side of the substrate, the second photoelectric conversion unit including:
a photoelectric conversion layer;
the first electrode;
a second electrode above the photoelectric conversion layer;
the third electrode; and
an insulating material between the third electrode and the photoelectric conversion layer,
wherein a portion of the insulating material is between the first electrode and the third electrode,
wherein at least a portion of the insulating material is disposed between the first electrode and the photoelectric conversion layer, and
wherein, in a cross-sectional view, a first width in a lateral direction of a portion of the photoelectric conversion layer in contact with the first electrode is smaller than a second width in the lateral direction of a portion of the photoelectric conversion layer at a same level as an upper surface of the insulating material.

24. The method of driving an imaging device according to claim 23, wherein the imaging device further includes:
a first region of the insulating material between the third electrode and the photoelectric conversion layer; and
a second region of the insulating material between the third electrode and the first electrode, wherein the second region of the insulating material includes a first insulating layer including the insulating material and a second insulating layer including the insulating material, and wherein the first insulating layer is stacked on the second insulating layer.

25. The method according to claim 23, wherein at least a portion of the first electrode is in contact with the photoelectric conversion layer.

* * * * *